(12) United States Patent
Park

(10) Patent No.: US 9,659,790 B2
(45) Date of Patent: May 23, 2017

(54) METHOD OF FORMING PATTERN AND METHOD OF MANUFACTURING INTEGRATED CIRCUIT DEVICE BY USING THE SAME

(71) Applicant: SAMSUNG ELECTRONICS CO., LTD., Suwon-si, Gyeonggi-do (KR)

(72) Inventor: Seok-han Park, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/152,096

(22) Filed: May 11, 2016

(65) Prior Publication Data

US 2016/0336193 A1    Nov. 17, 2016

(30) Foreign Application Priority Data

May 12, 2015  (KR) .......................... 10-2015-0066254

(51) Int. Cl.
| | |
|---|---|
| *H01L 21/311* | (2006.01) |
| *H01L 21/033* | (2006.01) |
| *H01L 21/3213* | (2006.01) |
| *H01L 21/02* | (2006.01) |
| *H01L 27/108* | (2006.01) |

(52) U.S. Cl.
CPC .... *H01L 21/31144* (2013.01); *H01L 21/0337* (2013.01); *H01L 21/32139* (2013.01); *H01L 27/10852* (2013.01); *H01L 21/02118* (2013.01); *H01L 21/31133* (2013.01); *H01L 27/10894* (2013.01)

(58) Field of Classification Search
CPC ........... H01L 21/31144; H01L 21/0337; H01L 21/0271
See application file for complete search history.

(56) References Cited

U.S. PATENT DOCUMENTS

| | | | |
|---|---|---|---|
| 8,673,786 B2 | 3/2014 | Watanabe et al. | |
| 8,808,557 B1 * | 8/2014 | Seino ........................ | G03F 7/40 216/41 |

(Continued)

FOREIGN PATENT DOCUMENTS

| | | |
|---|---|---|
| JP | 2013-161508 A | 8/2013 |
| JP | 2013-228492 A | 11/2013 |

(Continued)

*Primary Examiner* — Jaehwan Oh
(74) *Attorney, Agent, or Firm* — Lee & Morse, P.C.

(57) ABSTRACT

A method of forming a pattern, the method including forming a mask layer on a feature layer on a substrate; forming guides regularly arranged with a first pitch on the mask layer in a first region and dummy guides regularly arranged with the first pitch on the mask layer in a second region spaced apart from the first region with a separation region therebetween, the separation region having a width greater than the first pitch; forming a block copolymer layer on the mask layer; phase-separating the block copolymer layer to form a self-assembled layer; forming a mask pattern by etching the mask layer using the self-assembled layer; and patterning the feature layer by transferring a shape of the mask pattern to the feature layer in the first region while blocking the shape of the mask pattern from being transferred to the feature layer in the second region.

20 Claims, 58 Drawing Sheets

(56) References Cited

U.S. PATENT DOCUMENTS

| | | |
|---|---|---|
| 8,853,085 B1 | 10/2014 | Abdallah et al. |
| 8,859,433 B2 | 10/2014 | Abdallah et al. |
| 8,920,664 B2 | 12/2014 | Seino et al. |
| 8,999,862 B1* | 4/2015 | Ban ............... H01L 21/0332 257/E21.006 |
| 9,099,399 B2* | 8/2015 | Park ............... H01L 21/0337 |
| 9,449,840 B1* | 9/2016 | Ban ............... H01L 21/31144 |
| 2013/0183827 A1 | 7/2013 | Millward |
| 2014/0097152 A1 | 4/2014 | Hieda et al. |
| 2014/0273476 A1 | 9/2014 | Cheng et al. |
| 2014/0287083 A1 | 9/2014 | Gao et al. |
| 2014/0287587 A1 | 9/2014 | Lee et al. |
| 2014/0315390 A1 | 10/2014 | Abdallah et al. |
| 2014/0322917 A1 | 10/2014 | Abdallah et al. |
| 2014/0370712 A1 | 12/2014 | Kim et al. |
| 2014/0377956 A1 | 12/2014 | Nakajima et al. |
| 2015/0072536 A1 | 3/2015 | Muramatsu et al. |
| 2016/0042965 A1* | 2/2016 | Ha ............... H01L 21/0271 438/702 |
| 2016/0254153 A1* | 9/2016 | Park ............... H01L 21/0338 |
| 2016/0254154 A1* | 9/2016 | Heo ............... H01L 21/0338 |
| 2016/0293442 A1* | 10/2016 | Ban ............... H01L 21/31144 |
| 2016/0322259 A1* | 11/2016 | Cheng ............ H01L 21/823431 |

FOREIGN PATENT DOCUMENTS

| | | |
|---|---|---|
| JP | 2014-022550 A | 2/2014 |
| JP | 2014-160734 A | 9/2014 |
| KR | 10-2012-0126442 A | 11/2012 |

* cited by examiner

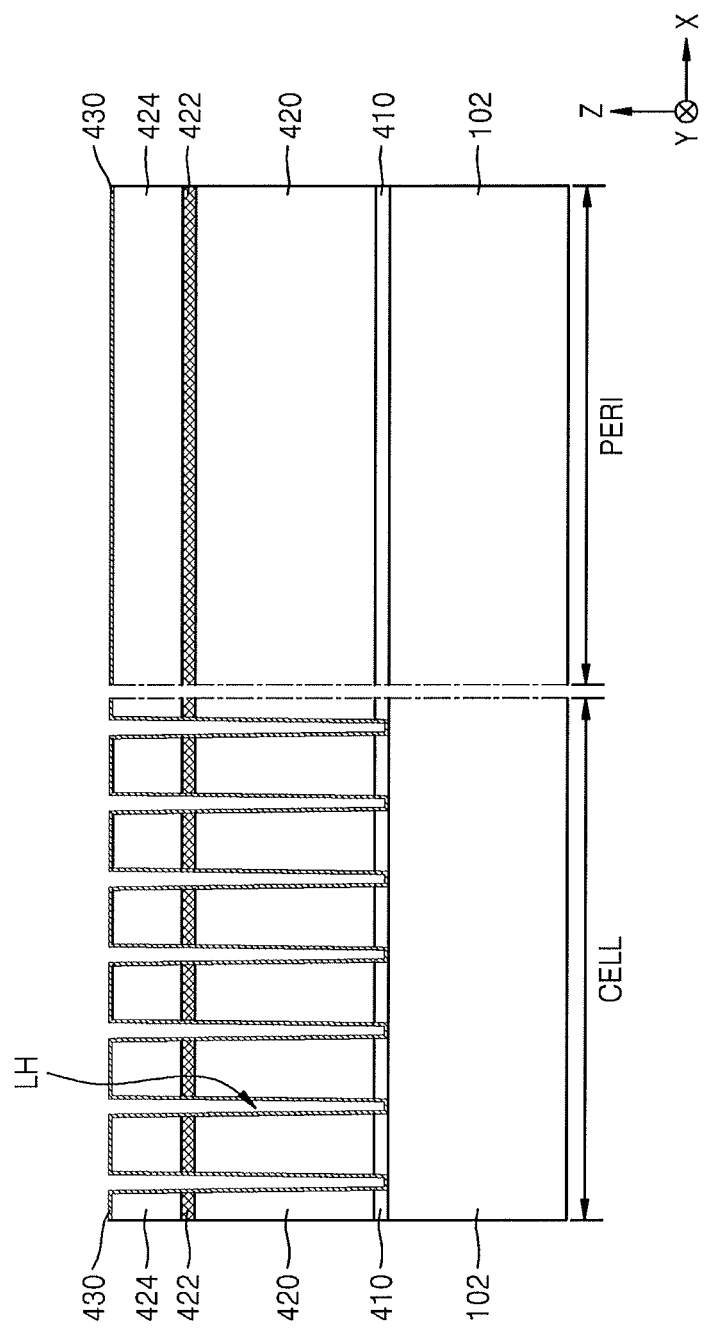

METHOD OF FORMING PATTERN AND METHOD OF MANUFACTURING INTEGRATED CIRCUIT DEVICE BY USING THE SAME

CROSS-REFERENCE TO RELATED APPLICATION

Korean Patent Application No. 10-2015-0066254, filed on May 12, 2015, in the Korean Intellectual Property Office, and entitled: "Method of Forming Pattern and Method of Manufacturing Integrated Circuit Device by Using the Same," is incorporated by reference herein in its entirety.

BACKGROUND

1. Field

Embodiments relate to a method forming a pattern and a method of manufacturing an integrated circuit device.

2. Description of the Related Art

According to the development of the semiconductor industry and the requirements of users, the integration density of electronic devices may increase and the performance thereof may be improved. Accordingly, a high integration density and a high performance of semiconductor devices, which may be important components of electronic devices, may be required. As the integration density of semiconductor devices increases, an area of each unit cell in two dimensions may decrease. With a decrease in an area of a unit cell, feature sizes of semiconductor devices may decrease.

SUMMARY

Embodiments may be realized by providing a method of forming a pattern, the method including forming a feature layer on a substrate; forming a mask layer on the feature layer; forming a plurality of guides regularly arranged with a first pitch on the mask layer in a first region and a plurality of dummy guides regularly arranged with the first pitch on the mask layer in a second region spaced apart from the first region with a separation region therebetween, the separation region having a width greater than the first pitch; forming a block copolymer layer, the block copolymer layer surrounding the plurality of guides and the plurality of dummy guides, on the mask layer; phase-separating the block copolymer layer to form a self-assembled layer including a plurality of first domains regularly arranged along with the plurality of guides in the first region and a plurality of first dummy domains regularly arranged along with the plurality of dummy guides in the second region; forming a mask pattern by etching the mask layer using the self-assembled layer; and patterning the feature layer by transferring a shape of the mask pattern to the feature layer in the first region while blocking the shape of the mask pattern from being transferred to the feature layer in the second region.

Forming the plurality of guides and the plurality of dummy guides may include forming a plurality of first holes regularly arranged with the first pitch in the mask layer in the first region and the second region, the plurality of first holes having a first diameter; and forming a plurality of pillar-shaped guides filling the plurality of first holes in the first region and the second region, the plurality of pillar-shaped guides protruding upward beyond the mask layer, the plurality of pillar-shaped guides having a second diameter greater than the first diameter.

The plurality of first holes may be arranged in a hexagonal array having a first pitch at least 1.5 times a bulk period $L_0$ of the block copolymer layer, and patterning the feature layer may include forming a plurality of holes in the feature layer by etching the feature layer using the mask pattern as an etch mask in the second region, the plurality of holes being arranged in a hexagonal array having a second pitch smaller than the first pitch.

The separation region may have a width 2 to 6 times a bulk period $L_0$ of the block copolymer layer.

The block copolymer layer may include a first polymer block including poly(methyl methacrylate), poly(ethylene oxide), poly(lactic acid), or polyisoprene; and a second polymer block including polystyrene.

The method may further include forming a brush liner before forming the block copolymer layer, the brush liner covering the plurality of dummy guides and the feature layer. The brush liner may include a material having a relatively higher affinity for a polymer block having the largest volume ratio from among polymer blocks included in the block copolymer layer, and the block copolymer layer is formed on the brush liner.

The block copolymer layer may include a first polymer block and a second polymer block having a volume ratio of from 20:80 to 40:60, and the plurality of first domains and the plurality of first dummy domains may include the first polymer block, and the brush liner may include polymer having a same structure as polymer forming the second polymer block.

The brush liner may include polystyrene.

In phase-separating the block copolymer, the self-assembled layer may further include a second domain surrounding each of the plurality of guides, each of the plurality of dummy guides, each of the plurality of first domains, and each of the plurality of first dummy domains, and forming the mask pattern may include etching the mask layer using the plurality of guides, the plurality of dummy guides, and the second domain as an etch mask in the first region and the second region.

The method as claimed may further include forming a brush liner on the mask layer in the first region and the second region before forming the block copolymer layer, the brush liner including a same material as a material forming the second domain. Forming the mask pattern may include removing the plurality of first domains and the plurality of first dummy domains from the self-assembled layer; and sequentially etching the brush liner and the mask layer using the plurality of guides, the plurality of dummy guides, and the second domain as an etch mask in the first region and the second region.

Patterning the feature layer may include forming a trimming pattern having an edge portion, the edge portion being in the separation region, the trimming pattern covering the mask pattern in the second region; and forming a plurality of holes in the first region by etching the feature layer in the first region using the trimming mask pattern and the mask pattern as an etch mask.

Embodiments may be realized by providing a method of manufacturing an integrated circuit device, the method including forming a feature layer on a substrate having a cell array region and a peripheral circuit region; forming a mask layer, in which a plurality of first holes regularly arranged with a first pitch less than a first width are formed, in a first region of the cell array region and a second region of the peripheral circuit region, the second region being spaced apart from the first region with a separation region therebetween and having the first width; forming a plurality of guides, the plurality of guides filling the plurality of first holes in the first region, the plurality of guides protruding upward beyond the mask layer, and a plurality of dummy guides filling the plurality of first holes in the second region, the plurality of dummy guides protruding upward beyond the mask layer; forming a brush liner covering the mask layer in the first region, the second region, and the separation region; forming a block copolymer layer on the brush liner, the block copolymer layer surrounding the plurality of guides and the plurality of dummy guides in the first region and the second region and filling the separation region; phase-separating the block copolymer to form a self-assembled layer; forming a mask pattern, in which a plurality of second holes are formed in the first region and the second region, the mask pattern being formed by etching the mask layer in the first region and the second region using a portion of the self-assembled layer as an etch mask; forming a trimming mask pattern, the trimming mask pattern covering the mask pattern in the second region, in the peripheral circuit region; and forming a feature pattern by etching the feature layer in the cell array region using the trimming mask pattern and the mask pattern as an etch mask.

The self-assembled layer may include a plurality of first domains arranged in the first region, a plurality of first dummy domains arranged in the second region, and a second domain surrounding the plurality of first domains and the plurality of first dummy domains, and the brush liner may include polymer having a same structure as polymer forming the second polymer block.

A width of the separation region may be greater than a distance between two guides adjacent to each other from among the plurality of guides.

The method may further include forming a mold layer on the substrate before forming the feature layer, and after forming the feature layer, forming a plurality of holes by etching the mold layer using the feature pattern as an etch mask, the plurality of holes passing through the mold layer; and forming a plurality of electrodes in the plurality of holes.

Embodiments may be realized by providing a method of forming a pattern, the method including providing a substrate including a high-density region and a low-density region spaced apart from the high-density region with a separation region therebetween; forming guides on a substrate in the high-density region and dummy guides on the substrate in the low-density region; and forming a block copolymer layer surrounding the guides and the dummy guides on the substrate, a width of the separation region extending from the high-density region to the low-density region providing the block copolymer layer with a top surface extending parallel to the substrate.

The dummy guides may have a same shape as the guides.

The dummy guides and the guides may be pillar-shaped.

The block copolymer layer may include a first polymer block and a second polymer block having a volume ratio of from 20:80 to 40:60; the first polymer block may include poly(methyl methacrylate), poly(ethylene oxide), poly(lactic acid), or polyisoprene; and the second polymer block may include polystyrene.

The width of the separation region may have a width 2 to 6 times a bulk period $L_0$ of the block copolymer layer.

BRIEF DESCRIPTION OF THE DRAWINGS

Features will become apparent to those of skill in the art by describing in detail exemplary embodiments with reference to the attached drawings in which:

FIGS. 1A and 1B through FIGS. 15A and 15B sequentially illustrate cross-sectional views of a method of forming a pattern, according to an exemplary embodiment;

FIGS. 17A and 17B through FIGS. 24A and 24B sequentially illustrate views of a method of manufacturing an integrated circuit device, according to an exemplary embodiment;

FIGS. 26A through 26H sequentially illustrate cross-sectional views of a method of forming a plurality of lower electrodes, according to an integrated circuit device manufacturing method according to an exemplary embodiment;

DETAILED DESCRIPTION

Figure 1A:
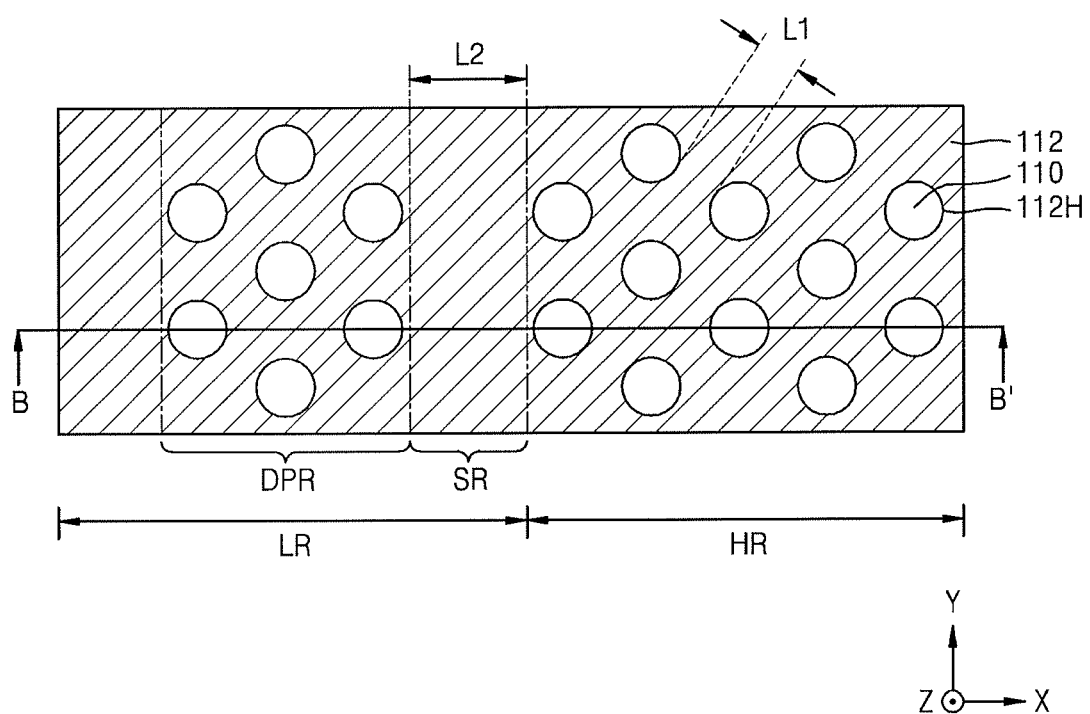

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various members, regions, layers, parts, and/or elements, these members, regions, layers, parts, and/or elements should not be limited by these terms. These terms are only used to distinguish one member, region, layer, part, or element from another member, region, layer, part, or element. Thus, a first member, region, part, or element discussed below could be termed a second member, region, part, or element without departing from the teachings of exemplary embodiments. For example, a first element may be referred to as a second element, and likewise, a second element may be referred to as a first element.

All terms including technical and scientific terms used herein have meanings which can be generally understood by those of skill in the art, if the terms are not particularly defined. General terms defined by dictionaries should be understood to have meanings which can be contextually understood in the art and should not have ideally or excessively formal meanings, if the terms are not defined particularly herein.

A specific process order may be changed in another embodiment. For example, two processes which are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. As used herein, the term "and/or" includes any and all combinations of one or more of the associated listed items. The term "substrate" may mean a substrate itself or a stack structure including a substrate and a predetermined layer or film formed on the surface of the substrate. In addition, the term "surface of a substrate" may mean an exposed surface of a substrate itself or an outer surface of a predetermined layer or film formed on the substrate.

FIGS. 1A and 1B through FIGS. 15A and 15B sequentially illustrate cross-sectional views of a method of forming a pattern, according to an exemplary embodiment. FIGS. 1A, 2A, . . . , and 15A illustrate plan views of main parts for explaining the method of forming a pattern, and FIGS. 1B, 2B, . . . , 15B illustrate cross-sectional views taken along lines B-B' of FIGS. 1A, 2A, . . . , 15A, respectively.

Figure 1B:
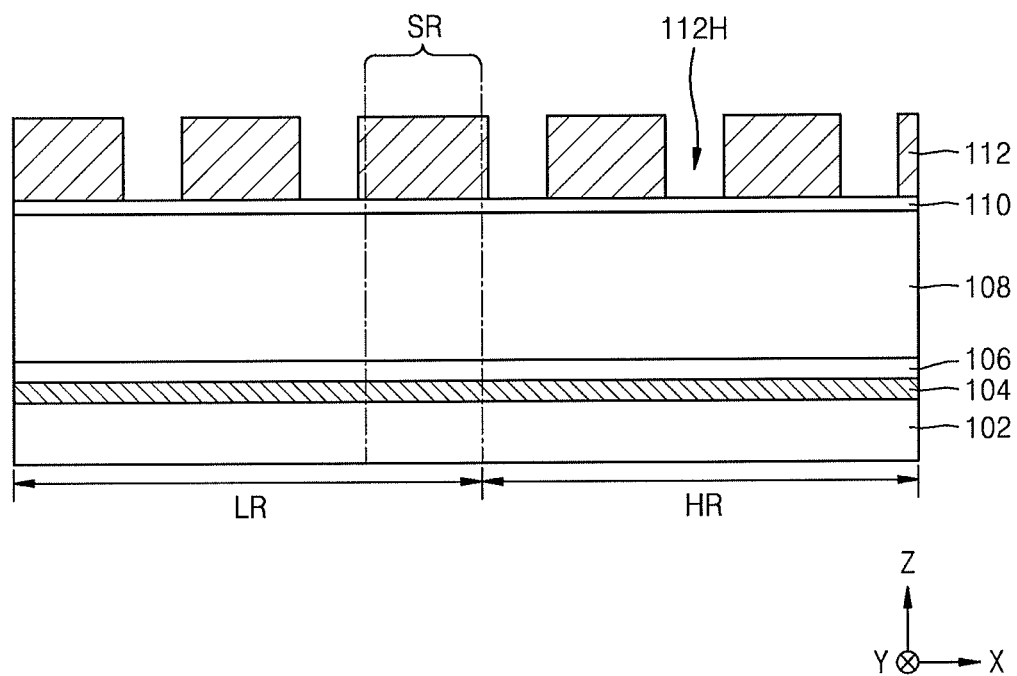
Figure 2A:
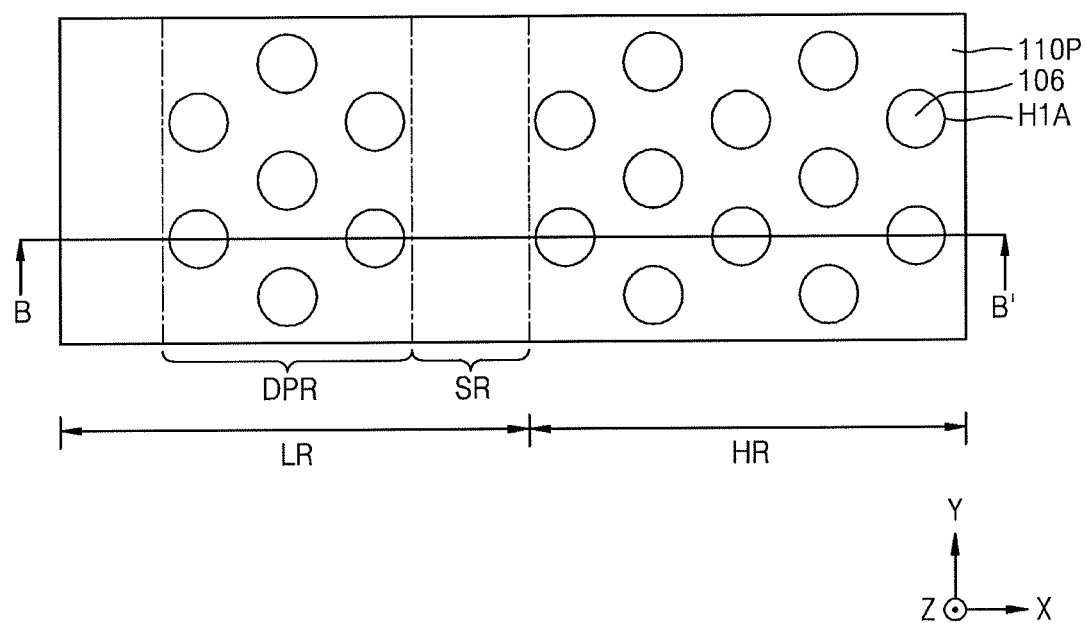

Referring to FIGS. 1A and 1B, a feature layer 104 may be formed on a substrate 102, and a first mask layer 106 and a second mask layer 108 may sequentially be formed on the feature layer 104.

Next, an anti-reflection film 110 may be formed on the second mask layer 108, and a third mask pattern 112, in which a plurality of holes 112H may be formed, may be formed on the anti-reflection film 110.

The substrate 102 may include a high-density region HR and a low-density region LR. A part of the low-density region LR, which may be adjacent to the high-density region HR, may be used as a separation region SR to help secure a separation distance between patterns that may be formed in the high-density region HR and dummy patterns that may be formed in the low-density region LR.

The plurality of holes 112H formed in the third mask pattern 112 may be formed in the high-density region HR and the low-density region LR. In the high-density region HR and the low-density region LR, the plurality of holes 112H may be spaced apart from one another with a first distance L1.

An outside diameter or a critical dimension (CD) of each of a plurality of pillar-shaped guides PG that will be explained with reference to FIGS. 6A and 6B in a subsequent process may be determined by an inside diameter of each of the plurality of holes 112H formed in the third mask pattern 112. The plurality of holes 112H formed in the third mask pattern 112 may be regularly arranged. For example, the plurality of holes 112H may be arranged in a hexagonal array or a matrix array.

In the low-density region LR, the plurality of holes 112H may be formed only in a dummy pattern region DPR spaced apart by a second distance L2 from the high-density region HR with the separation region SR interposed therebetween. The second distance L2 may be greater than the first distance L1 between each two holes 112H formed in the high-density region HR.

In some exemplary embodiments, a width of the separation region SR in the X direction, for example, the second distance L2, may be about 2 to about 6 times of a bulk period $L_0$ of a block copolymer layer 120 that may be formed around the plurality of pillar-shaped guides PG in a subsequent process to be described below with reference to FIGS. 8A and 8B. In some embodiments, the width of the separation region SR in the X direction, for example, the second distance L2, may range from, for example, about 40 nm to about 200 nm.

The substrate 102 may be a semiconductor substrate. In some exemplary embodiments, the substrate 102 may include a semiconductor such as silicon (Si) or germanium (Ge). In some other exemplary embodiments, the substrate 102 may include a compound semiconductor such as SiGe, SiC, GaAs, InAs, or InP. In some other exemplary embodiments, the substrate 102 may have a silicon on insulator (SOI) structure. The substrate 102 may include a conductive region, for example, a well doped with impurities or a structure doped with impurities. The substrate 102 may have any of various device isolation structures such as a shallow trench isolation (STI) structure.

The feature layer 104 may be an insulating film or a conductive film. For example, the feature layer 104 may include metal, an alloy, metal carbide, metal nitride, metal oxynitride, metal oxycarbide, a semiconductor, polysilicon, oxide, nitride, oxynitride, hydrocarbon, or a combination thereof. When a pattern that is to be finally formed is formed on the substrate 102, the feature layer 104 may be omitted.

The first mask layer 106 may be used as a layer for forming a final pattern to be formed on the feature layer 104 and transferring the final pattern to the feature layer 104. In some exemplary embodiments, the first mask layer 106 may have a hydrophilic surface. In some exemplary embodiments, a silanol group may be exposed on a surface of the first mask layer 106.

In some exemplary embodiments, the first mask layer 106 may include a material including Si. For example, the first mask layer 106 may include a silicon nitride film, a silicon oxide film, a silicon oxynitride film, a silicon carbonitride film, or a combination thereof. The first mask layer 106 may be formed to have a thickness ranging from, for example, about 100 Å to about 500 Å.

The second mask layer 108 may include a material different from that of the first mask layer 106. For example, when the first mask layer 106 includes a silicon nitride film, a silicon oxynitride film, and/or a silicon carbonitride film, the second mask layer 108 may include a carbon-containing film such as a spin-on hardmask (SOH) material, a silicon oxide film, or a combination thereof. The carbon-containing film such as an SOH material may include an organic compound having a relatively high carbon content ranging from about 85 weight % to about 99 weight % based on a total weight of the organic compound. The organic compound may include a hydrocarbon compound including an aromatic ring such as phenyl, benzene, or naphthalene, or a derivative thereof. The second mask layer 108 may be formed to have a thickness ranging from, for example, about 500 Å to about 3000 Å.

The anti-reflection film 110 may be any film as long as the film may be used for a photolithography process. In some exemplary embodiments, the anti-reflection film 110 may include a material including Si. In some exemplary embodiments, the anti-reflection film 110 may be a silicon oxynitride film. In some other exemplary embodiments, the anti-reflection film 110 may include a material for a KrF excimer laser, a material for ArF excimer laser, or an organic anti-reflective coating (ARC) material for any other light source.

The anti-reflection film 110 may be formed to have a thickness ranging from, for example, about 20 nm to about 500 nm.

The third mask pattern 112 may include a photoresist. In some exemplary embodiments, the third mask pattern 112 may include a resist for a KrF excimer laser (with a wavelength of 248 mm, a resist for an ArF excimer laser (with a wavelength of 193 nm), a resist for an $F_2$ excimer laser (with a wavelength of 157 nm), or a resist for extreme ultraviolet (EUV) rays (with a wavelength of 13.5 nm).

Figure 2B:
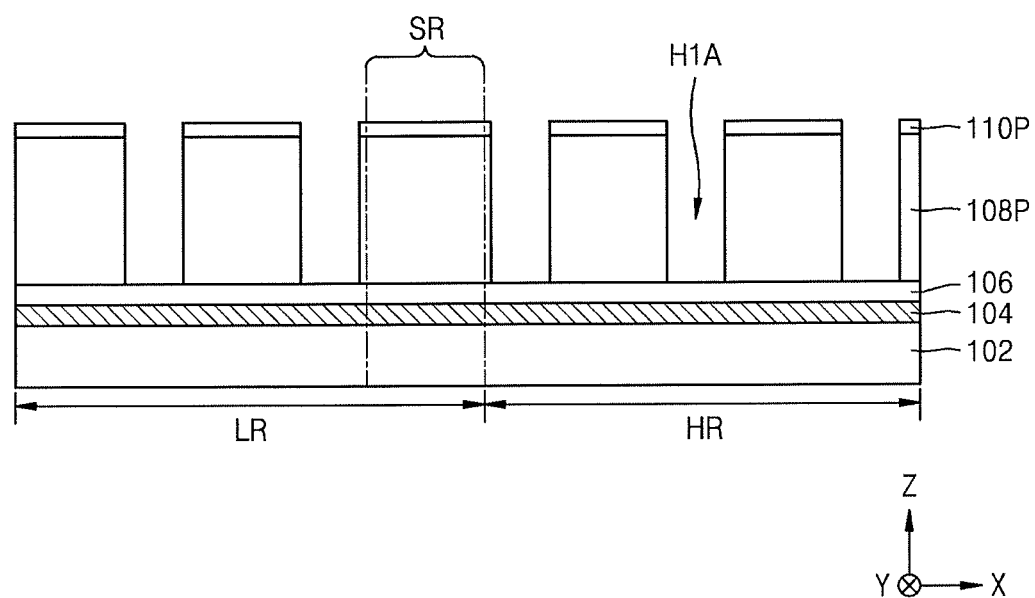

Referring to FIGS. 2A and 2B, in the high-density region HR and the low-density region LR, a second mask pattern 108P, and an anti-reflection pattern 110P may be formed by etching the anti-reflection film 110 and the second mask layer 108 by using the third mask pattern 112 (see FIGS. 1A and 1B) as an etch mask, and a plurality of guide-forming holes H1A may be formed through the second mask pattern 108P.

After the plurality of guide-forming holes H1 are formed, the third mask pattern 112 (see FIGS. 1A and 1B) may be removed.

Figure 3A:
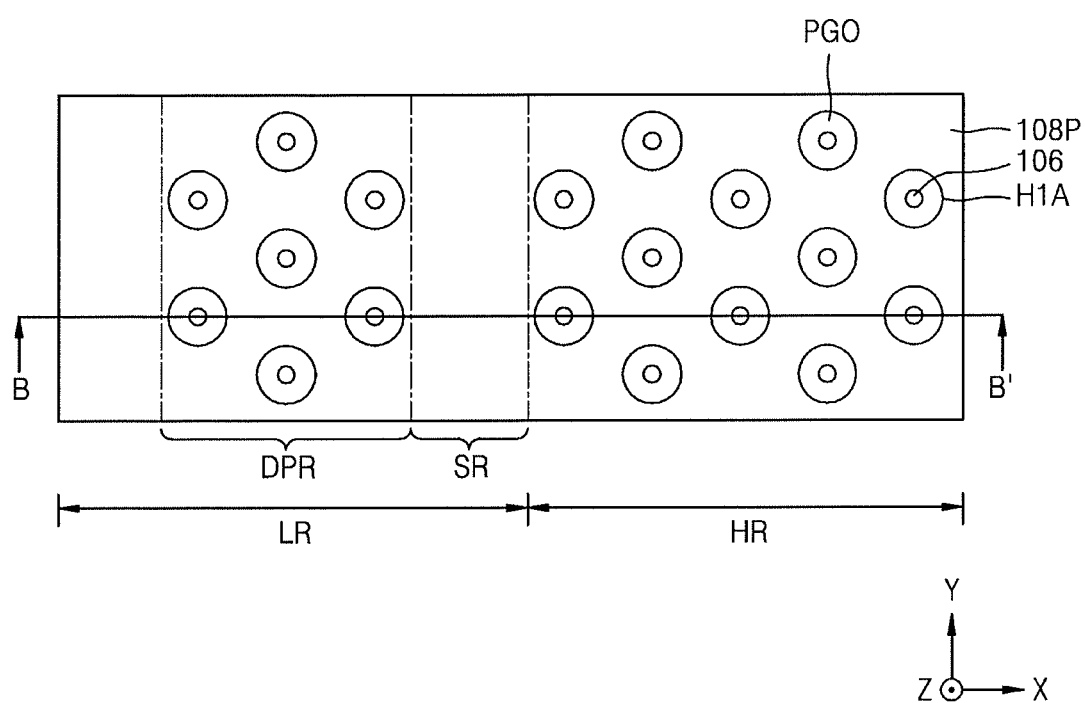
Figure 3B:
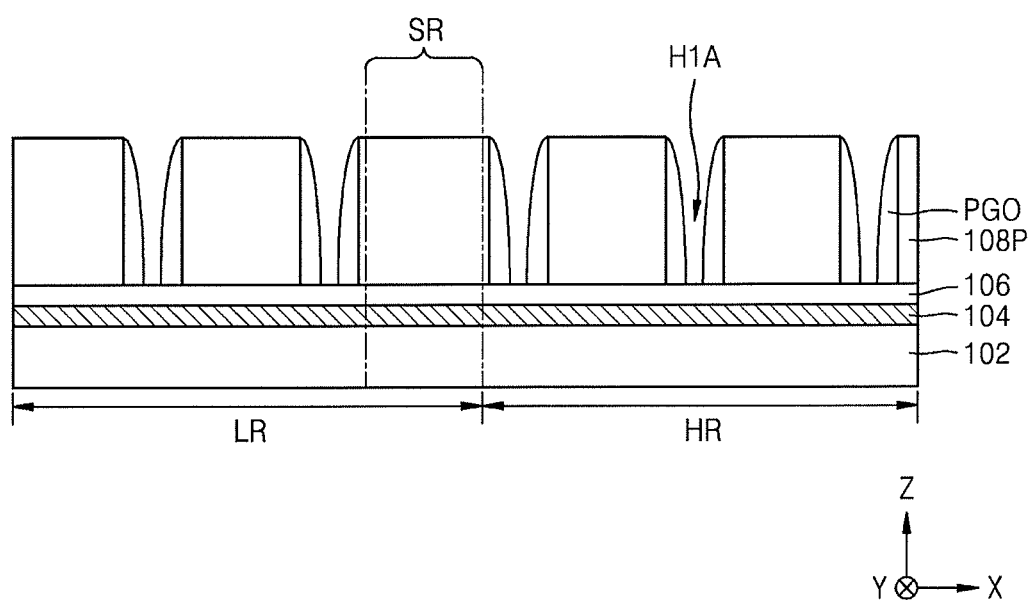

Referring to FIGS. 3A and 3B, a plurality of pillar-shaped guide outer walls PGO that may cover side walls of the second mask pattern 108P in the plurality of guide-forming holes H1A may be formed in the high-density region HR and the low-density region LR.

In some exemplary embodiments, in order to form the plurality of pillar-shaped guide outer walls PGO, a first material layer may be formed to cover inner walls of the plurality of guide-forming holes H1A and a top surface of the second mask pattern 108P in a resultant structure of FIGS. 2A and 2B, and then the plurality of pillar-shaped guide outer walls PGO may remain only on the side walls of the second mask pattern 108P in the plurality of guide-forming holes H1A by etching back the first material layer. The first material layer may be formed by using, for example, an atomic layer deposition (ALD) process. A process of etching back the first material layer may be performed so that the top surface of the second mask pattern 108P is exposed. In this process, the anti-reflection pattern 110P (see FIGS. 2A and 2B) that remains on the second mask pattern 108P may be removed.

In some exemplary embodiment, the pillar-shaped guide outer walls PGO may include a material including Si, for example, silicon oxide.

Figure 4A:
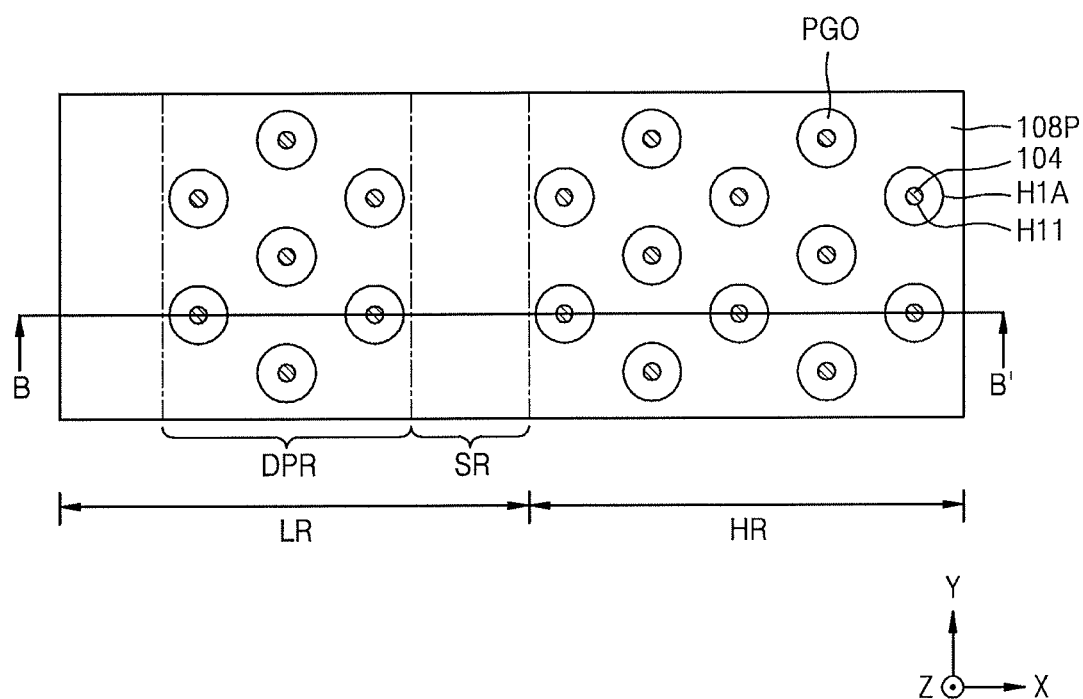
Figure 4B:
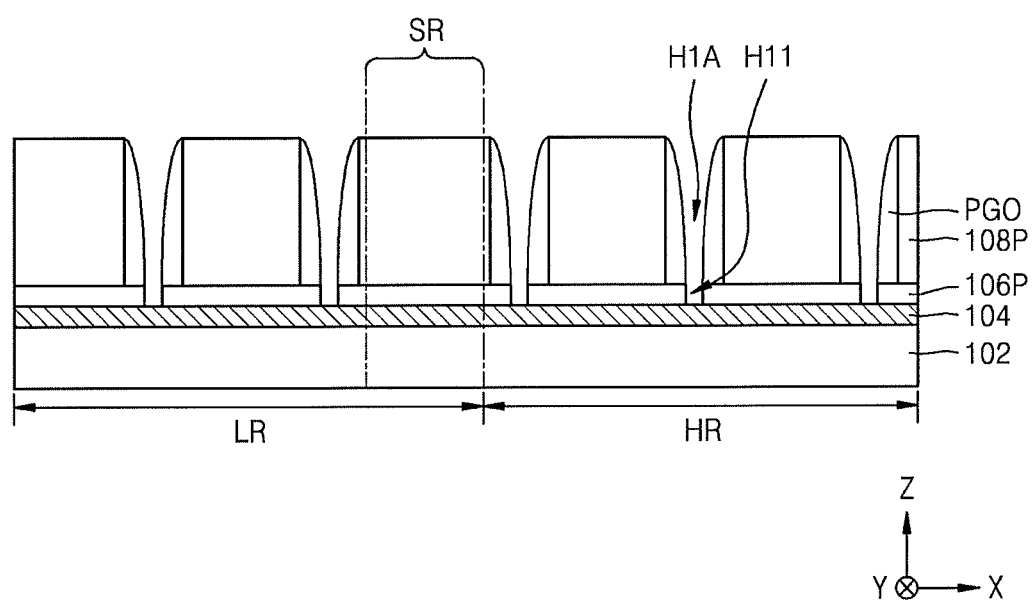

Referring to FIGS. 4A and 4B, in the high-density region HR and the low-density region LR, a first mask pattern 106P, in which a plurality of first holes H11 may be formed, may be formed by etching portions of the first mask layer 106 that may be exposed through the plurality of guide-forming holes H1A by using the second mask pattern 108P and the plurality of pillar-shaped guide outer walls PGO as etch masks.

The plurality of guide-forming holes H1A and the plurality of first holes H11 may provide a plurality of inner spaces for forming a plurality of pillar cores PGC that will be described with reference to FIGS. 5A and 5B below.

Figure 5A:
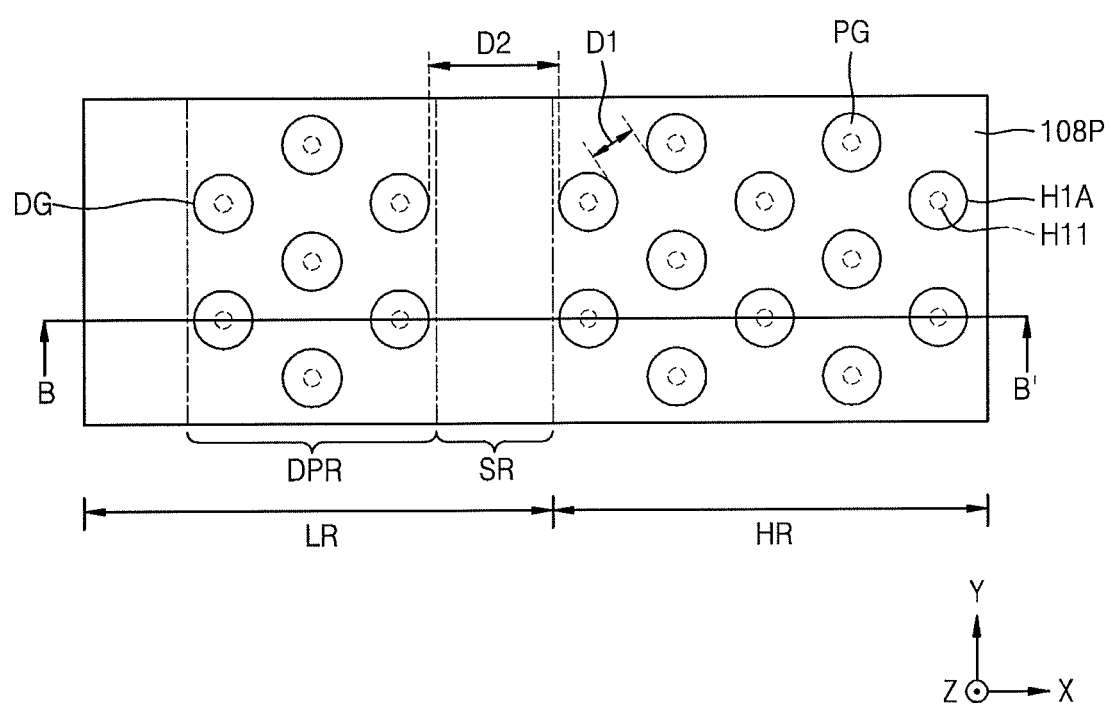
Figure 5B:
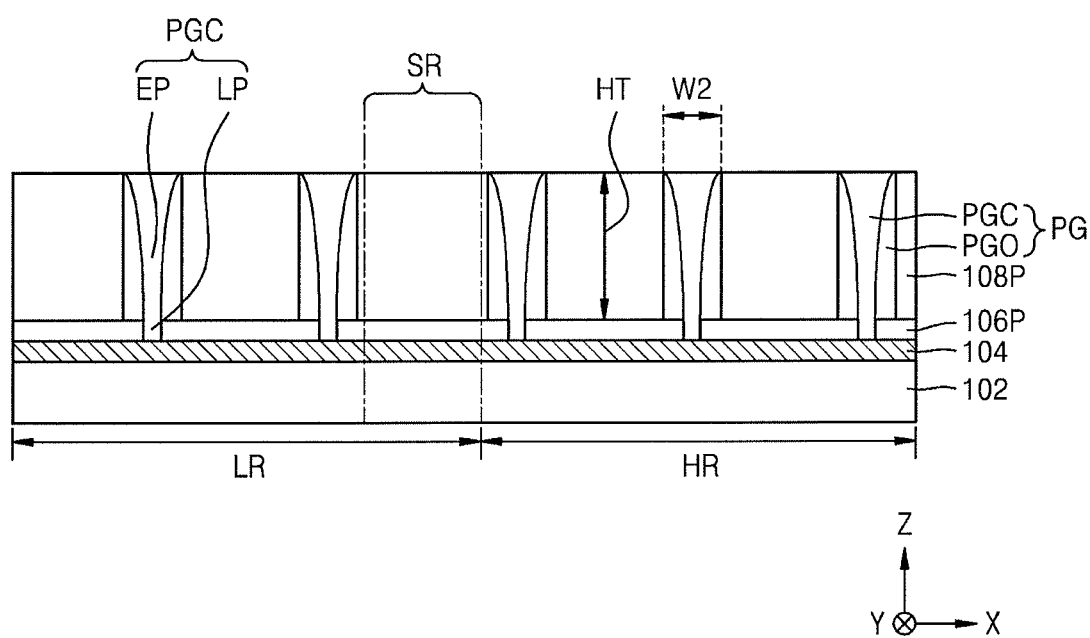

Referring to FIGS. 5A and 5B, the plurality of pillar cores PGC that may fill the plurality of first holes H11 and the plurality of guide-forming holes H1A (see FIGS. 4A and 4B) may be formed in the high-density region HR and the low-density region LR, and a plurality of pillar-shaped guides PG including the plurality of pillar cores PGC and the plurality of pillar-shaped guide outer walls PGO may be formed.

Among the plurality of pillar-shaped guides PG, a plurality of pillar-shaped guides PG that may be formed in the dummy pattern region DPR of the low-density region LR may form a plurality of dummy guides DG. The plurality of dummy guides DG may be spaced apart from a plurality of pillar-shaped guides PG that may be formed in the high-density region HR, with the separation region SR interposed therebetween. A separation distance D2 between the plurality of pillar-shaped guides PG that may be formed in the high-density region HR and the plurality of dummy guides DG may be greater than a separation distance D1 between each two pillar-shaped guides PG that may be formed in the high-density region HR.

The plurality of pillar cores PGC may include lower portions LP that may fill the first holes H11 and extending portions EP that may integrally be formed with the lower portions LP, may fill inner spaces defined by the guide-forming holes H1A, and may protrude upward beyond the first mask pattern 106P.

In some exemplary embodiments, in order to form the plurality of pillar cores PGC, a second material layer having a thickness great enough, e.g., large enough, to fill the plurality of first holes H11 and the plurality of guide-forming holes H1A may be formed on the substrate 102, and then the plurality of pillar cores PGC may remain by etching back or planarizing the second material layer so that the top surface of the second mask pattern 108P is exposed. An ALD process or a chemical vapor deposition (CVD) process, for example, may be used to form the second material layer.

The plurality of pillar cores PGC may include a material including Si, for example, silicon oxide. In some exemplary embodiments, the plurality of pillar cores PGC and the plurality of pillar-shaped guide outer walls PGO may include the same material.

The plurality of pillar-shaped guides PG may protrude upward beyond the first mask pattern 106P. In the plurality of pillar-shaped guides PG, the plurality of pillar cores PGC may fill the plurality of first holes H11 (see FIGS. 4A and 4B) formed in the first mask pattern 106P and may protrude upward beyond the first mask pattern 106P, and parts of the plurality of pillar cores PGC, which may protrude upward beyond the first mask pattern 106P, may be surrounded by the pillar-shaped guide outer walls PGO. Accordingly, the plurality of pillar-shaped guides PG above the first mask pattern 106P may have diameters that may be greater than those of the plurality of first holes H11. A height HT of each of portions of the plurality of pillar-shaped guides PG that may protrude upward beyond the first mask pattern 106P may range from, for example, about 10 nm to about 500 nm.

The plurality of pillar-shaped guides PG may be formed to be arranged in a hexagonal array having a pitch that may be at least 1.5 times the bulk period $L_0$ of the block copolymer layer 120 that may be formed around the plurality of pillar-shaped guides PG in a subsequent process.

Figure 8A:
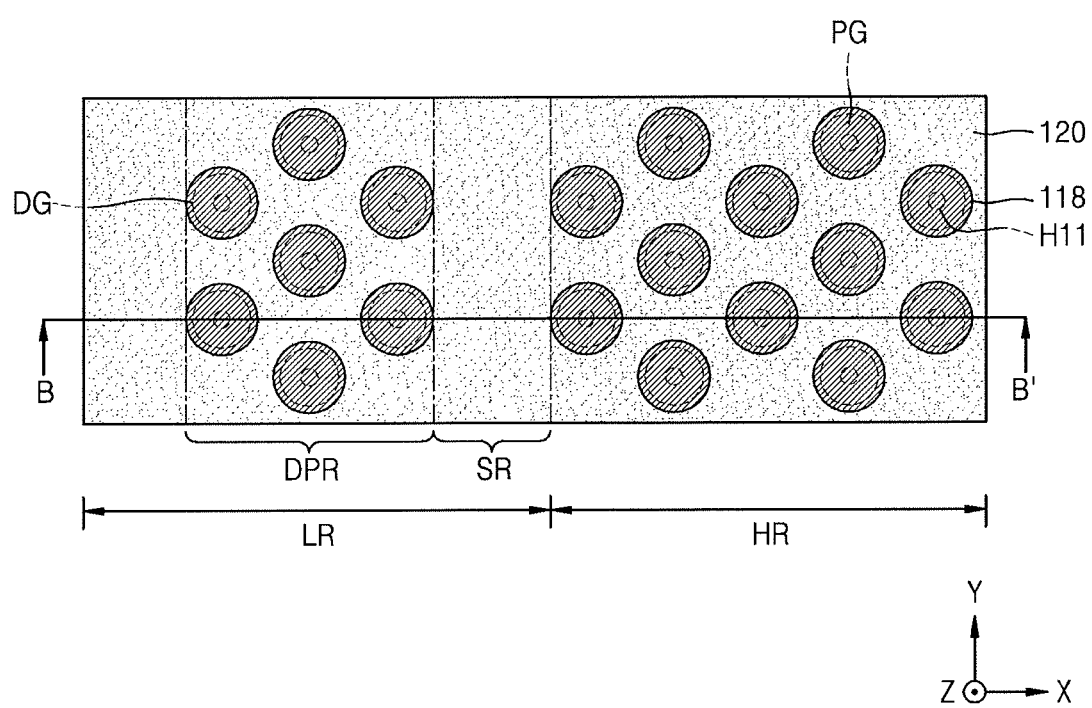
Figure 8B:
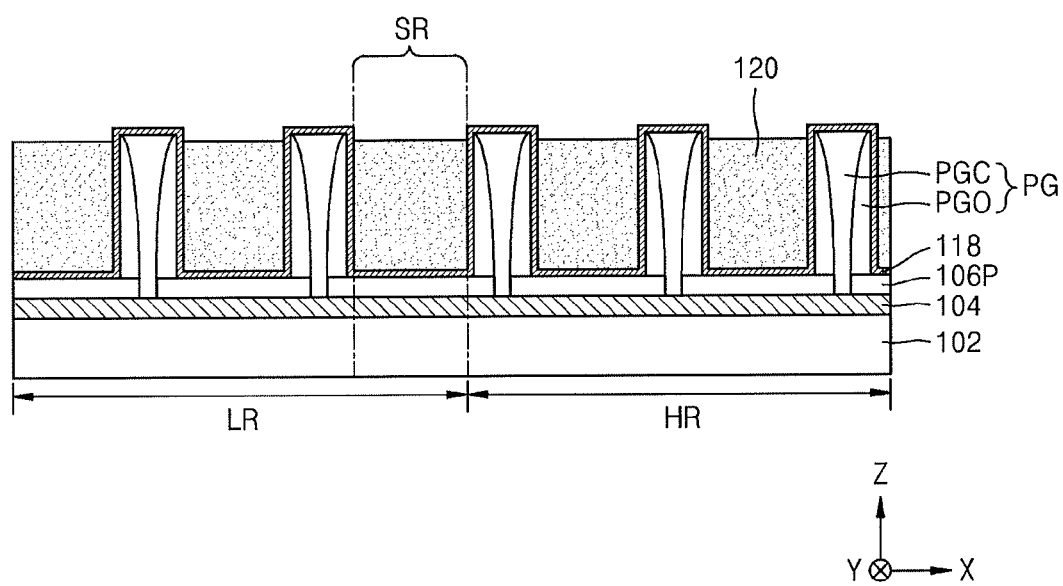

In some exemplary embodiments, the plurality of pillar-shaped guides PG may be formed to be arranged in a hexagonal array having a pitch that may be about 1.73 times the bulk period $L_0$ of the block copolymer layer 120 (see FIGS. 8A and 8B). In some other exemplary embodiments, the plurality of pillar-shaped guides PG may be formed to be arranged in a hexagonal array having a pitch that may be about N times the bulk period $L_0$ of the block copolymer layer 120 (wherein N is an integer that is equal to or greater than 2). For example, the plurality of pillar-shaped guides PG may have a pitch that may be about twice the bulk period $L_0$ of the block copolymer layer 120.

Figure 6A:
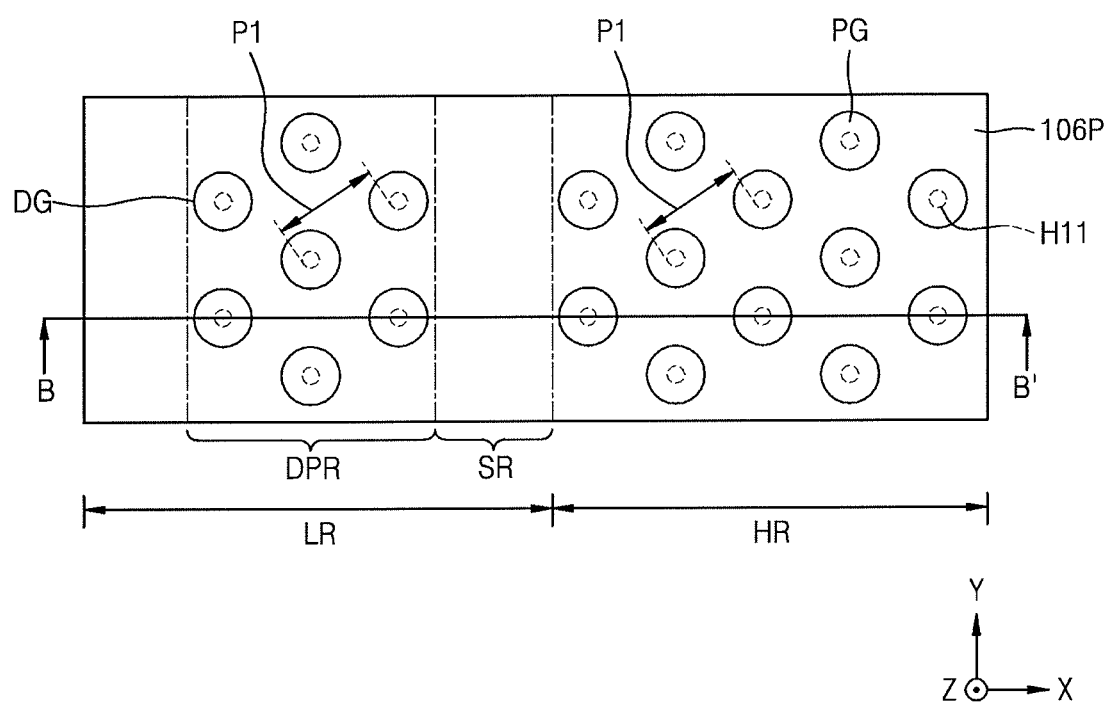
Figure 6B:
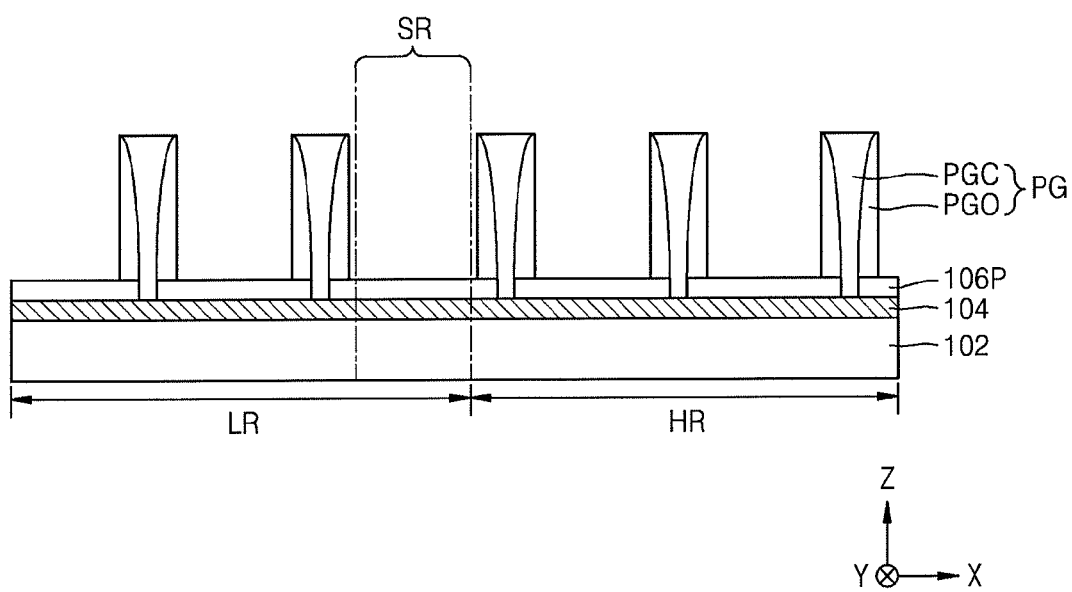

Referring to FIGS. 6A and 6B, a top surface of the first mask pattern 106P and top surfaces and side walls of the plurality of pillar-shaped guides PG may be exposed by removing the second mask pattern 108P (see FIGS. 5A and 5B) from the high-density region HR and the low-density region LR.

In the dummy pattern region DPR of the low-density region LR and the high-density region HR, the plurality of pillar-shaped guides PG may be formed to be arranged in a hexagonal array having a first pitch P1, and the plurality of pillar cores PGC that may form the plurality of pillar-shaped guides PG may also be formed to be arranged in a hexagonal array having the first pitch P1.

Figure 7A:
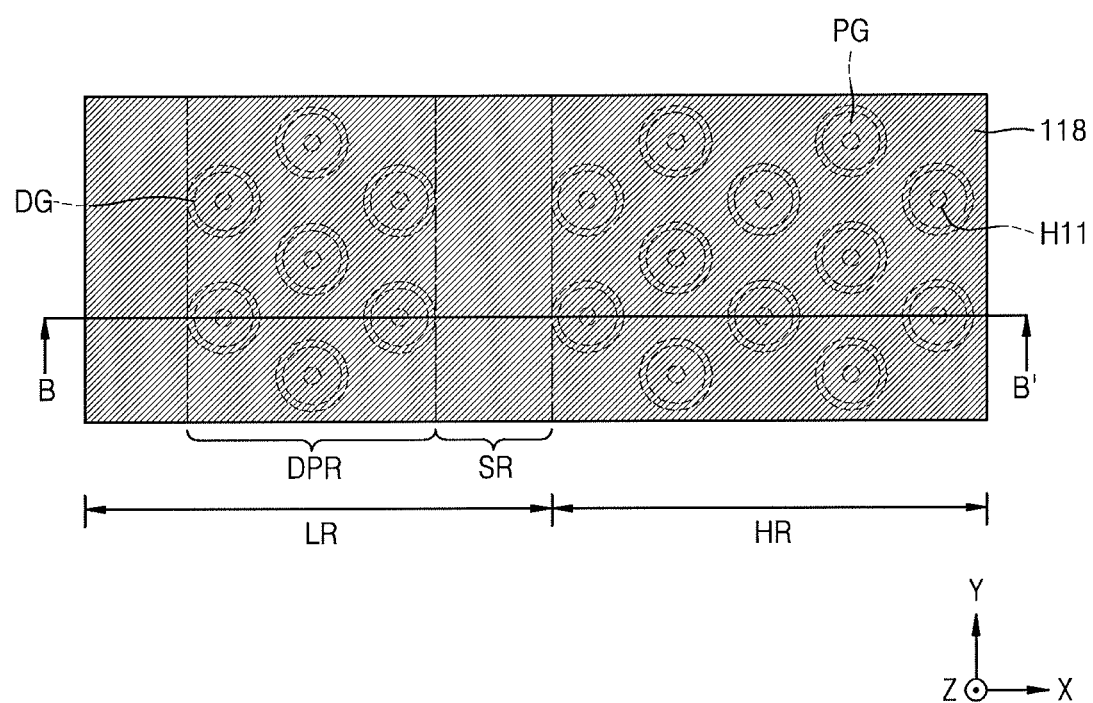
Figure 7B:
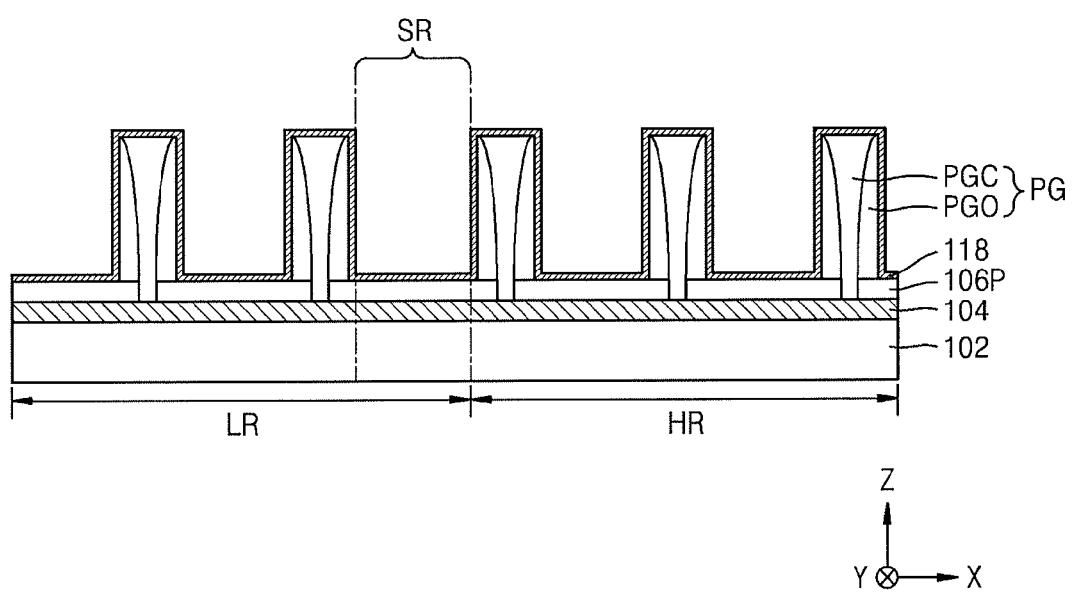

Referring to FIGS. 7A and 7B, a brush liner 118 that may cover an exposed surface of the first mask pattern 106P and exposed top surfaces and sidewalls of the plurality of pillar-shaped guides PG may be formed in the high-density region HR and the low-density region LR.

In some exemplary embodiments, the brush liner 118 may include a material having a relatively higher affinity for a major block having the largest volume ratio from among polymer blocks forming the block copolymer layer 120 that will be described with reference to FIGS. 8A and 8B later.

In some exemplary embodiments, the brush liner 118 may include polymer having the same repeating unit as a repeating unit of polymer that may form the major block.

In some exemplary embodiments, the brush liner 118 may include a random copolymer that may include polymer having the same repeating unit as a repeating unit of polymer forming the major block and anchoring polymer having a repeating unit including a primary hydroxyl group. The anchoring polymer may be obtained from a monomer unit such as 2-hydroxyethyl methacrylate, 3-hydroxypropyl methacrylate, or 4-hydroxybutyl methacrylate. In the random copolymer, the anchoring polymer may be included in an amount that ranges from about 0.01 weight % to about 10 weight % based on a total weight of the random copolymer.

In some exemplary embodiments, in order to form the brush liner 118, a process of attaching the random copolymer to the exposed surfaces of the plurality of pillar-shaped guides PG and the exposed surface of the first mask pattern 106P may be performed by using the primary hydroxyl group of the anchoring polymer as an anchoring group.

In some exemplary embodiments, in order to form the brush liner 118, a polymer composition including the random copolymer may be coated on the exposed surfaces of the plurality of pillar-shaped guides PG. Thereafter, the primary hydroxyl group of the anchoring polymer and a pillar core may be helped to react with each other by heat-treating a coated resultant structure, and the random copolymer may be attached to the exposed surfaces of the plurality of pillar-shaped guides PG and the exposed surface of the first mask pattern 106P. The heat treatment may be performed, for example, for about 60 seconds to about 300 seconds at a temperature ranging from about 150° C. to about 300° C. Thereafter, a non-reacted portion of the random copolymer composition may be removed by using an organic solvent to expose the brush liner 118 that may cover the exposed surfaces of the plurality of pillar-shaped guides PG and the exposed surface of the first mask pattern 106P. The organic solvent may be, for example, propylene glycol monomethyl ester acetate (PGMEA), propylene glycol monomethyl ester (PGME), ethyl-3-ethoxy propionate (EEP), ethyl lactate (EL), methyl 2-hydroxybutyate (HBM), or gamma-butyrolactone (GBL).

Since the random copolymer includes the anchoring polymer having the primary hydroxyl group, assuming that the plurality of pillar-shaped guides PG include a silicon oxide film, when the random copolymer is coated on the surfaces of the plurality of pillar-shaped guides PG and then is heat-treated, the random copolymer including the anchoring polymer may be attached to surfaces of the plurality of pillar-shaped guides PG due to, for example, a condensation reaction between silanol of the plurality of pillar-shaped guides PG and the primary hydroxyl group of the anchoring polymer. When random copolymers that do not react with the silanol of the pillar-shaped guides PG and remain around the plurality of pillar-shaped guides PG are stripped by using an organic solvent to be removed, the brush liner 118 having a predetermined thickness may remain on the surfaces of the plurality of pillar-shaped guides PG.

In some exemplary embodiments, the brush liner 118 may include a polymer layer having polystyrene (PS) as a main component. The brush liner 118 may have PS affinity for materials (for example, poly(methyl methacrylate) (PMMA) and PS) forming the block copolymer layer 120 that may be formed around the plurality of pillar-shaped guides PG in a subsequent process to be described with reference to FIGS. 8A and 8B later.

In some exemplary embodiments, the brush liner 118 may be formed to have a thickness that ranges from, for example, about 2 nm to about 15 nm.

Referring to FIGS. 8A and 8B, the block copolymer layer 120 may be formed around the plurality of pillar-shaped guides PG on the first mask pattern 106P that may be covered by the brush liner 118 in the high-density region HR and the low-density region LR. As used herein, the "high-density region HR" has a higher density of pillar-shaped guides PG per unit area compared to the "low-density region LR".

Since the plurality of dummy guides DG having the same shape as the plurality of pillar-shaped guides PG that may be formed in the high-density region HR may be formed also in the dummy pattern region DPR of the low-density region LR, which may be adjacent to the high-density region HR, the block copolymer layer 120 that may have a uniform thickness from a central part of the high-density region FIR to an edge part thereof, and may provide a flat top surface, may be formed.

For example, when the block copolymer layer 120 is formed in the high-density region HR and the low-density region LR in a state in which the plurality of pillar-shaped guides PG are not formed in the low-density region LR and are formed only in the high-density region HR, the thickness of the block copolymer layer 120 may gradually decreased at an edge part of the high-density region HR, and an incline plane may be formed in the top surface of the block copolymer layer 120. When an incline plane exists in the top surface of the block copolymer layer 120, a self-assembled structure having a desired vertical orientation structure may not be obtained in the incline plane after the block copolymer layer 120 is phase-separated, and in the high-density region HR, a desired pattern may not be formed and a non-uniform pattern may be formed depending on the position in the high-density region HR. In the method of forming a pattern, according to the exemplary embodiment, by forming the plurality of dummy guides DG, which may have the same shape as the plurality of pillar-shaped guides PG that may be formed in the high-density region HR, also in the dummy pattern region DPR of the low-density region LR, which may be adjacent to the high-density region HR, an incline plane may be prevented from being formed in the top surface of the block copolymer layer 120 depending on the position in the high-density region HR. By adjusting the width of the separation region SR in the X direction, for example, the second distance L2 (see FIG. 1A), to help optimize a separation distance between the plurality of pillar-shaped guides PG, which may be formed in the high-density region HR, and the plurality of dummy guides DG, which may be formed in the low-density region LR, the block copolymer layer 120, which may have a top surface extending parallel to the substrate 120 without an incline from the high-density region HR to the low-density region LR, may be provided.

When the width of the separation region SR, for example, a separation distance between the plurality of pillar-shaped guides PG, which may be formed in the high-density region HR, and the plurality of dummy guides DG, which may be formed in the low-density region LR, is too small, it may be difficult to obtain a desired resolution when performing a photolithography process for the formation of a trimming mask pattern 130 that will be described with reference to FIGS. 13A and 13B. Accordingly, the separation region SR may be set to have an enough width, e.g., a large enough width, so that an incline surface may not be formed in the top surface of the block copolymer 120 and a desired resolution may be obtained when performing a photolithography process for the formation of a trimming mask pattern 130. In some embodiments, the width of the separation region SR may be selected within a range of, for example, about 40 nm to about 200 nm.

The block copolymer layer 120 may be spaced apart from the plurality of pillar-shaped guides PG with the brush liner 118 interposed therebetween.

In some exemplary embodiments, the block copolymer layer 120 may include a pure block copolymer including a first polymer block having a first repeating unit and a second polymer block having a second repeating unit. In some exemplary embodiments, the pure block copolymer may include linear or branched polymer having a molecular weight ranging from about 3,000 g/mol to about 2,000,000 g/mol.

In the pure block copolymer, the first polymer block may be PMMA, poly(ethylene oxide) (PEO), poly(lactic acid) (PLA), or polyisoprene (PI). The second polymer block may be PS.

In the block copolymer layer 120, the second polymer block may constitute a major block, and the first polymer block may constitute a minor block. In some exemplary embodiments, a volume ratio between the first polymer block and the second polymer block in the pure block copolymer may range from, for example, about 20:80 to about 40:60.

In some exemplary embodiments, in order to form the block copolymer layer 120, the pure block copolymer may be applied to the first mask pattern 106P that may be covered by the brush liner 118. For example, the block copolymer layer 120 may be formed by using a dip coating, solution casting, or spin-coating process.

Figure 9A:
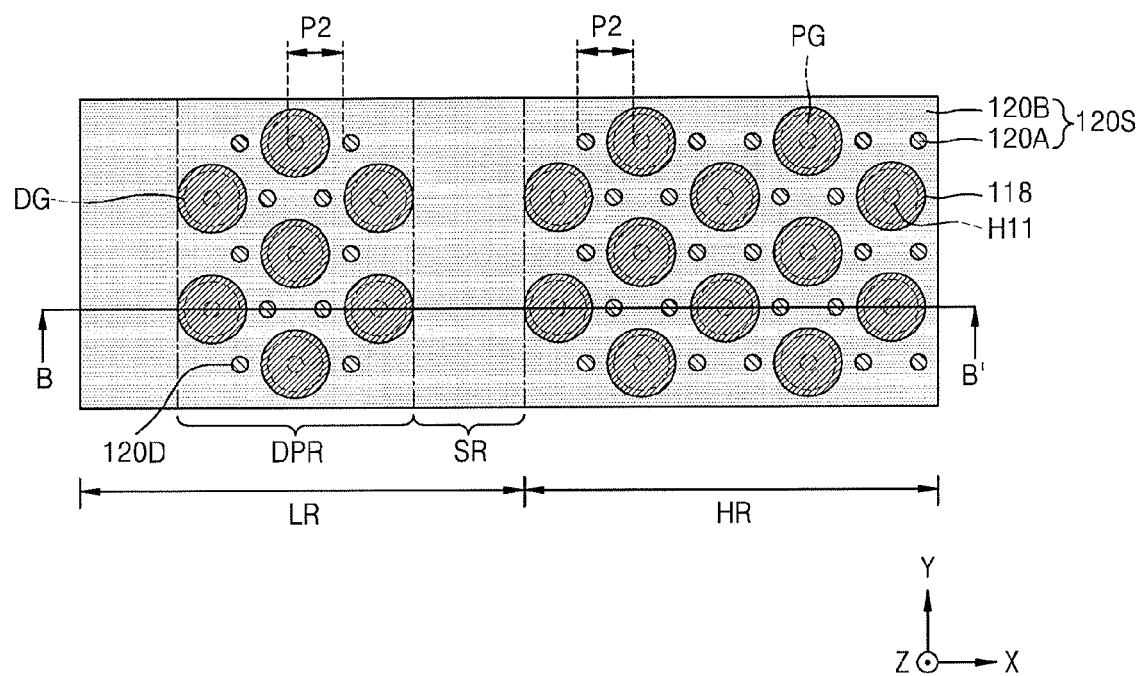
Figure 9B:
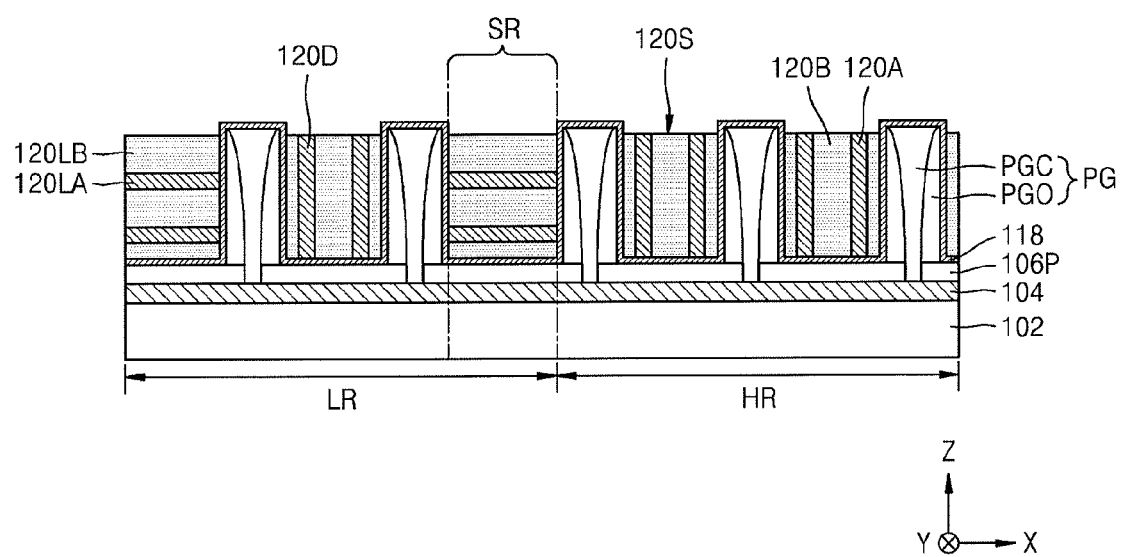

Referring to FIGS. 9A and 9B, a self-assembled layer 120S may be formed by phase-separating the block copolymer layer 120 (see FIGS. 8A and 8B).

The self-assembled layer 120S may include a plurality of first domains 120A that may be formed in the high-density region HR and may include the first polymer block, a plurality of first dummy domains 120D that may be formed in the dummy pattern region DPR of the low-density region LR and may include the first polymer block, and a second domain 120B that may be formed in the high-density region HR and the low-density region LR and may include the second polymer block. The second domain 120B may be vertically oriented to surround the plurality of pillar-shaped guides PG, the plurality of first domains 120A, and the plurality of first dummy domains 120D in the high-density region HR and the low-density region LR.

In some exemplary embodiments, in the remaining region of the low-density region LR except the dummy pattern region DPR, the self-assembled layer 120S may include a part that may form a layered structure in which a first horizontal domain 120LA and a second horizontal domain 120LB may be alternately self-assembled in a direction away from the substrate 102. This may be caused by the fact that a pillar-shaped guide PG may not exist within a certain distance. Accordingly, the separation region SR, in which a pillar-shaped guide PG may not be formed over a relatively large area, may also include a part that may form a layered structure in which the first horizontal domain 120LA and the second horizontal domain 120LB may be alternately self-assembled in a direction away from the substrate 102.

The first horizontal domain 120LA may include the first polymer block, and the second horizontal domain 120LB may include the second polymer block.

For example, since a pattern for guiding the first polymer block and the second polymer block that may be obtained as a result of the phase-separation of the block copolymer layer 120 (see FIGS. 8A and 8B) may not be formed over a relatively large area in the remaining region of the low-density region LR except the dummy pattern region DPR, the first horizontal domain 120LA, which may include the first polymer block having a relatively higher affinity for the brush liner 118 being in contact with the block copolymer layer 120, may be self-assembled in a layered structure form on the brush liner 118 in the remaining region of the low-density region LR except the dummy pattern region DPR when the block copolymer layer 120 is phase-separated. Accordingly, the first horizontal domain 120LA may be the lowest layer of the self-assemble layer 120S, which is closest to the substrate 102.

The second horizontal domain 120LB may be self-assembled in a layered structure form on the first horizontal domain 120LA. In this manner, the first horizontal domain 120LA and the second horizontal domain 120LB may be alternately self-assembled in a direction away from the substrate 102 in the remaining region of the low-density region LR except the dummy pattern region DPR. In some exemplary embodiments, the highest layer of the self-assembled layer 120S, which is most distant from the substrate 102, in the remaining region of the low-density region LR except the dummy pattern region DPR may be the second horizontal domain 120LB including the second polymer block.

In some other embodiments, a regular orientation may not be formed in the self-assembled layer 120S in the remaining region of the low-density region LR except the dummy pattern region DPR.

In order to phase-separate the block copolymer layer 120, the block copolymer layer 120 may be annealed at a temperature higher than a glass transition temperature Tg of a block copolymer in the block copolymer layer 120. For example, in order to phase separate the block copolymer layer 120, the block copolymer layer 120 may be annealed for about 1 hour to 24 hours at a temperature ranging from about 130° C. to about 190° C.

The plurality of first domains 120A and the plurality of first dummy domains 120D may be regularly arranged along with the plurality of pillar-shaped guides PG. For example, in the high-density region HR, a hexagonal array having a second pitch P2 that may be less than the first pitch P1 (see FIG. 6A) may be achieved due to, for example, the plurality of pillar cores PGC of the plurality of pillar-shaped guides PG and the plurality of first domains 120A. In the dummy pattern region DPR of the low-density region LR, a hexagonal array having the second pitch P2 that may be less than the first pitch P1 (see FIG. 6A) may be achieved due to, for example, the plurality of pillar cores PGC of the plurality of pillar-shaped guides PG and the plurality of first dummy domains 120D, which may form the dummy guides DG.

In the self-assembled layer 120S, the bulk period $L_0$ that may be determined in the linked structure between the first polymer block, which may form the plurality of first domains 120A and the plurality of first dummy domains 120D, and the second polymer block which may form the second domain 120B may range, for example, from about 40 nm to about 60 nm.

As shown in FIGS. 9A and 9B, in order for the plurality of first domains 120A and the plurality of first dummy domains 120D to be self-aligned in a cylindrical shape at a central portion of a triangle formed by three pillar-shaped guides PG that may be adjacent to one another from among the plurality of pillar-shaped guides PG, the plurality of pillar-shaped guides PG of FIGS. 6A and 6B may be formed to be arranged in a hexagonal array having the first pitch P1 that may be about 1.5 times the bulk period $L_0$ of the block copolymer layer 120.

In some other exemplary embodiments, in order for the plurality of first domains 120A and the plurality of first dummy domains 120D to be self-aligned in a cylindrical shape at a central portion between two pillar-shaped guides PG adjacent to each other from among the plurality of pillar-shaped guides PG, due to, for example, phase-separation of the block copolymer layer 120 shown FIGS. 8A and 8B, the plurality of pillar-shaped guides PG may be formed to be arranged in a hexagonal array having a pitch that may be about twice the bulk period $L_0$ of the block copolymer layer 120.

Figure 10A:
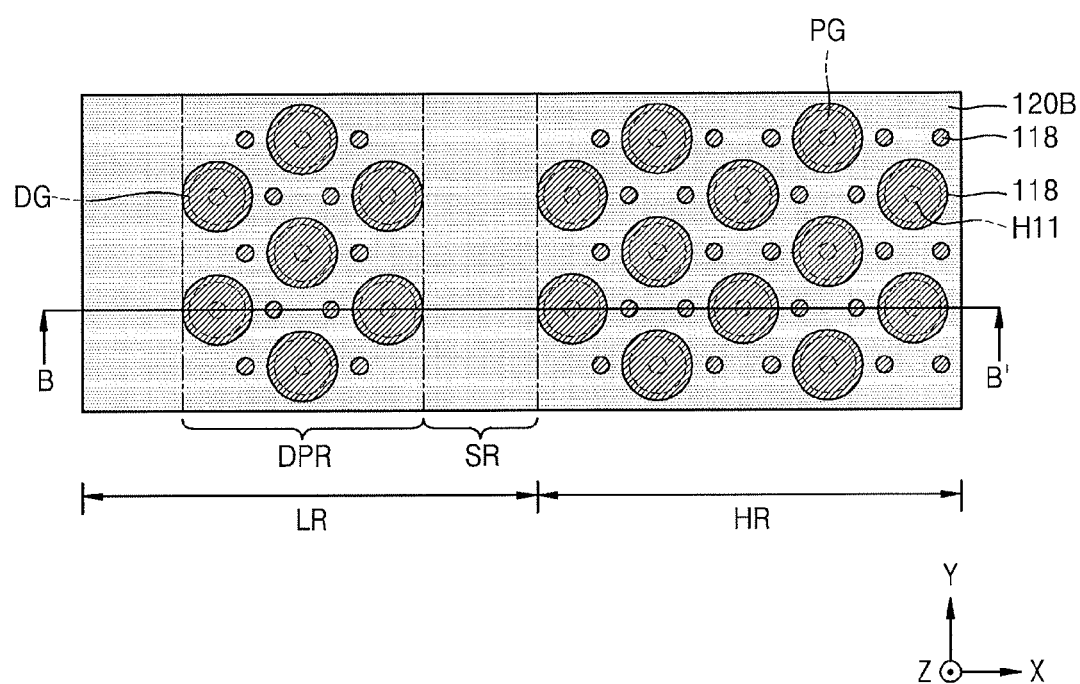
Figure 10B:
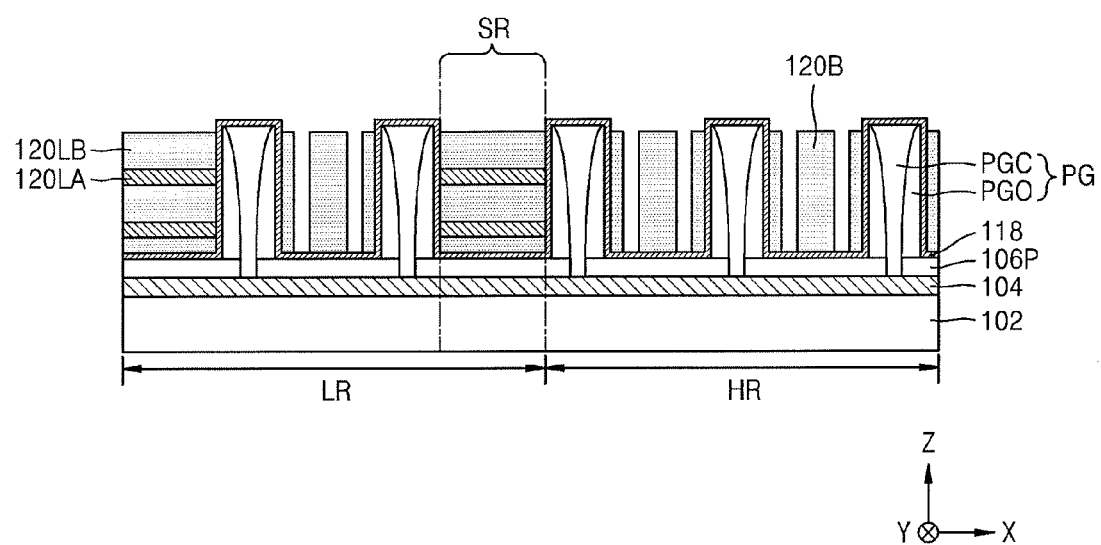

Referring to FIGS. 10A and 10B, the plurality of first domains 120A and the plurality of first dummy domains 120D may be removed from the self-assembled layer 120S (see FIGS. 9A and 9B).

In some exemplary embodiments, in order to selectively remove the plurality of first domains 120A and the plurality of first dummy domains 120D from the self-assembled layer 120S, the plurality of first domains 120A and the plurality of first dummy domains 120D may be selectively decomposed by applying a polymer decomposer to the self-assembled layer 120S and a process of stripping the decomposed first domains 120A and the decomposed first dummy domains 120D may be performed by using a cleaning fluid such as isopropyl alcohol (IPA). In some exemplary embodiments, radiant rays or plasma may be used as the polymer decomposer. The radiant rays may be applied in an oxygen atmosphere, and may be deep ultraviolet (DUV) rays, soft X-rays, or E-beams. The plasma may be oxygen plasma. In order to selectively decompose the plurality of first domains 120A and the plurality of first dummy domains 120D, a type or energy of the polymer decomposer may be selected. For example, a material, which may form the plurality of first domains 120A and the plurality of first dummy domains 120D, and a material, which may form the second domain 120B, may have different threshold energy at which they start to be decomposed. Accordingly, radiant rays or plasma having energy that may selectively decompose the plurality of first domains 120A and the plurality of first dummy domains 120D may be applied to the self-assembled layer 120S. Radiant energy or plasma energy may be adjusted by using a time for which the radiant rays may be applied or a time for which the plasma may be applied.

Figure 11A:
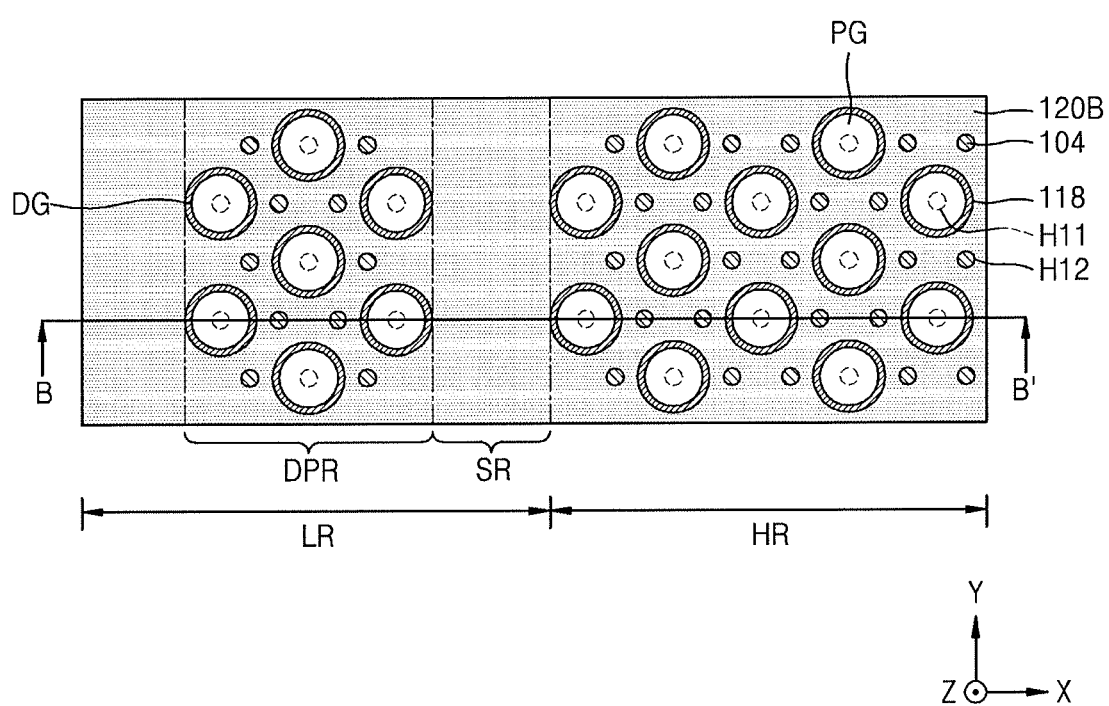
Figure 11B:
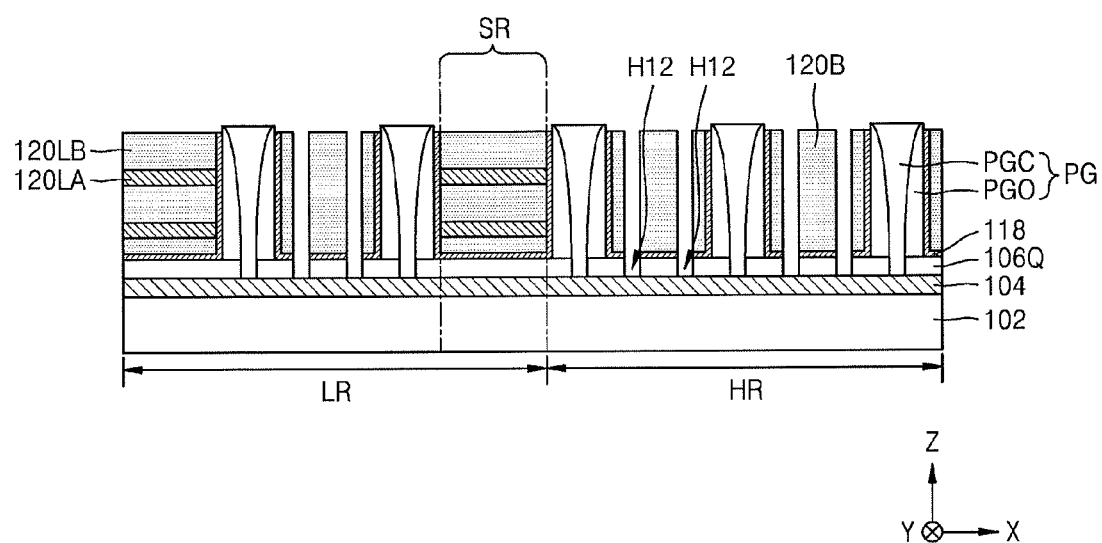

Referring to FIGS. 11A and 11B, in the high-density region HR and the low-density region LR, a first mask pattern 106Q, in which a plurality of self-assembled holes H12 corresponding to the plurality of first domains 120A and the plurality of first dummy domains 120D may be formed, may be formed by etching the exposed brush liner 118 and the first mask pattern 106P (see FIGS. 10A and 10B) by using the plurality of pillar-shaped guides PG and the second domain 120B as etch masks.

Figure 12A:
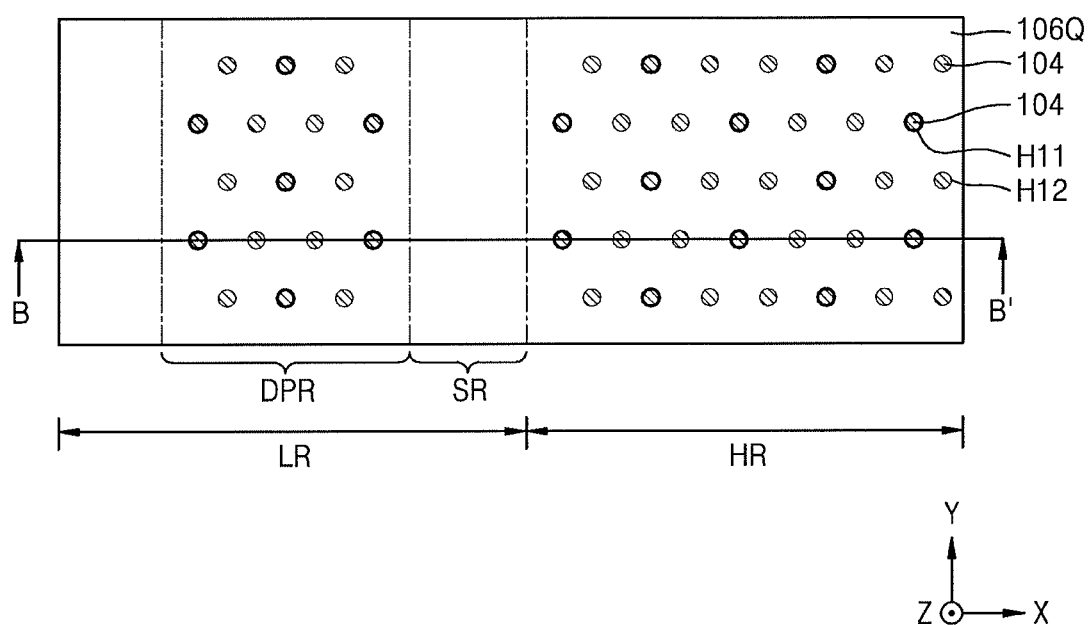
Figure 12B:
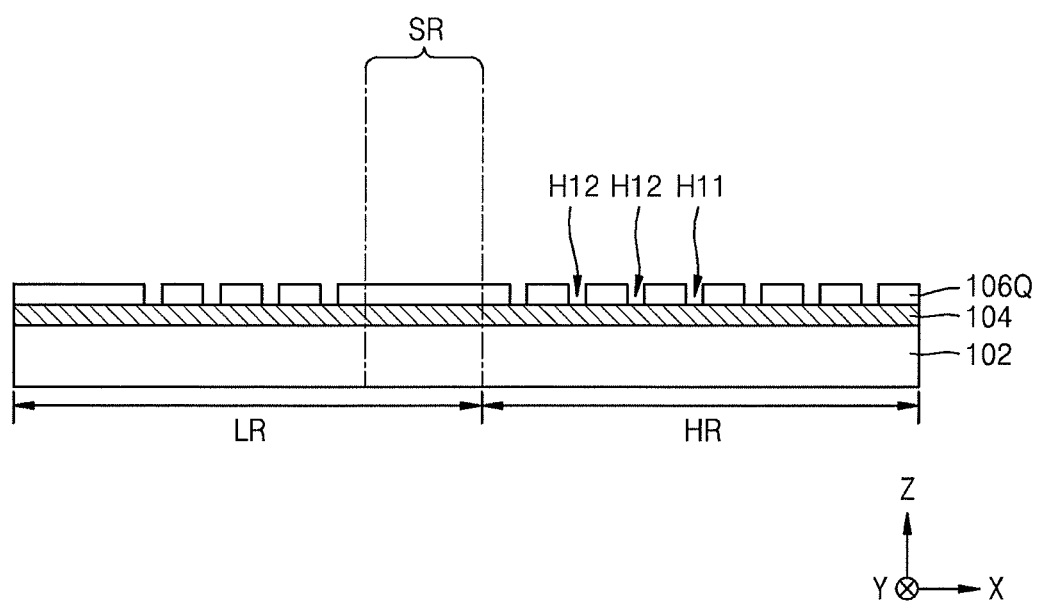

Referring to FIGS. 12A and 12B, in the high-density region HR and the low-density region LR, a top surface of the first mask pattern 106Q may be exposed by removing the plurality of pillar-shaped guides PG, the brush liner 118, and the second domain 120B, which may remain on the first mask pattern 106Q.

In FIG. 12A, for convenience of explanation, a plurality of guide-forming holes H11 are illustrated by using a thicker line than that of the plurality of self-assembled holes H12.

In the dummy pattern region DPR of the low-density region LR and the high-density region HR, the feature layer 104 may be exposed through the plurality of guide-forming holes H11 and the plurality of self-assembled homes H12, which may be formed in the first mask pattern 106Q.

Figure 13A:
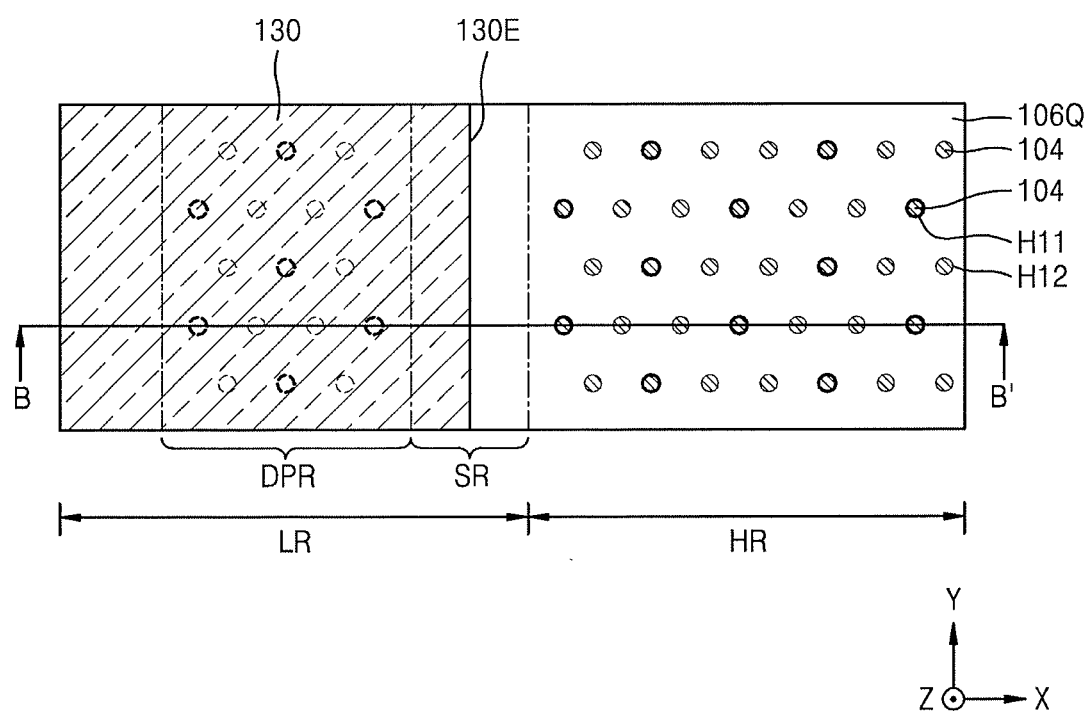
Figure 13B:
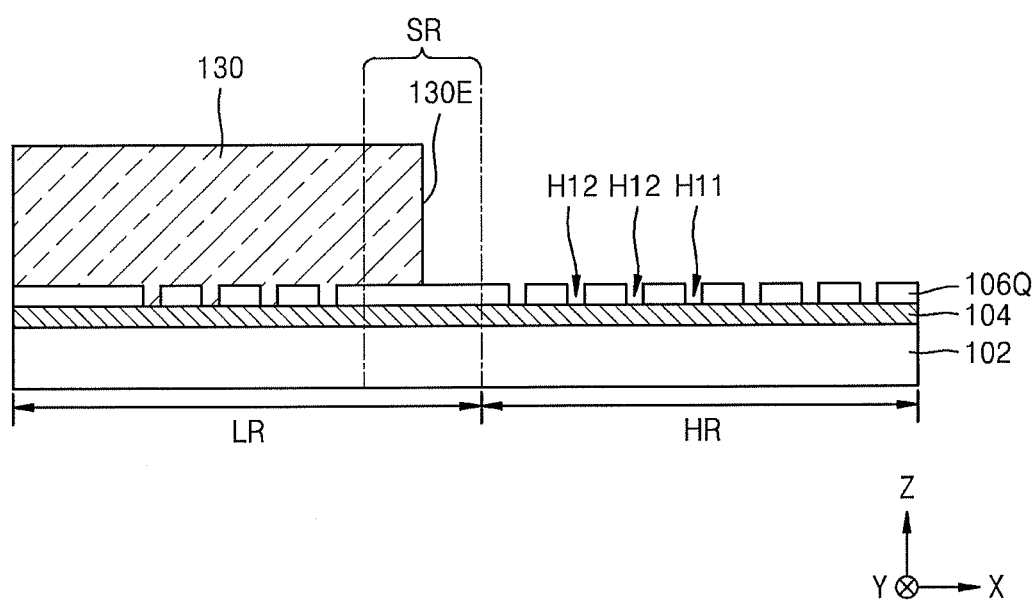

Referring to FIGS. 13A and 13B, a trimming mask pattern 130 that may cover a portion of the first mask pattern 106Q may be formed in the low-density region LR.

The trimming mask pattern 130 may have an edge portion 130E that may be in the separation region SR and may be formed to cover at least the dummy pattern region DPR of the low-density region. As the trimming mask pattern 130 is formed, the plurality of guide-forming holes H11 and the plurality of self-assembled holes H12, which may be formed in the mask pattern 106Q in the dummy pattern region DPR, may be covered by the trimming mask pattern 130, and may not be exposed to the outside.

In some exemplary embodiments, the trimming mask pattern 130 may be a photoresist pattern.

Since the trimming mask pattern 130 is formed so that the edge portion 130E is placed in the separation region SR in which a pattern may not be formed, a trimming margin for forming the trimming mask pattern 130 may be advantageously secured, compared to when forming a pattern having an edge portion which is placed in a region having a relatively dense pattern. Resolution may be improved when performing a photolithography process, and a trimming position may be accurately controlled and a desired trimming process may be easily performed.

Figure 14A:
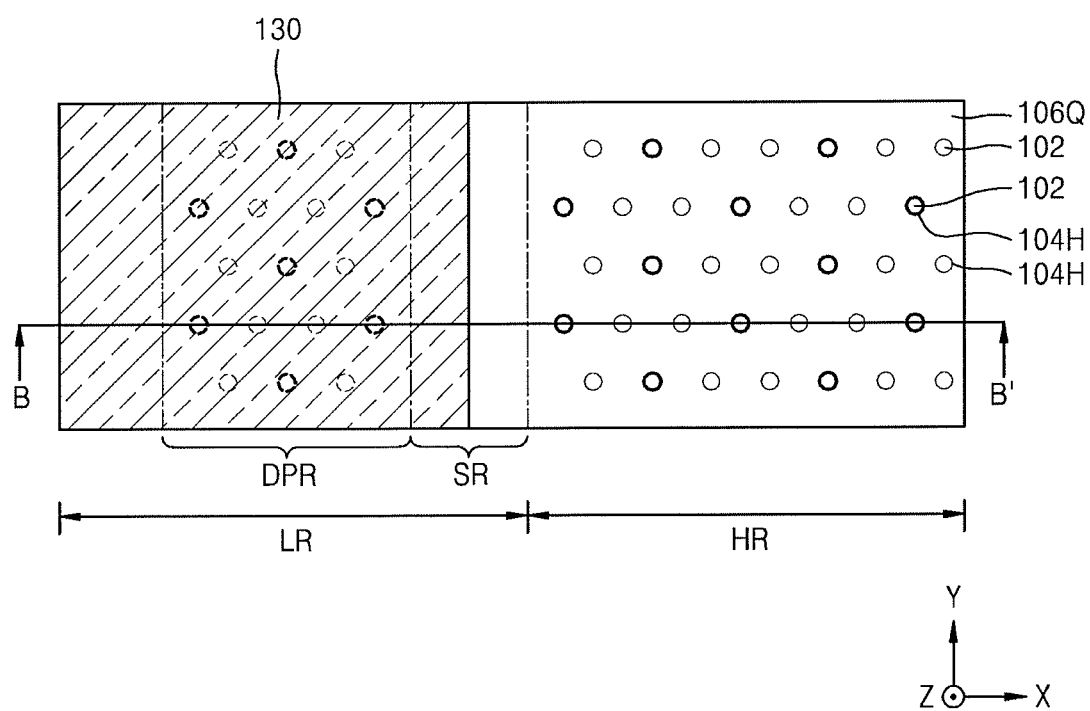
Figure 14B:
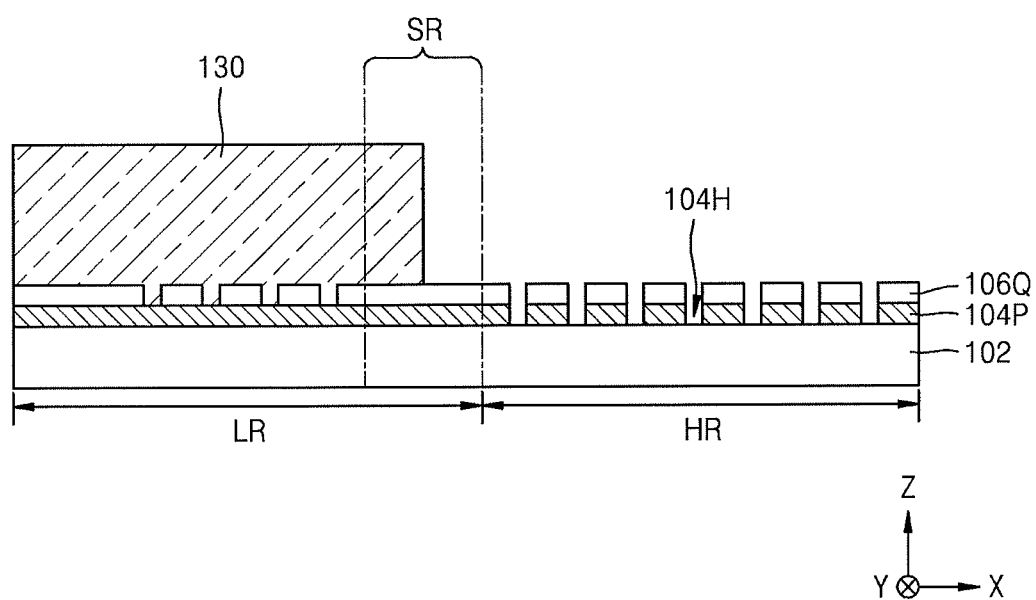

Referring to FIGS. 14A and 14B, a feature pattern 104P, in which a plurality of holes 104H may be formed, in the high-density region HR, may be formed by etching the feature layer 104 in the high-density region HR by using the trimming mask pattern 130 and the first mask pattern 106Q as an etch mask.

While the shapes of guide-forming holes H11 and self-assembled holes H12, which may be formed in the first mask pattern 106P in the high-density region HR, may be transferred to the feature layer 104 to form the plurality of holes 104H, the trimming mask pattern 130 may block the shapes of guide-forming holes H11 and self-assembled holes H12, which may be formed in the first mask pattern 106P in the dummy pattern region DPR of the low-density region LR, from being transferred to the feature layer 104.

Figure 15A:
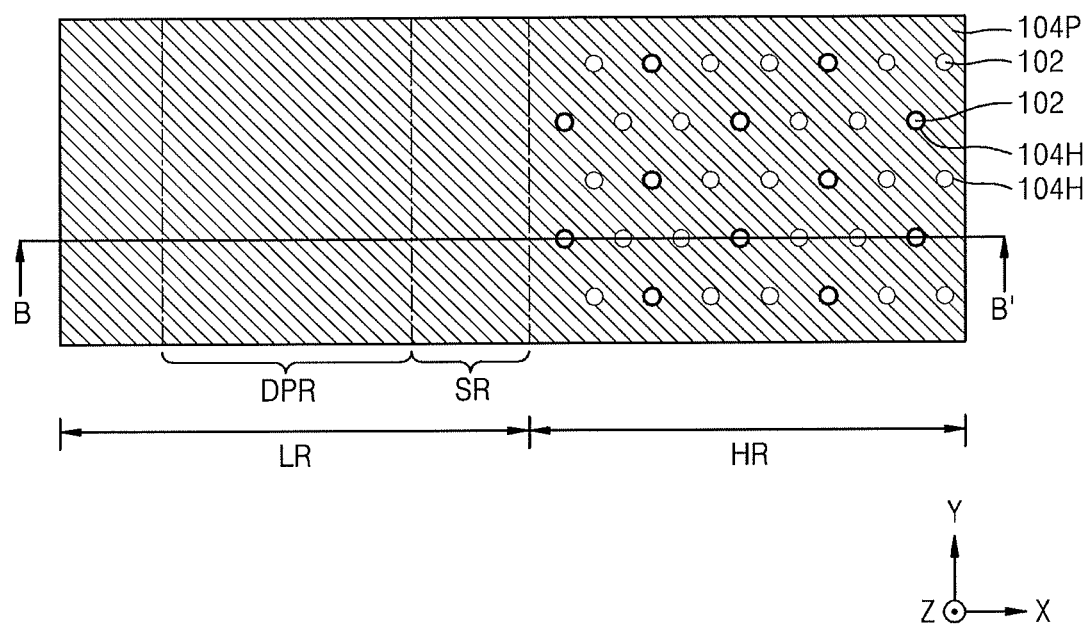
Figure 15B:
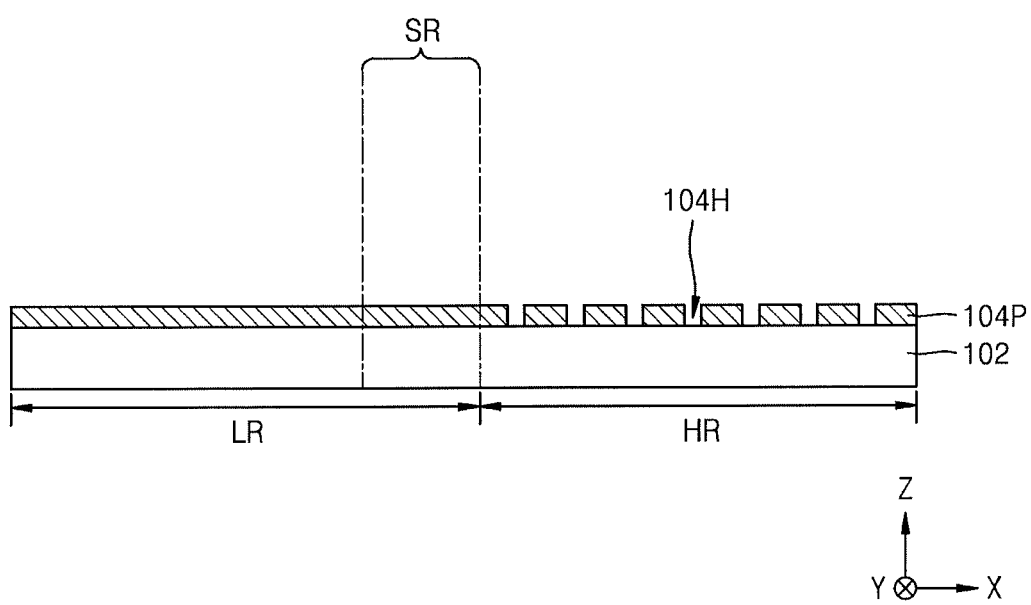

Referring to FIGS. 15A and 15B, the top surface of the feature pattern 104P may be exposed in the high-density region HR and the low-density region LR by removing the trimming mask pattern 130 and the first mask pattern 106Q.

According to the pattern formation method described with reference to FIGS. 1A through 15B, in order to selectively form a pattern in the high-density region HR on the substrate 102 by using the block copolymer layer 120, the block copolymer layer 120 that may have a uniform thickness and a flat top surface from a central portion of the high-density region HR to an edge portion thereof may be formed by forming the plurality of dummy guides DG, which may have the same shape as the plurality of pillar-shaped guides PG that may be formed in the high-density region HR, in the dummy pattern region DPR of the low-density region LR, which may be adjacent to the high-density region HR, and also interposing the separation region SR, which may have a width suitable for providing the block copolymer layer 120 having a flat top surface without an incline plane, between the dummy pattern region DPR of the low-density region LR and the high-density region HR. Accordingly, the uniformity of patterns that may be formed in the high-density region HR may be improved. When forming the trimming mask pattern 130 for blocking patterns formed in the first mask pattern 106Q in the dummy pattern region DPR from being transferred to the feature layer 104, the accuracy of a trimming process may be improved by using the separation region SR as a region for securing a trimming margin.

Figure 16:
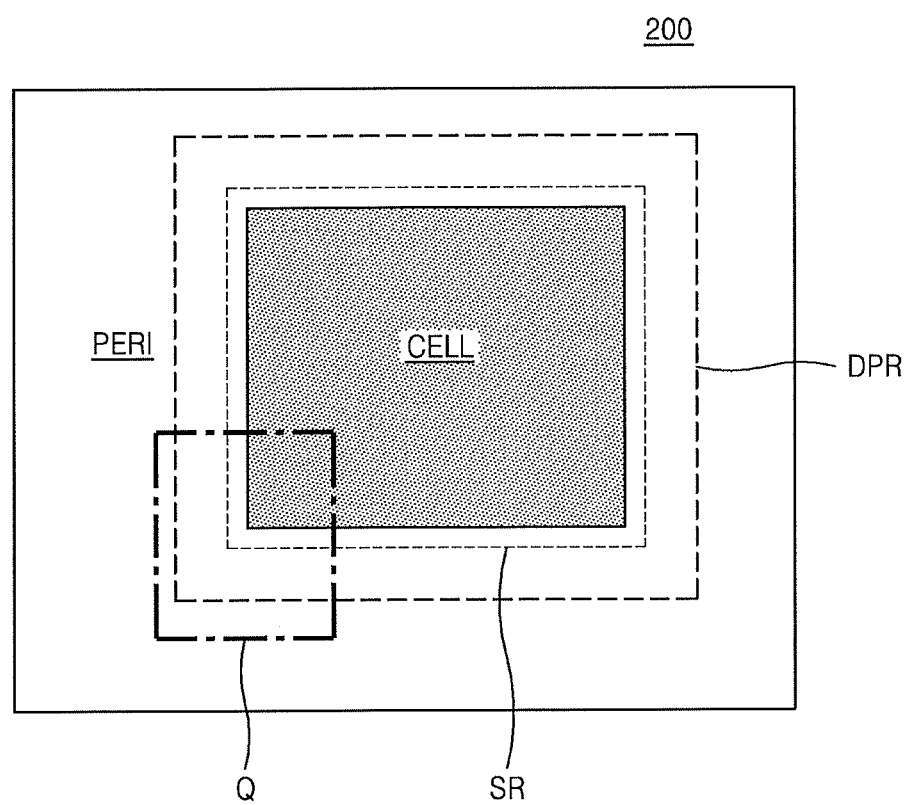
FIG. 16 illustrates a plan view of a configuration of an integrated circuit device according to an exemplary embodiment.

FIG. 16 illustrates a plan view of a configuration of an integrated circuit device 200 according to an exemplary embodiment.

Referring to FIG. 16, the integrated circuit device 200 may include a cell array region CELL and a peripheral circuit region PERI which may have different pattern densities. The cell array region CELL may be a high-density region having a relatively high pattern density, and the peripheral circuit region PERI may be a low-density region having a relatively low pattern density. In some exemplary embodiments, the cell array region CELL may be a cell array region of a semiconductor memory device. For example, a volatile memory cell array, such as dynamic random access memory (DRAM), or a non-volatile memory cell array, such as a flash memory, may be formed in the cell array region CELL. Peripheral circuits electrically connected to cell arrays formed in the cell array region CELL may be formed in the peripheral circuit region PERI. The peripheral circuit region PERI may include a region in which a cell array may not be formed, like a core region. Hereinafter, the term "peripheral circuit region" means a region in which the peripheral circuits are formed or a core region.

The peripheral circuit region PERI may include a separation region (SR) that surrounds the cell array region CELL at a portion adjacent to the cell array region CELL. The peripheral circuit region PERI may include a dummy pattern region DPR spaced apart from the cell array region CELL with the separation region SR interposed therebetween. The dummy pattern region DPR may be defined to have a shape in which the dummy pattern region DPR surrounds the cell array region CELL with the separation region SR interposed therebetween.

In FIG. 16, illustrated is an exemplary embodiment in which the cell array region CELL is surrounded by the peripheral circuit region PERI. The cell array region CELL and the peripheral circuit region PERI may be appropriately disposed according to need.

Figure 17A:
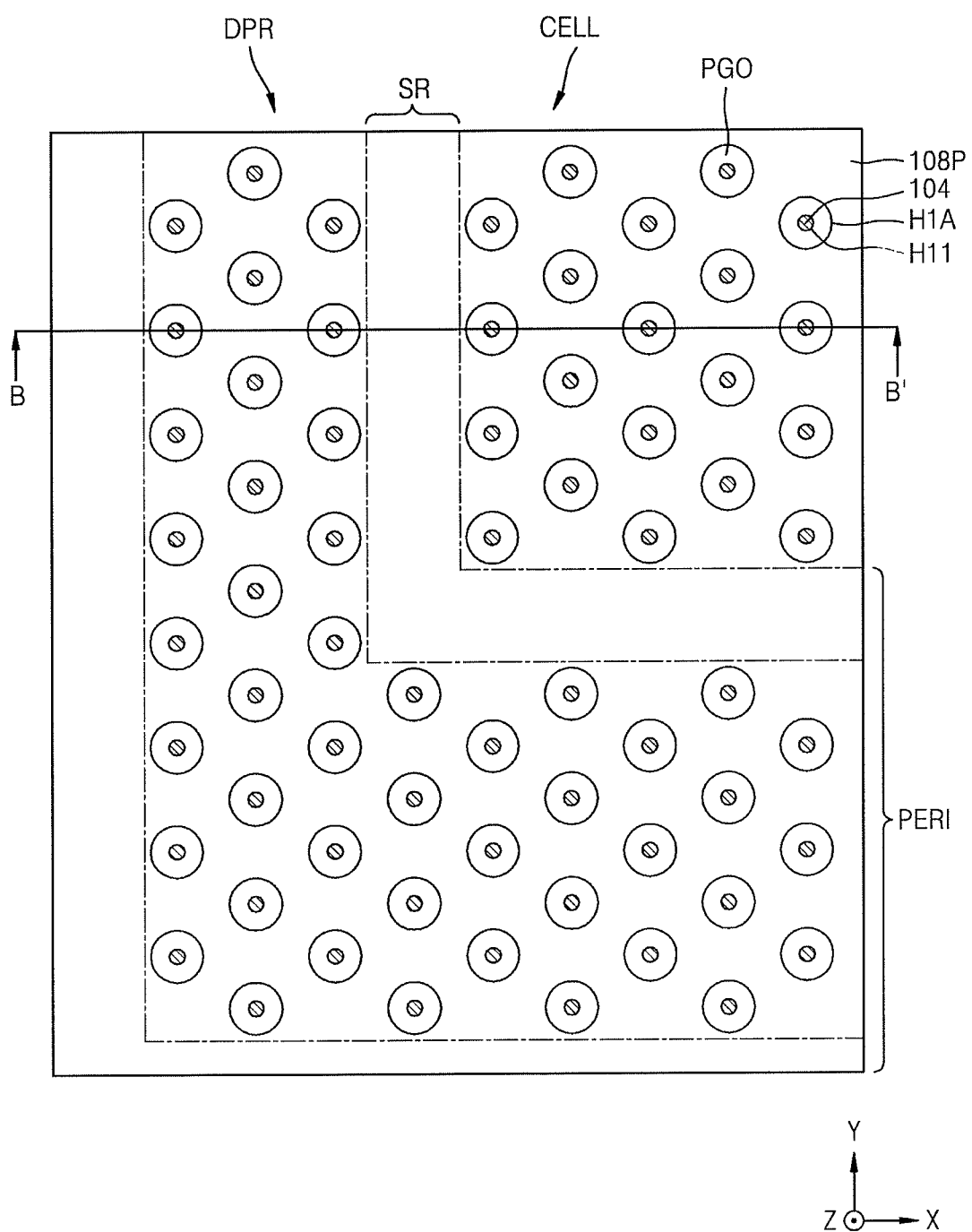
Figure 17B:
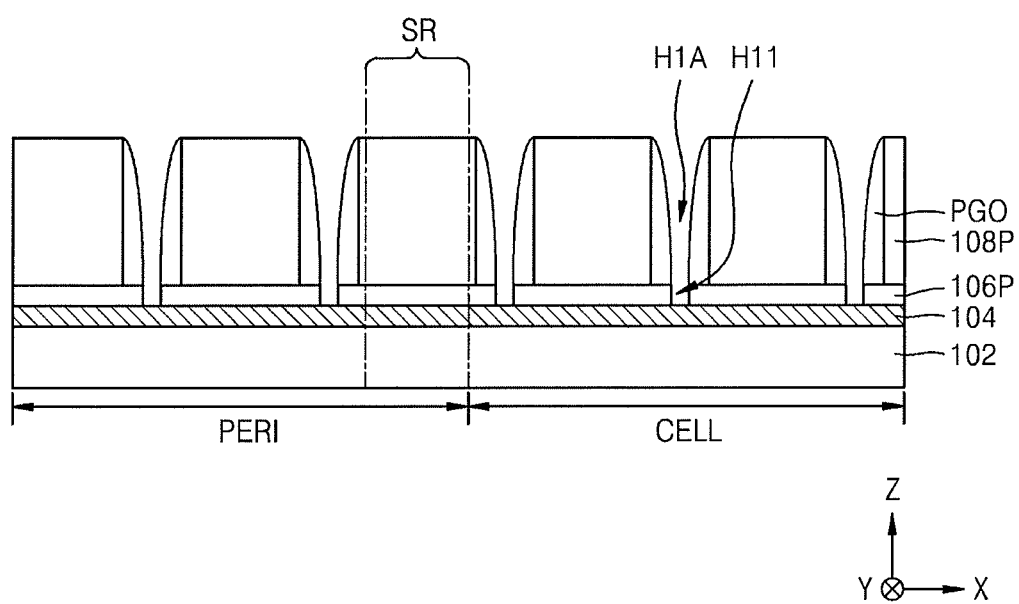

FIGS. 17A and 17B through FIGS. 24A and 24B sequentially illustrate views of a method of manufacturing an integrated circuit device, according to an exemplary embodiment. FIGS. 17A, 18A, . . . , 24A illustrate plan views of exemplary structures of a part corresponding to a region indicated by a dashed line Q in the integrated circuit device 200 of FIG. 16. FIGS. 17B, 18B, . . . , 24B illustrate cross-sectional views taken along a line B-B' of FIGS. 17A, 18A, . . . , 24A. In FIGS. 17A through 24B, the same elements as those in FIGS. 1A through 15B are denoted by the same reference numerals, and detailed descriptions thereof will not be given.

Referring to FIGS. 17A and 17B, similarly to that described with reference to FIGS. 1A through 4B, a feature layer 104 may be formed on a substrate 102 having a cell array region CELL and a peripheral circuit region PERI, and a first mask pattern 106P having a plurality of first holes H11 formed therein may be formed on the feature layer 104.

The plurality of first holes H11 formed in the first mask pattern 106P may be formed to communicate with a plurality of guide-forming holes H1A that pass through a second mask pattern 108P and a plurality of pillar-shaped guide outer wall portions PGO in the cell array region CELL and the peripheral circuit region PERI.

Figure 18A:
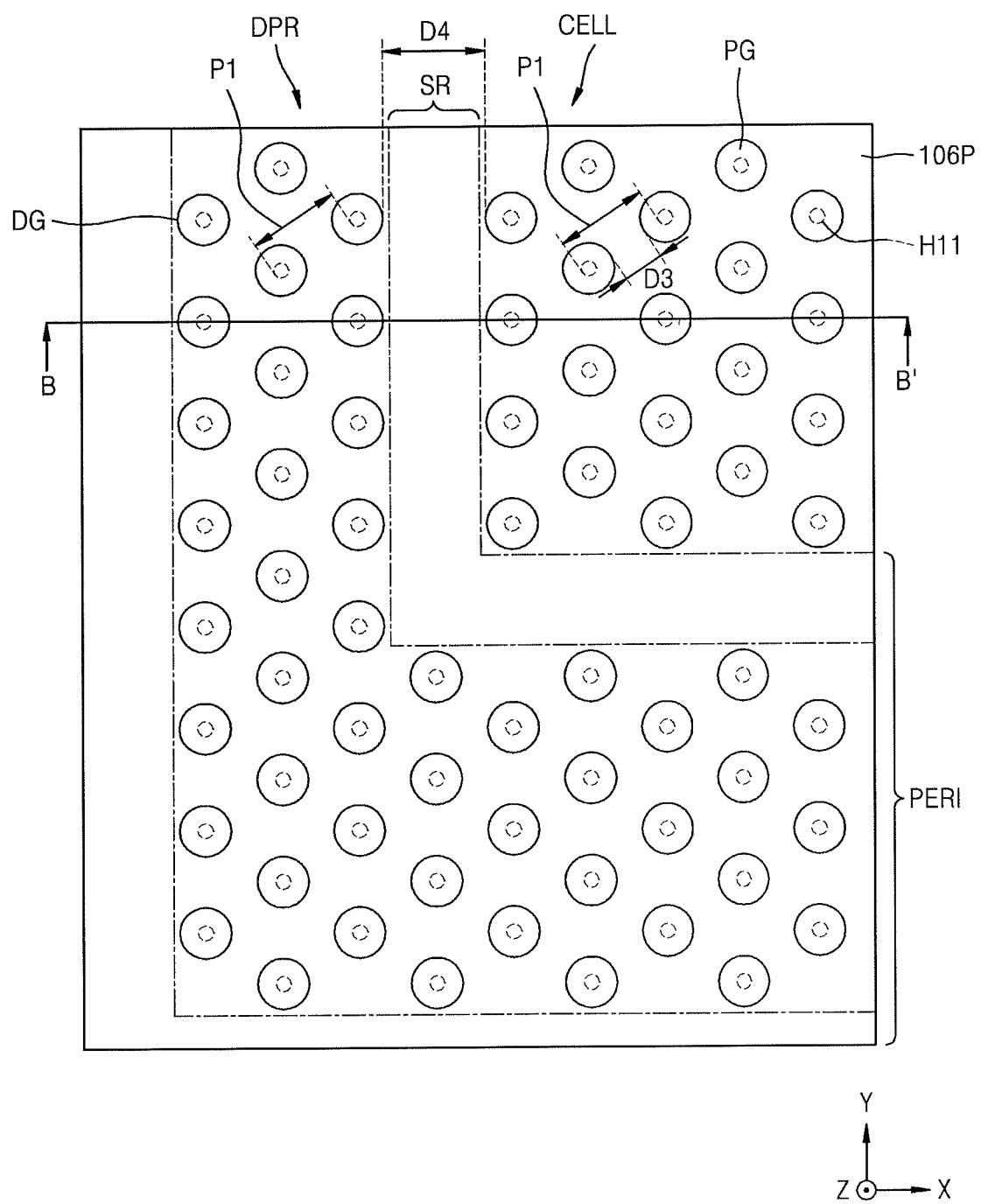
Figure 18B:
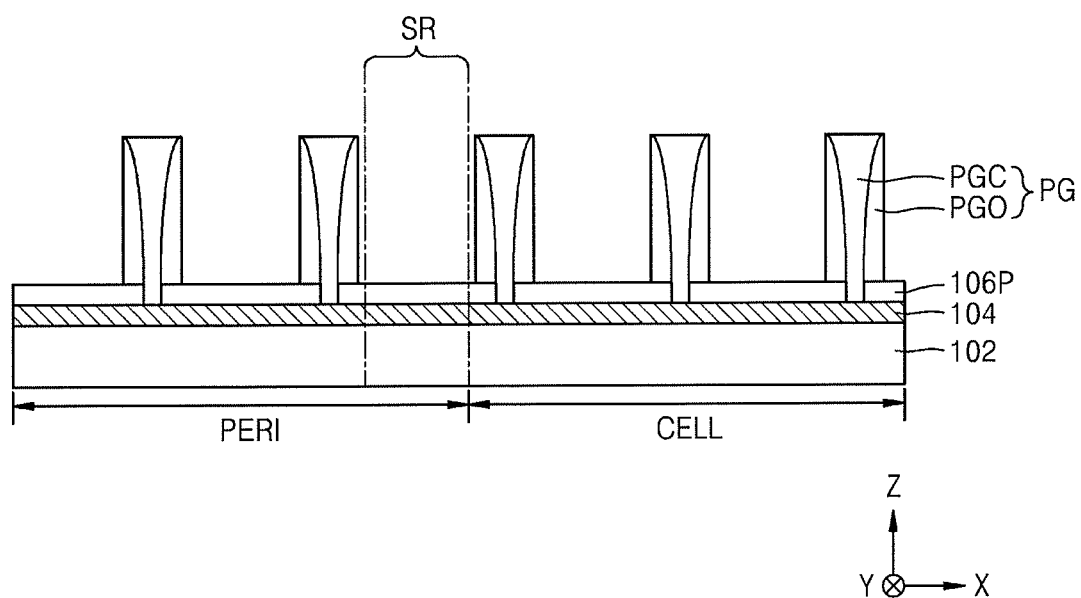

Referring to FIGS. 18A and 18B, similarly to that described with reference to FIGS. 5A through 6B, a plurality of pillar-shaped guides PG, which may include a plurality of pillar cores PGC and the plurality of pillar-shaped guide outer wall portions PGO, may be formed in the cell array region CELL and the peripheral circuit region PERI. The plurality of pillar cores PGC may fill the plurality of first holes H11 and the plurality of guide-forming holes H1A (see FIGS. 17A and 17B), which may be formed in the first mask pattern 106P, and the plurality of pillar-shaped guide outer wall portions PGO may surround the plurality of pillar cores PGC on the first mask pattern 106P. A top surface of the first mask pattern 106P and top surfaces and sidewalls of the plurality of pillar-shaped guides PG may be exposed by removing the second mask pattern 108P (see FIGS. 17A and 17B) from the cell array region CELL and the peripheral circuit region PERI.

A plurality of pillar-shaped guides PG that may be formed in a dummy pattern region DPR of the peripheral circuit region PERI from among the plurality of pillar-shaped guides PG may form a plurality of dummy guides DG.

The plurality of dummy guides DG may be spaced apart from the plurality of pillar-shaped guides PG that may be formed in the cell array region CELL with a separation region SR interposed therebetween. A separation distance D4 between the plurality of pillar-shaped guides PG that may be formed in the cell array region CELL and the plurality of dummy guides DG that may be formed in the dummy pattern region DPR may be greater than a separation distance D3 between each two pillar-shaped guides PG that may be formed in the cell array region CELL.

In the cell array region CELL and the dummy pattern region DPR of the peripheral circuit region PERI, the plurality of pillar-shaped guides PG may be formed to be arranged in a hexagonal array having a first pitch P1. Accordingly, the plurality of pillar cores PGC that may form the plurality of pillar-shaped guides PG may also be formed to be arranged in a hexagonal array having the first pitch P1.

Figure 19A:
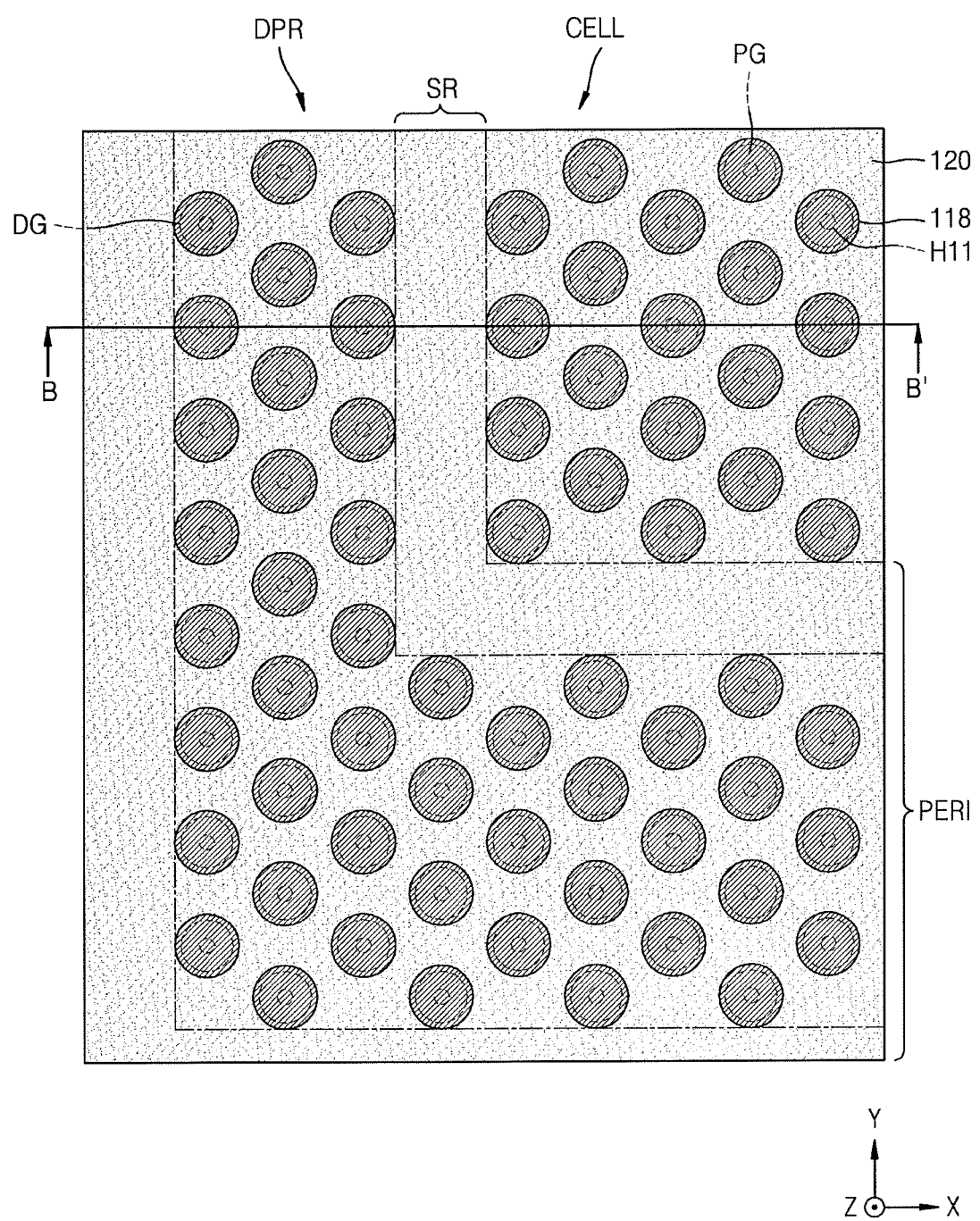
Figure 19B:
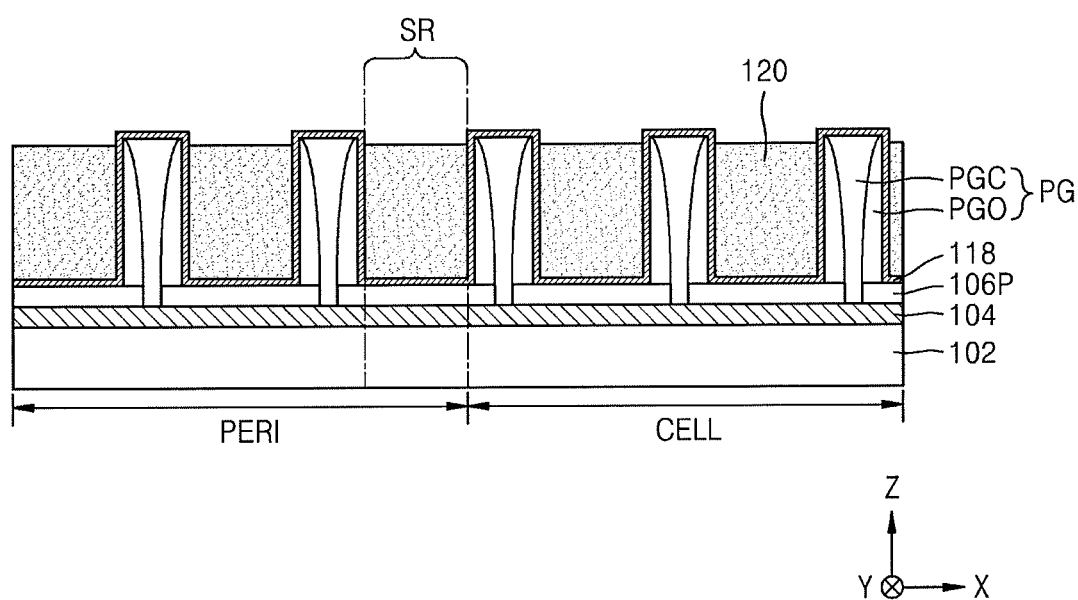

Referring to FIGS. 19A and 19B, similarly to that described with reference to FIGS. 7A through 8B, a brush liner 118 that may cover an exposed surface of the first mask pattern 106P and exposed top surfaces and sidewalls of the plurality of pillar-shaped guides PG may be formed in the cell array region CELL and the peripheral circuit region PERI, and a block copolymer layer 120 may be formed around the plurality of pillar-shaped guides PG on the first mask pattern 106P that may be covered with the brush liner 118.

Figure 20A:
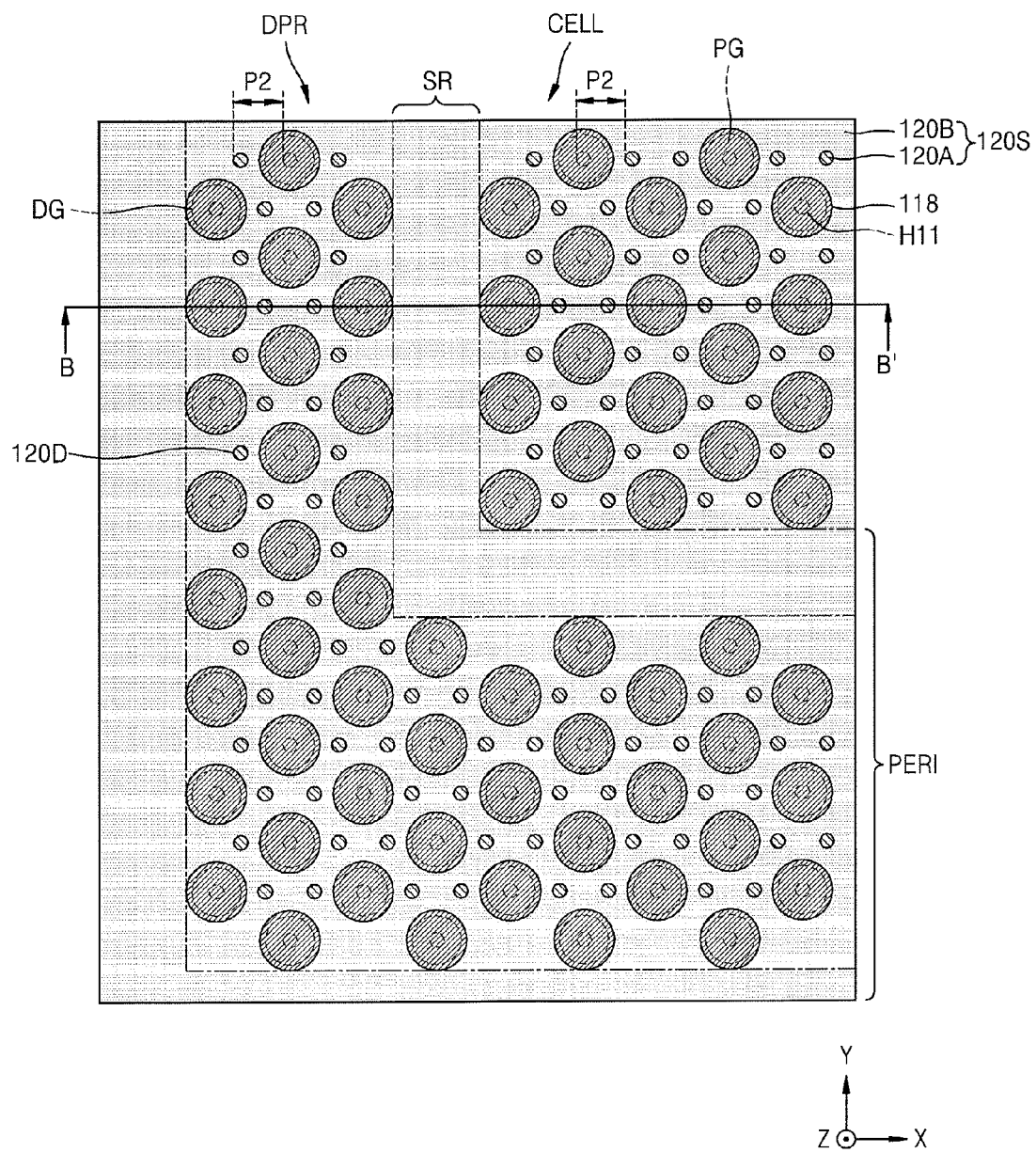
Figure 20B:
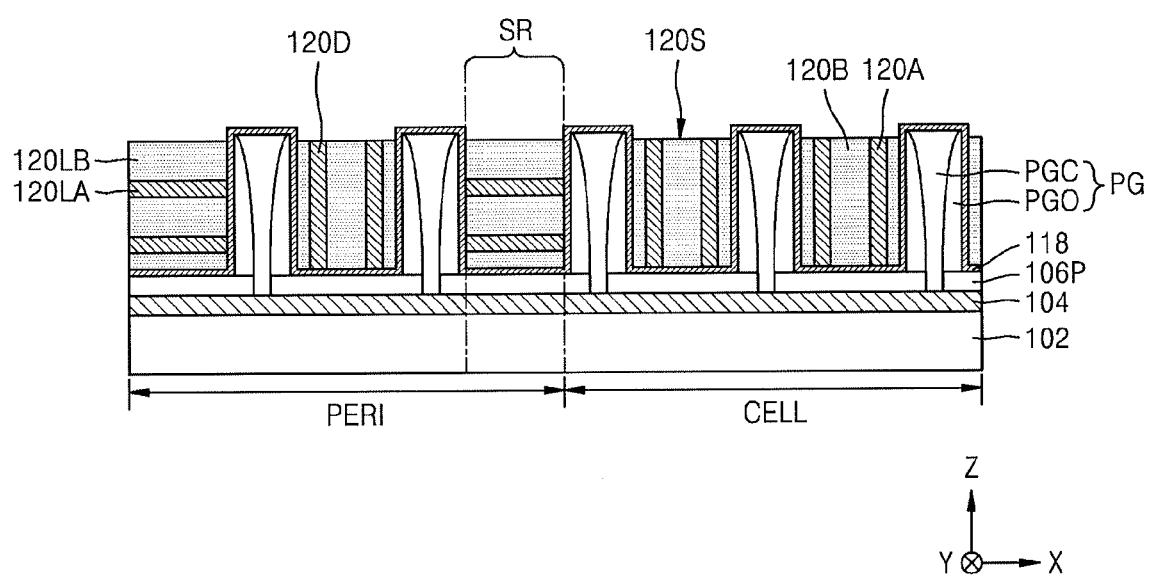

Referring to FIGS. 20A and 20B, similarly to that described with reference to FIGS. 9A through 9B, a self-assembled layer 120S may be formed by phase-separating the block copolymer layer 120 (see FIGS. 19A and 19B) in the cell array region CELL and the peripheral circuit region PERI.

In the self-assembled layer 120S, a plurality of first domains 120A and a plurality of first dummy domains 120D may be regularly arranged along with the plurality of pillar-shaped guides PG. For example, in the cell array region CELL, a hexagonal array having a second pitch P2 that may be less than the first pitch P1 (see FIG. 18A) may be achieved due to, for example, the plurality of pillar cores PGC of the plurality of pillar-shaped guides PG and the plurality of first domains 120A. In the dummy pattern region DPR of the peripheral circuit region PERI, a hexagonal array having the second pitch P2 that may be less than the first pitch P1 (see FIG. 18A) may be achieved due to, for example, the plurality of pillar cores PGC of the plurality of pillar-shaped guides PG and the plurality of first dummy domains 120D, which may form the dummy guides DG.

Figure 21A:
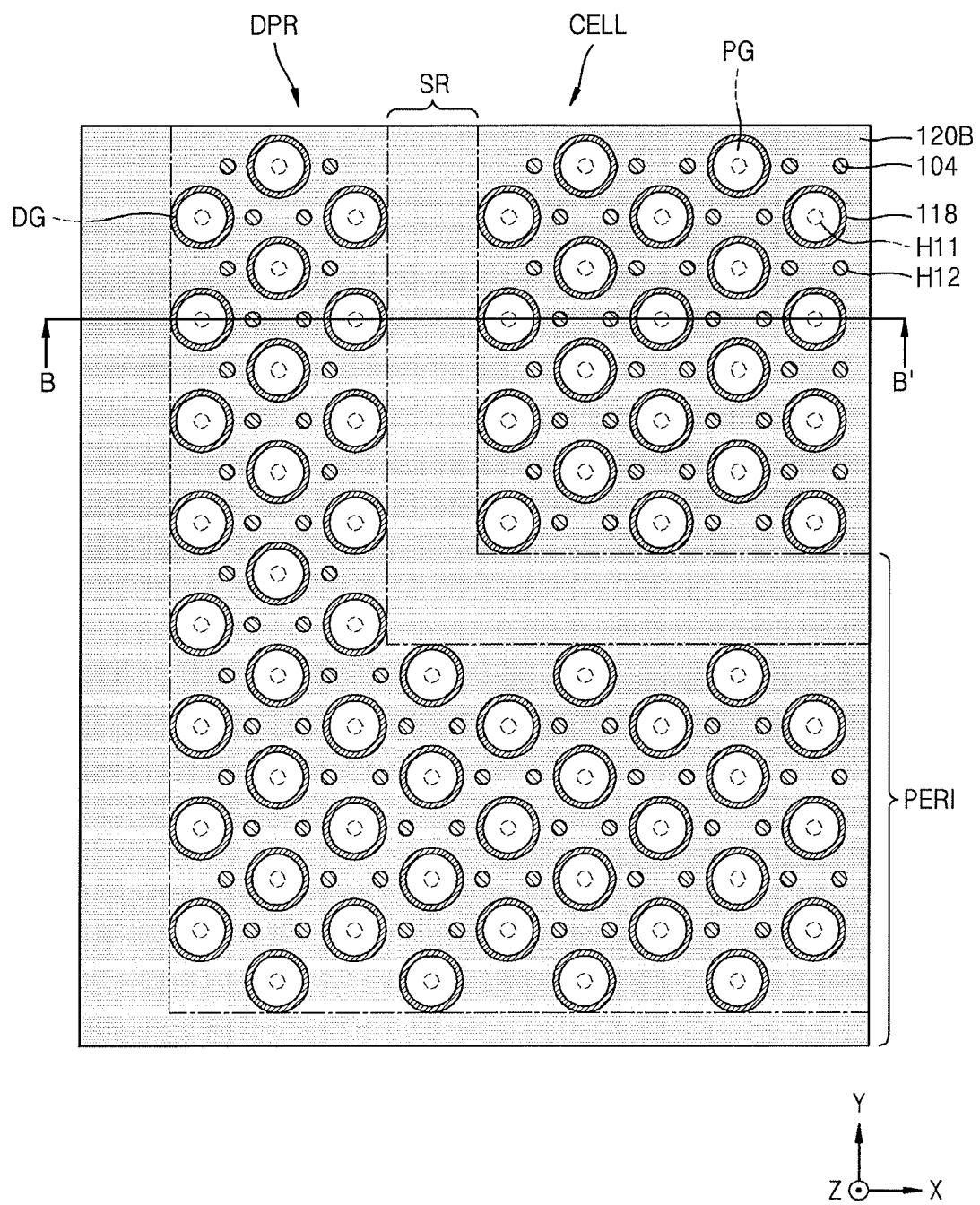
Figure 21B:
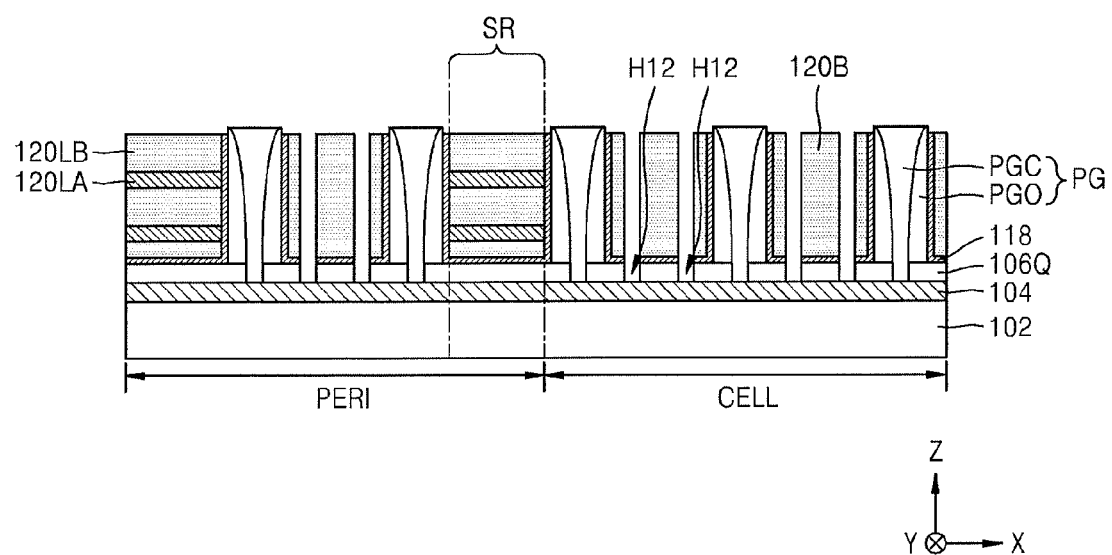

Referring to FIGS. 21A and 21B, similarly to that described with reference to FIGS. 10A through 10B, the plurality of first domains 120A and the plurality of first dummy domains 120D may be removed from the self-assembled layer 120S (see FIGS. 20A and 20B) in the cell array region CELL and the peripheral circuit region PERI, and then similarly to that described with reference to FIGS. 11A through 11B, a first mask pattern 106Q, in which a plurality of self-assembled holes H12 corresponding to the plurality of first domains 120A and the plurality of first dummy domains 120D may be formed, may be formed in the cell array region CELL and the peripheral region PERI.

Figure 22A:
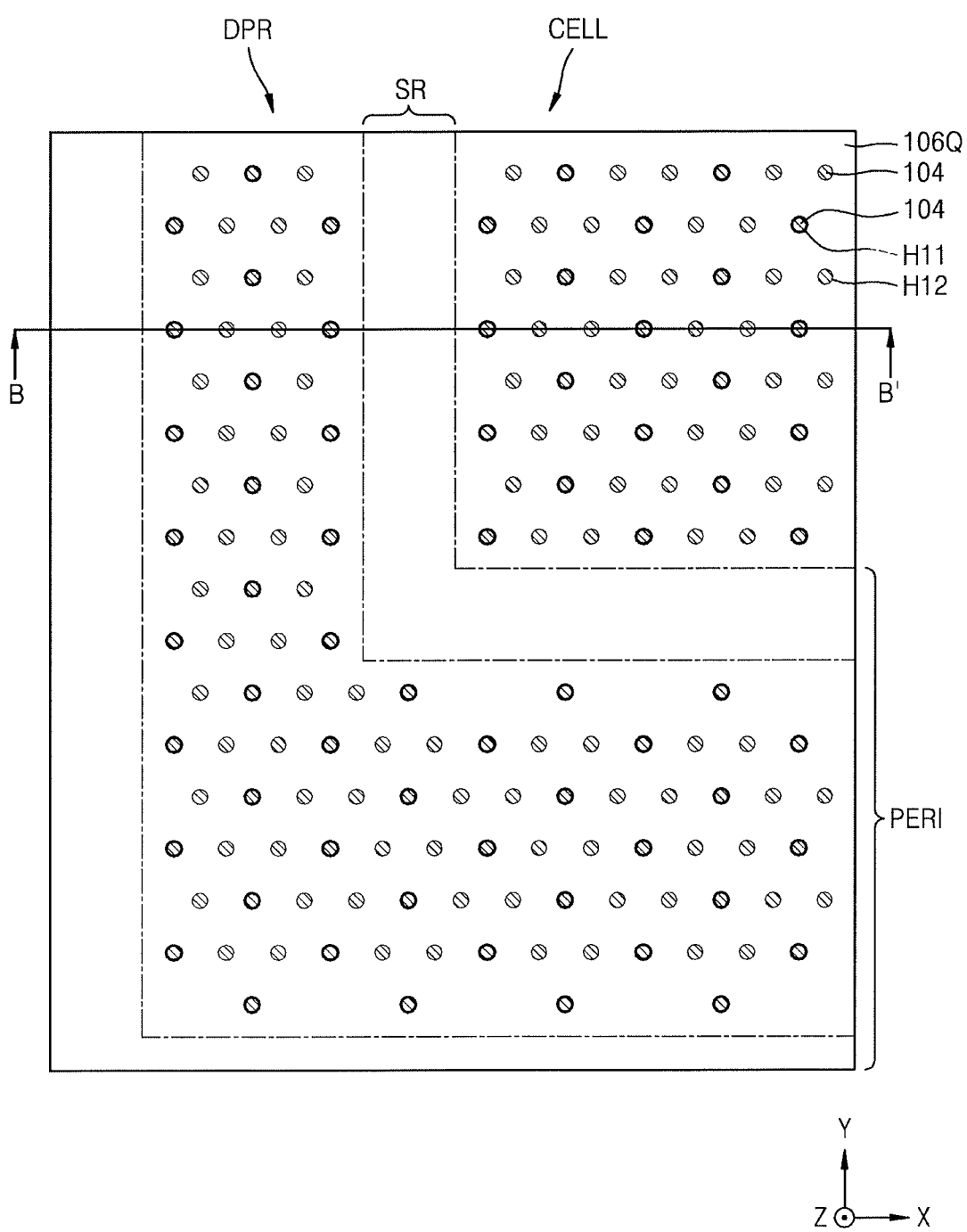
Figure 22B:
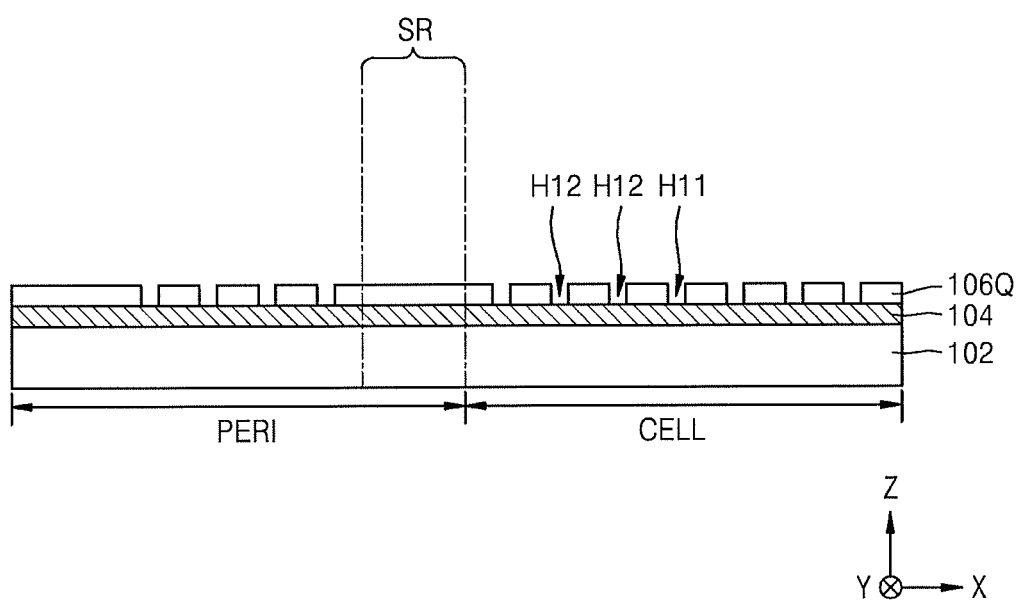

Referring to FIGS. 22A and 22B, similarly to that described with reference to FIGS. 12A through 12B, a top surface of the first mask pattern 106Q may be exposed by removing the plurality of pillar-shaped guides PG, the brush liner 118, and the second domain 120B, which may remain on the first mask pattern 106Q in the cell array region CELL and the peripheral circuit region PER.

Figure 23A:
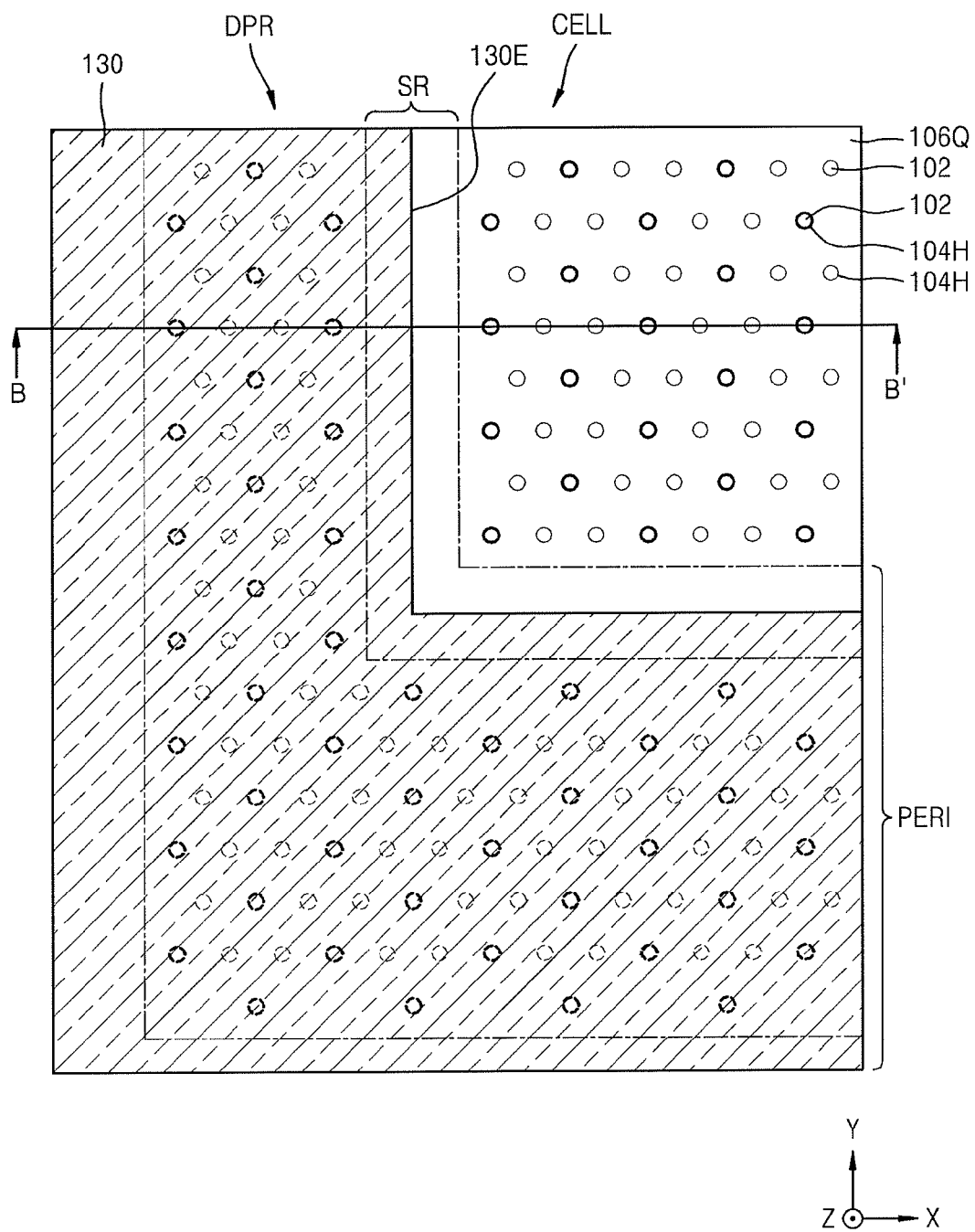
Figure 23B:
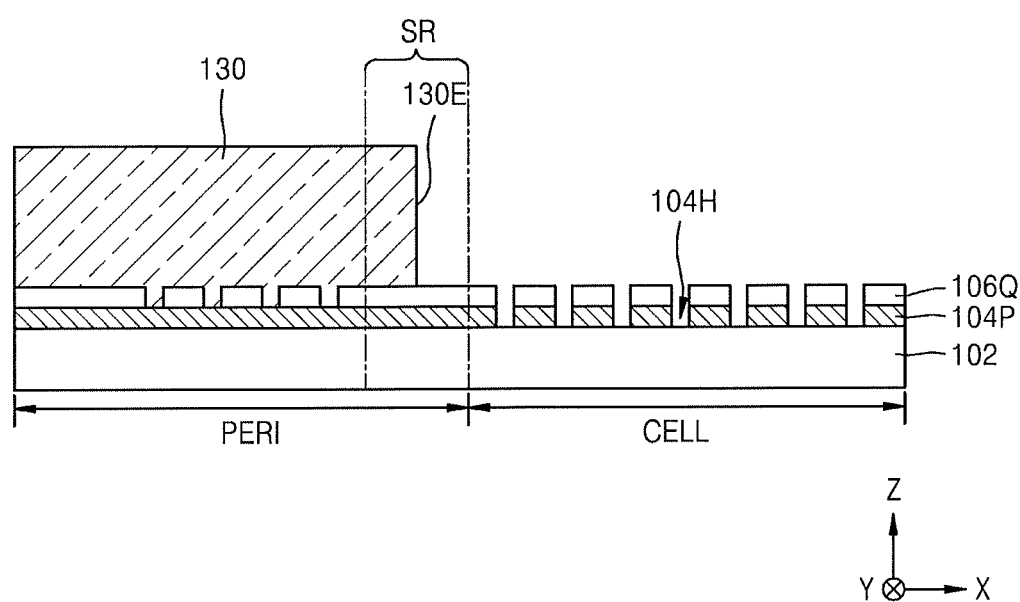

Referring to FIGS. 23A and 23B, similarly to that described with reference to FIGS. 13A through 13B, a trimming mask pattern 130 that may cover a portion of the first mask pattern 106Q may be formed in the peripheral circuit region PERI, and then a feature pattern 104P having a plurality of holes 104H may be formed in the cell array region CELL by etching the feature layer 104 by using the trimming mask pattern 130 and the first mask pattern 106P as an etch mask.

While the plurality of holes 104H may be formed in the cell array region CELL, the feature layer 104 may be protected by the trimming mask pattern 130 in the peripheral circuit region PERI, and the shapes of the guide-forming holes H11 and the self-assembled holes H12, that may be formed in the first mask pattern 106Q, may be blocked from being transferred to the feature layer 104.

Figure 24A:
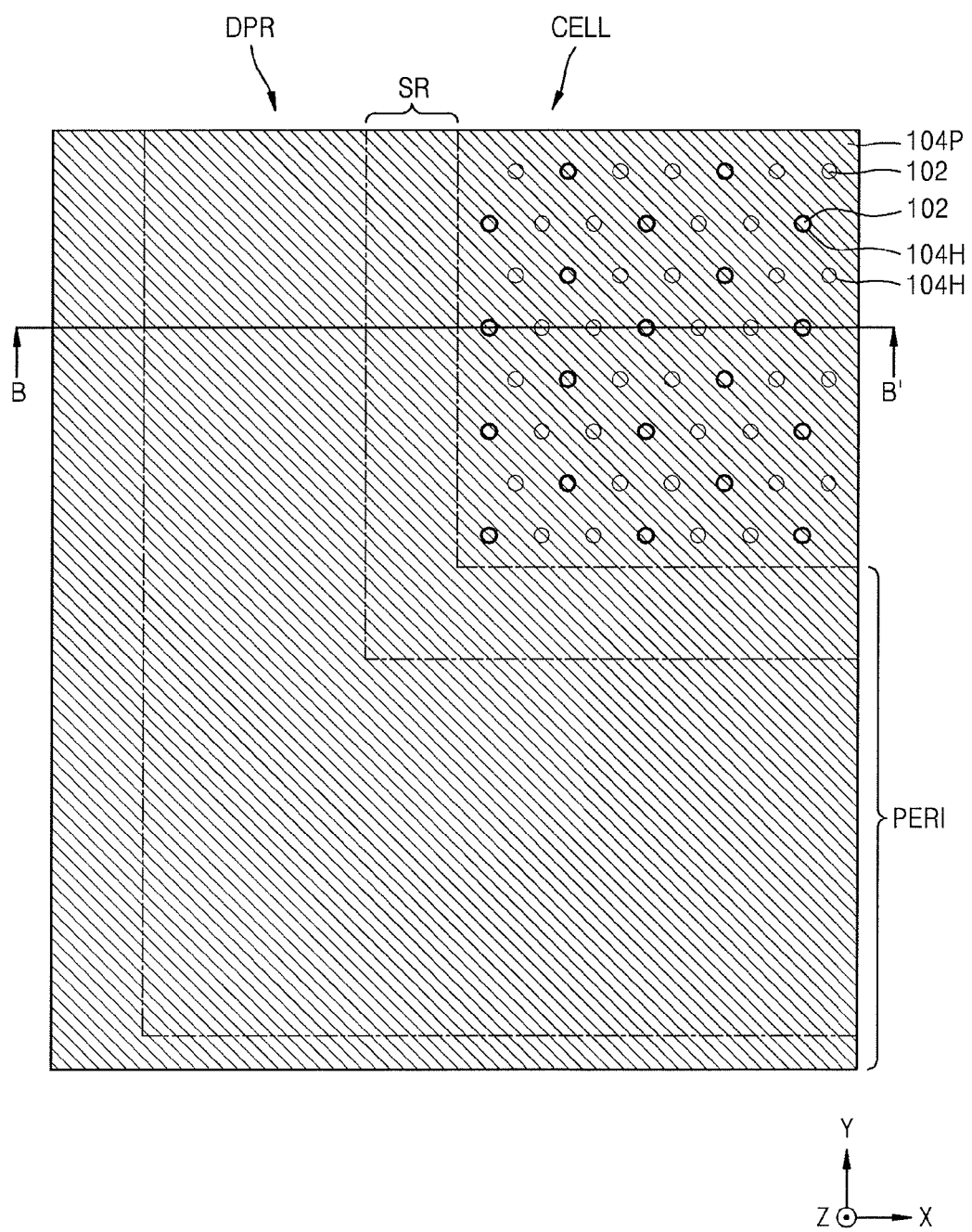
Figure 24B:
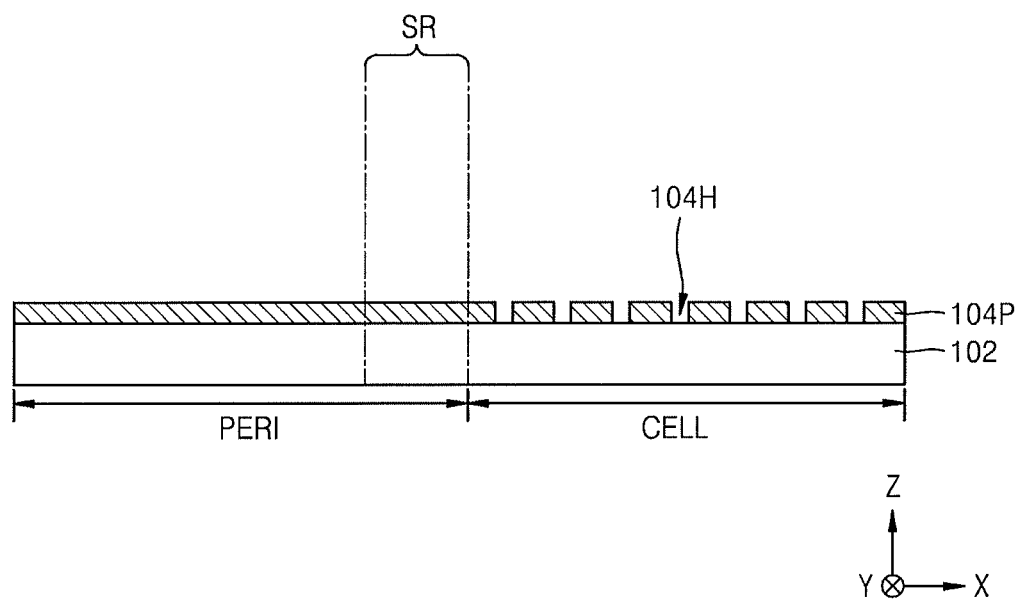

Referring to FIGS. 24A and 24B, similarly to that described with reference to FIGS. 15A through 15B, a top surface of the feature pattern 104P may be exposed in the cell array region CELL and the peripheral circuit region PERI by removing the trimming mask pattern 130 and the first mask pattern 106Q.

According to the pattern formation method described with reference to FIGS. 17A through 24B, in order to selectively form a pattern in the cell array region CELL on the substrate 102 by using the block copolymer layer 120, the block copolymer layer 120 that may have a uniform thickness and a flat top surface from a central portion of the cell array region CELL to an edge portion thereof may be formed by forming the plurality of dummy guides DG, which may have the same shape as the plurality of pillar-shaped guides PG that may be formed in the cell array region CELL, in the dummy pattern region DPR of the peripheral circuit region PERI, which may be adjacent to the cell array region CELL, and also interposing the separation region SR, which may have a width suitable for providing the block copolymer layer 120 having a flat top surface without an incline plane, between the dummy pattern region DPR of the peripheral circuit region PERI and the cell array region CELL. Accordingly, the uniformity of patterns that may be formed in the cell array region CELL may be improved. When forming the trimming mask pattern 130 for blocking patterns formed in the first mask pattern 106Q in the dummy pattern region DPR from being transferred to the feature layer 104, the accuracy of a trimming process may be improved by using the separation region SR as a region for securing a trimming margin.

Figure 25:
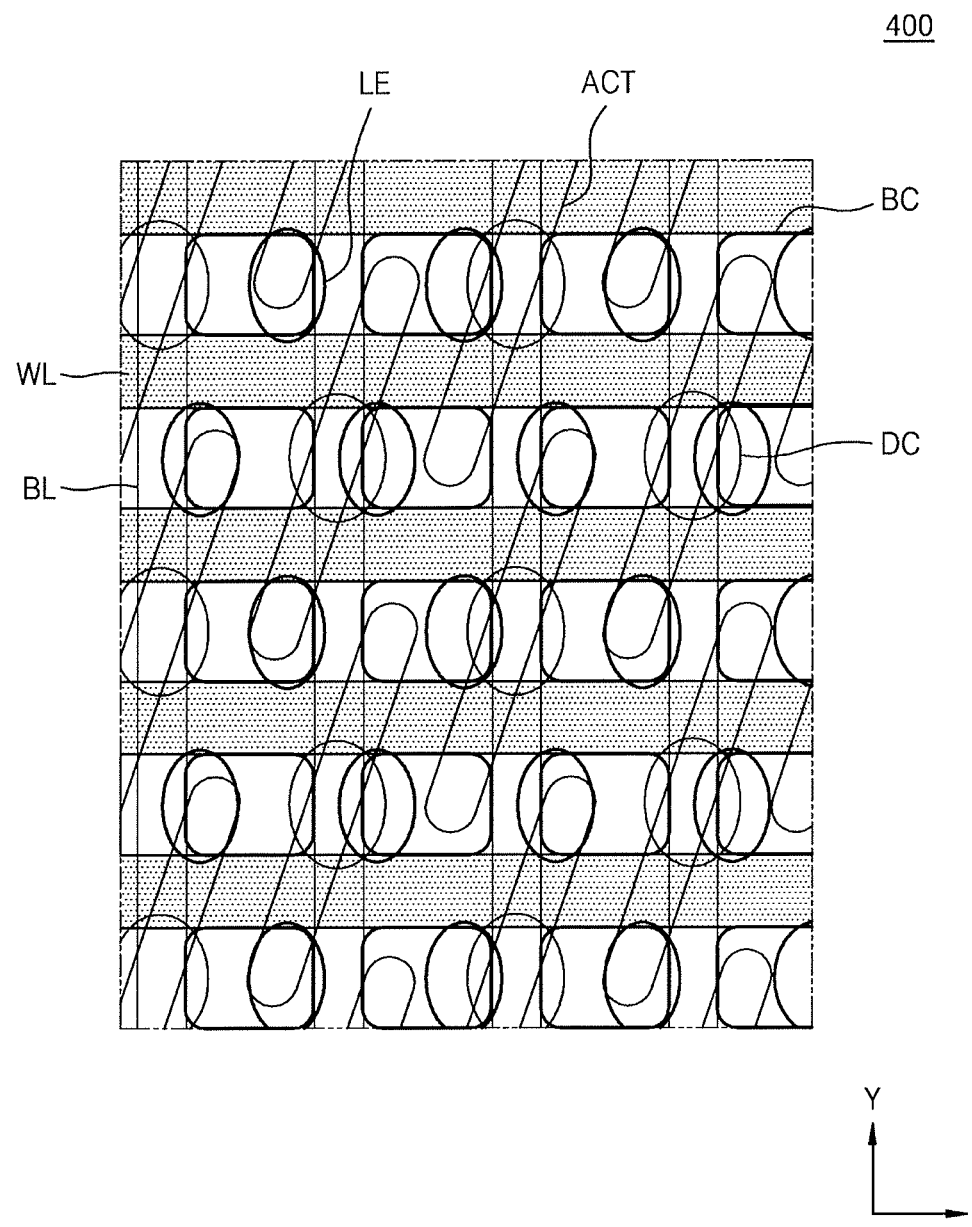
FIG. 25 illustrates a plan layout of main elements of a cell array region of an integrated circuit device that may be implemented by using an integrated circuit device manufacturing method according to an exemplary embodiment.

FIG. 25 illustrates a plan layout of main elements of a cell array region of an integrated circuit device 400 that may be implemented by using the integrated circuit device manufacturing method according to the exemplary embodiment.

Referring to FIG. 25, the integrated circuit device 400 may include a plurality of active regions ACT. The plurality of active regions ACT may be arranged in a diagonal direction with respect to a first direction (X direction) and a second direction (Y direction).

A plurality of word lines WL may extend parallel to one another in the first direction across the plurality of active regions ACT. A plurality of bit lines BL may extend parallel to one another on the plurality of word lines WL in the second direction that is perpendicular to the first direction.

The plurality of bit lines BL may be connected to the plurality of active regions ACT via a plurality of direct contacts DC.

In some exemplary embodiments, a plurality of buried contacts BC may be formed between adjacent two adjacent bit lines BL of the plurality of bit lines BL. Each of the plurality of buried contacts BC may extend up to an upper portion of any one of the two adjacent bit lines BL. In some exemplary embodiments, the plurality of buried contacts BC may be arranged in a line in the first direction and the second direction.

A plurality of lower electrodes LE may be formed on the plurality of buried contacts BC. The plurality of lower electrodes LE may be connected to the active regions ACT via the plurality of buried contacts BC.

FIGS. 26A through 26H sequentially illustrate cross-sectional views of a method of forming the plurality of lower electrodes LE of the integrated circuit device 400 shown in FIG. 25, according to the integrated circuit device manufacturing method according to the exemplary embodiment. In FIGS. 26A through 26H, the same elements as those in FIGS. 1A through 24B are denoted by the same reference numerals, and detailed descriptions thereof will not be given.

Figure 26A:
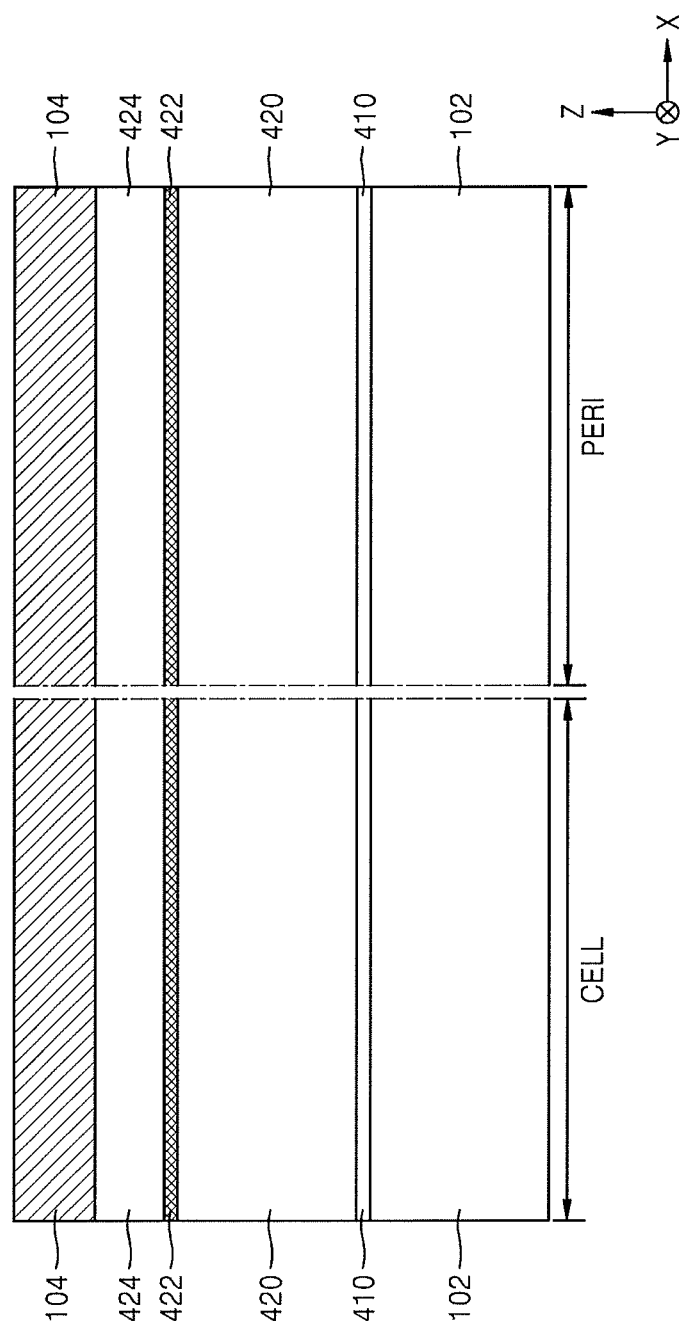

Referring to FIG. 26A, an etch stop layer 410, a mold layer 420, a supporting layer 422, and a sacrificial layer 424 may sequentially be formed on a substrate 102 including a cell array region CELL and a peripheral circuit region PERI, and a feature layer 104 may be formed on the sacrificial layer 424.

In the cell array region CELL, a plurality of active regions ACT (see FIG. 14) and a plurality of conductive regions may be formed in the substrate 102.

In some exemplary embodiments, the etch stop layer 410 may include silicon nitride, silicon oxynitride, or a combination thereof. The mold layer 420 may include silicon oxide. The supporting layer 422 may include silicon nitride, silicon carbonitride, tantalum oxide, titanium oxide, or a combination thereof. The sacrificial layer 424 may include borophosphosilicate glass (BPSG), phosphosilicate glass (PSG), undoped silicate glass (USG), spin on dielectric (SOD), or an oxide film such as a high density plasma (HDP) oxide film. The above-stated constituent materials of the layers, namely, the etch stop layer 410, the mold layer 420, the supporting layer 422, and the sacrificial layer 424, are only examples. In the current embodiment, one supporting layer 422 is disposed on the mold layer 420. In an embodiment, at least one supporting layer may be further disposed between the mold layer 420 and the supporting layer 422.

The feature layer 104 may include at least one layer that may be used as an etch mask for patterning the etch stop layer 410, the mold layer 420, the supporting layer 422, and the sacrificial layer 424. For example, the feature layer 104 may include a polysilicon film, a silicon oxide film, a SiCN film, a carbon-containing film including a spin-on hardmask (SOH) material, or a combination thereof. The carbon-containing film including the SOH material may include an organic compound having a relatively high carbon content of about 85 wt % to about 99 wt % based on the total weight thereof. The organic compound may include a hydrocarbon compound including an aromatic ring, such as phenyl, benzene, or naphthalene, or a derivative of the hydrocarbon compound.

Figure 26B:
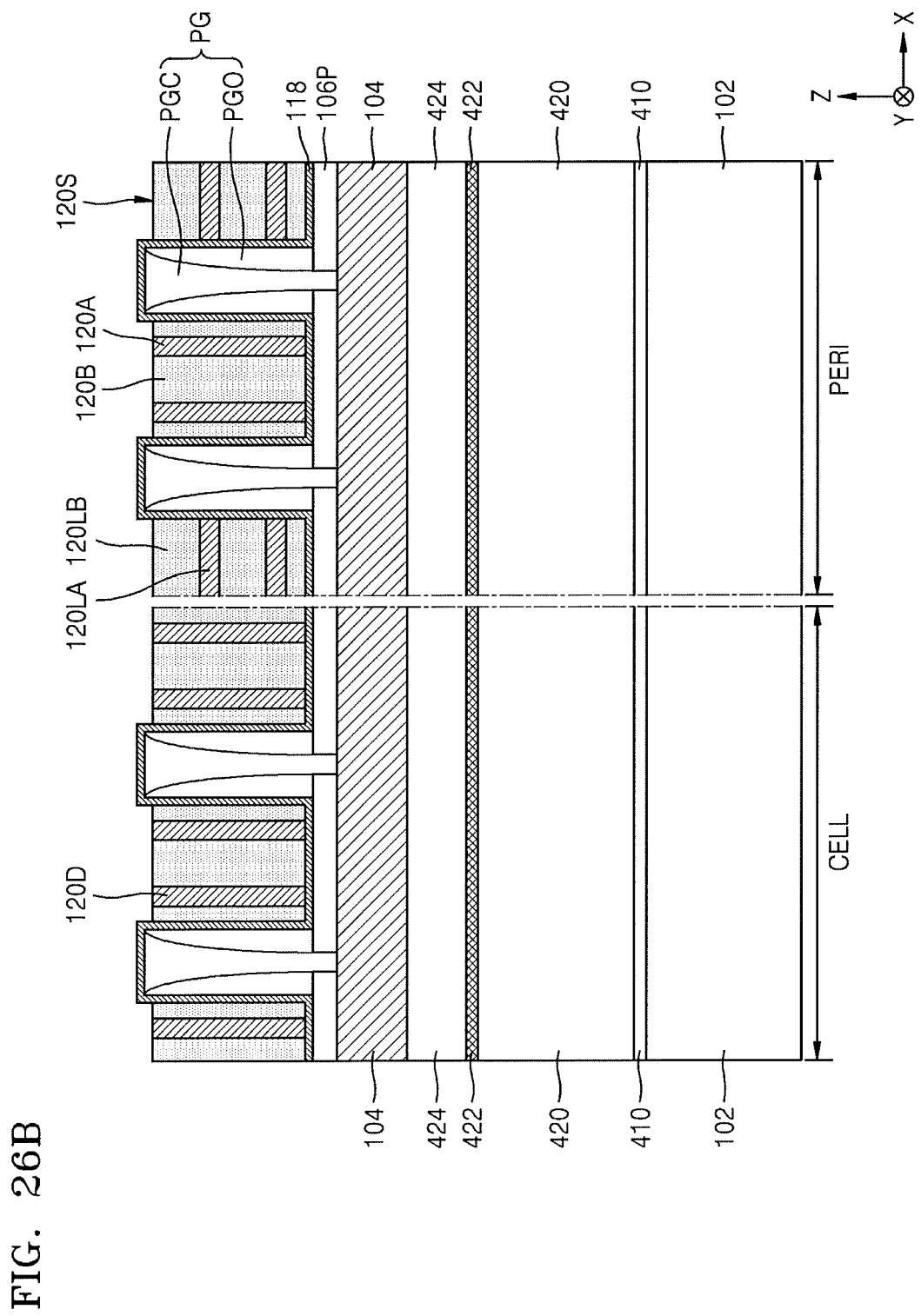

Referring to FIG. 26B, by performing processes described with reference to FIGS. 1A through 9B, a first mask pattern 106P, a plurality of pillar-shaped guides PG, a brush liner 118, and a self-assembled layer 120S may be formed on the feature layer 104 in the cell array region CELL and the peripheral circuit region PERI.

The self-assembled layer 120S may include a plurality of first domains 120A that may be formed in the cell array region CELL and may include a first polymer block, a plurality of first dummy domains 120D that may be formed in the peripheral circuit region PERI and may include the first polymer block, and a second domain 120B that may be formed in the cell array region CELL and the peripheral circuit region PERI and may include a second polymer block. The second domain 120B may be vertically oriented to surround the plurality of pillar-shaped guides PG, the plurality of first domains 120A, and the plurality of first dummy domains 120D in the cell array region CELL and the peripheral circuit region PERI.

Figure 26C:
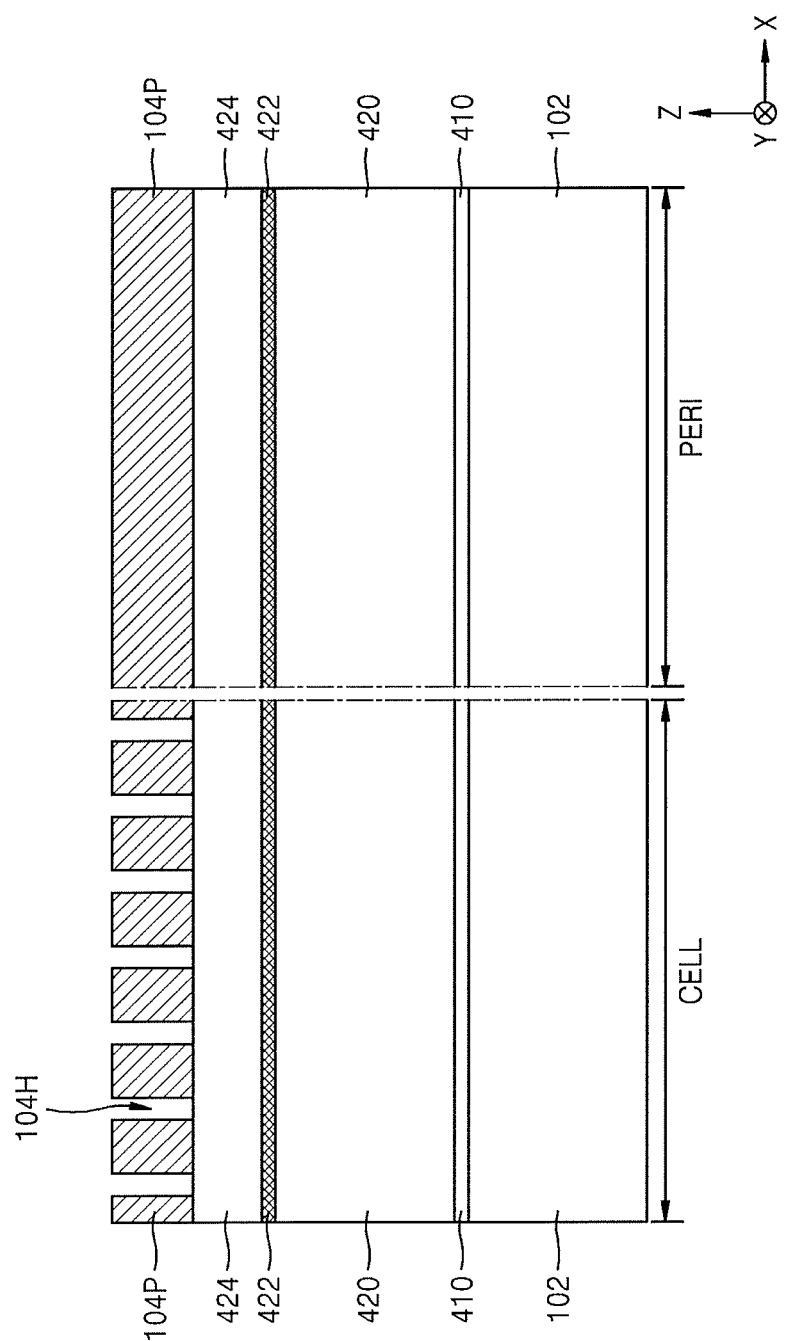

Referring to FIG. 26C, similarly to that described with reference to FIGS. 10A and 10B, the plurality of first domains 120A and the plurality of first dummy domains 120D may be removed from the self-assembled layer 130S in the resultant structure of FIG. 26, and then a feature pattern 104P having a plurality of holes 104H formed therein may be formed by performing the processes as described with reference to FIGS. 11A through 15B.

Figure 26D:
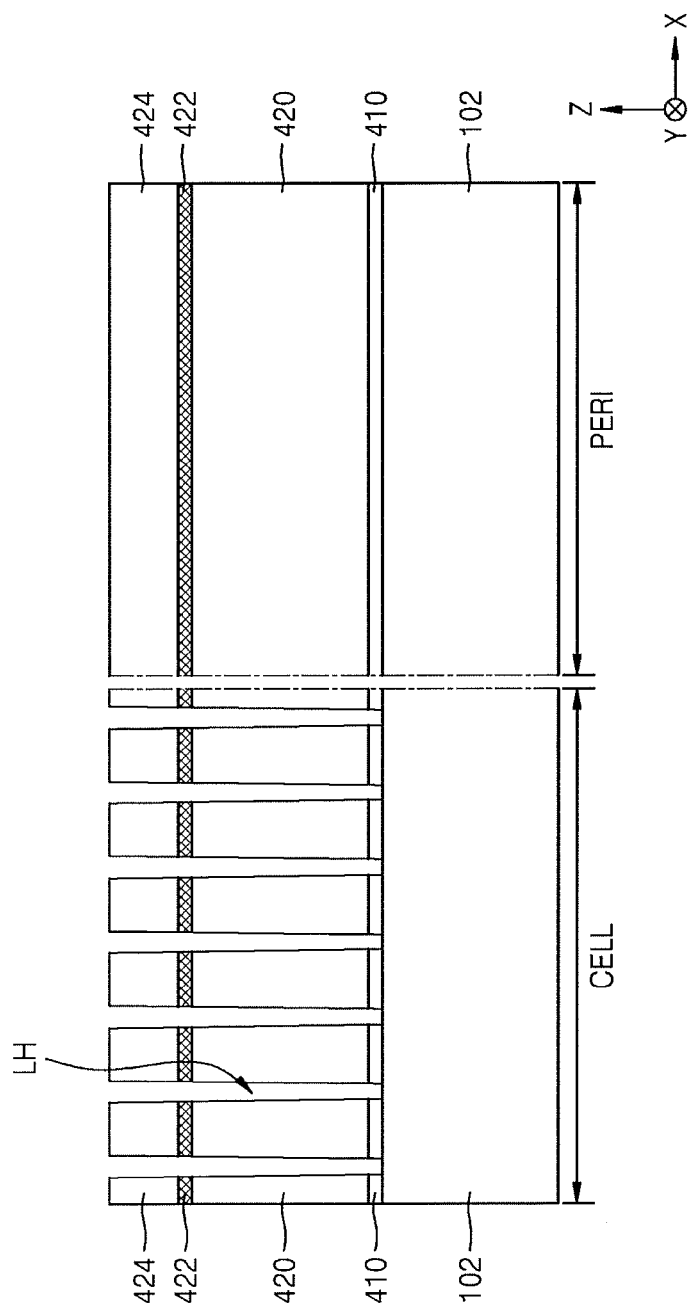

Referring to FIG. 26D, the sacrificial layer 424, the supporting layer 422, and the mold layer 420 may sequentially be etched by using the feature pattern 104P (see FIG. 26C) as an etch mask and using the etch stop layer 410 as an etching end point, and may continuously be etched up to the etch stop layer 410 through an excessive etching, and a plurality of lower electrode holes LH that exposes a plurality of conductive regions region formed in the substrate 104 may be formed.

After the plurality of lower electrode holes LH are formed, the feature pattern 104P may be consumed or removed in the cell array region CELL and the peripheral circuit region PERI, and the upper surface of the sacrificial layer 424 may be exposed.

Referring to FIG. 26E, a conductive film 430 for lower electrode formation may be formed to cover surfaces, that may be exposed in the insides of the lower electrode holes LH, and the upper surface of the sacrificial layer 424.

The conductive film 430 for lower electrode formation may conformally cover the surfaces exposed in the insides of the lower electrode holes LH.

In some exemplary embodiments, the conductive film 430 for lower electrode formation may include doped semiconductor, conductive metal nitride, metal, metal silicide, conductive oxide, or a combination thereof. For example, the conductive film 430 for lower electrode formation may include, for example, TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

A CVD process, a metal organic CVD (MOCVD) process, or an ALD process may be used to form the conductive film 430 for lower electrode formation.

Figure 26F:
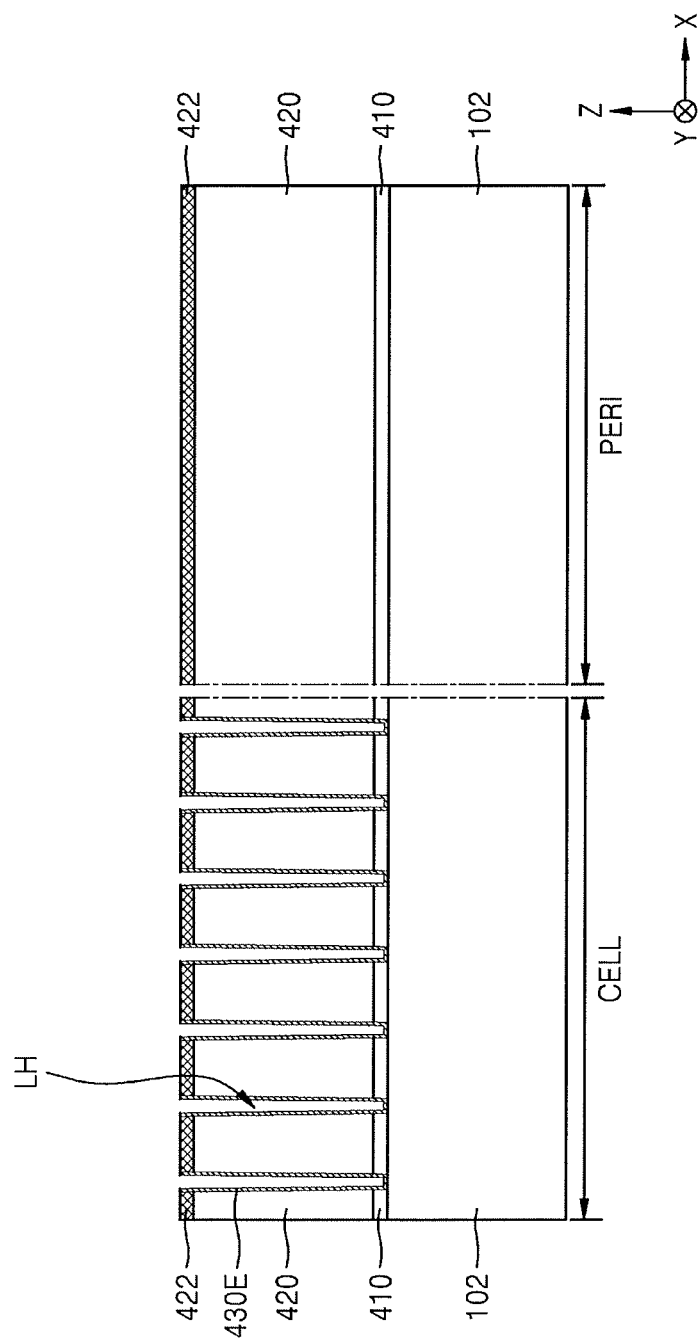

Referring to FIG. 26F, an upper portion of the conductive film 430 for lower electrode formation is partially removed to divide the conductive film 430 into a plurality of lower electrodes 430E.

In order to form the plurality of lower electrodes 430E, an upper portion of the conductive film 430 for lower electrode formation and the sacrificial layer 424 (see FIG. 26E) may be removed by using an etch-back process or a chemical mechanical polishing (CMP) process until the upper surface of the supporting layer 422 is exposed.

The plurality of lower electrodes 430E may form the plurality of lower electrodes LE of the integrated circuit device 400 shown in FIG. 25.

In the current embodiment, each of the plurality of lower electrodes 430E has, for example, a cylinder shape. In an embodiment, the plurality of lower electrode holes LH may be filled with the conductive film 430 for lower electrode formation so that an internal space of each of the plurality of lower electrode holes LH does not remain during the process of forming the conductive film 430 for lower electrode formation, described with reference to FIG. 26E. After the conductive film 430 for lower electrode formation is divided into the plurality of lower electrodes 430E, as described with reference to FIG. 26F, the plurality of lower electrodes 430E, each having a pillar shape may be obtained.

Figure 26G:
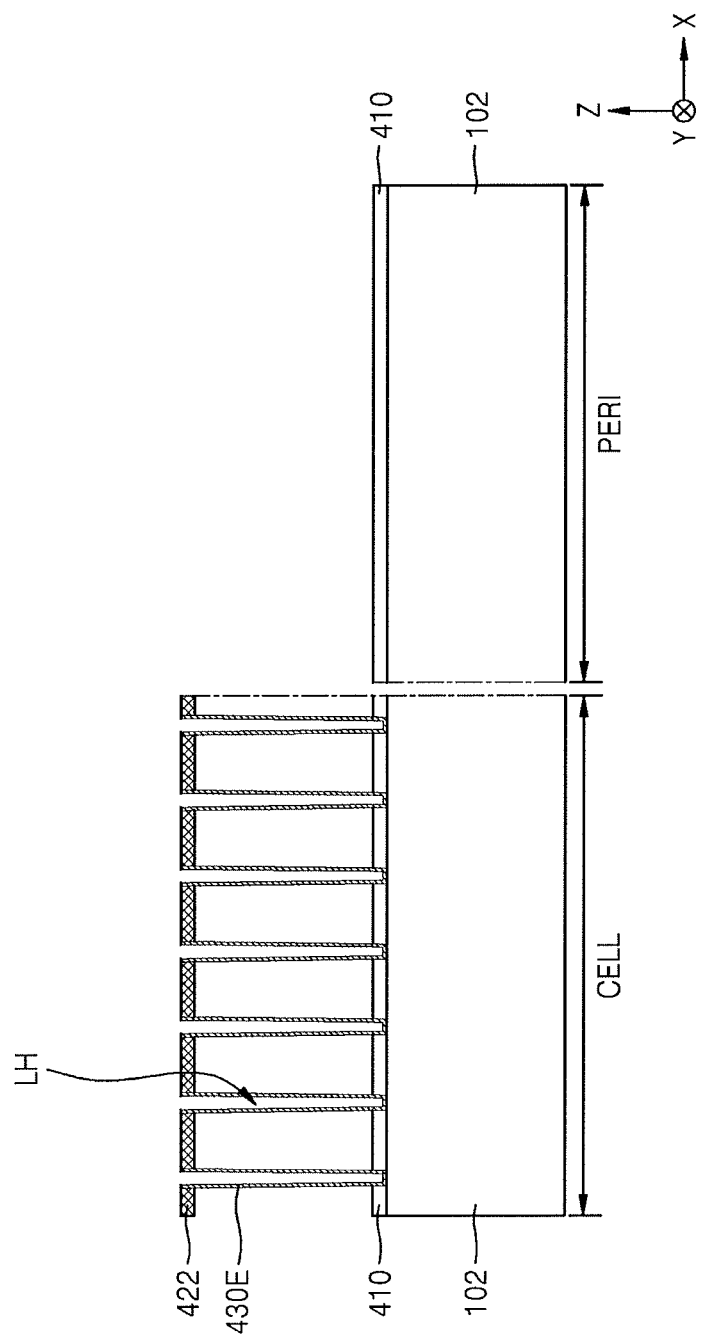

Referring to FIG. 26G, the mold layer 420 (see FIG. 26F) may be removed to expose outer wall surfaces of the plurality of lower electrode electrodes 430E in the cell array region CELL.

A wet etching process may be used to remove the mold layer 420. For example, the mold layer 420 may be removed by a lift-off process using limulus amebocyte lysate (LAL) or hydrofluoric acid.

After the mold layer 420 is removed, the plurality of lower electrodes 430E in the cell array region CELL may be supported by the supporting layer 422. On the other hand, in the peripheral circuit region PERI, the supporting layer 422 may be removed together with the mold layer 420.

Figure 26H:
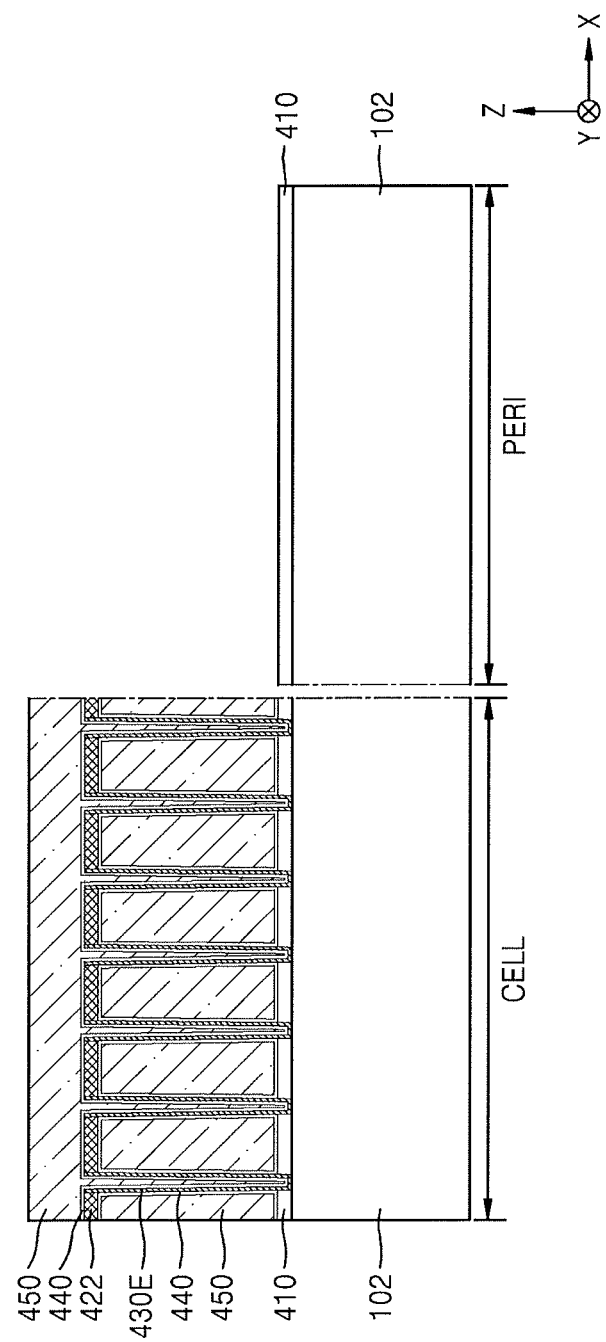

Referring to FIG. 26H, a dielectric film 440 may be formed on the plurality of lower electrodes 430E in the cell array region CELL, and an upper electrode 450 may be formed on the dielectric film 440.

The dielectric film 440 may conformally cover some areas of inner wall surfaces and outer wall surfaces of the plurality of lower electrodes 430E, the surface of the supporting layer 422, and the surface of the etch stop layer 410.

The dielectric film 440 may include nitride, oxide, metal oxide, or a combination thereof. For example, the dielectric film 440 may have a single layer or multi-layer structure including silicon nitride, silicon oxide, metal oxide, such as $HfO_2$, $ZrO_2$, $Al_2O_3$, $La_2O_3$, $Ta_2O_3$, or $TiO_2$, a perovskite-structured dielectric material, such as STO ($SrTiO_3$), BST (($Ba,Sr$)$TiO_3$), $BaTiO_3$, PZT, or PLZT, or a combination thereof. The dielectric film 440 may be formed by using a CVD, PVD, or ALD process.

The upper electrode 450 may include doped semiconductor, conductive metal nitride, metal, metal silicide, conductive oxide, or a combination thereof. For example, the upper electrode 450 may include, for example, TiN, TiAlN, TaN, TaAlN, W, WN, Ru, $RuO_2$, $SrRuO_3$, Ir, $IrO_2$, Pt, PtO, $SrRuO_3$ (SRO), ($Ba,Sr$)$RuO_3$ (BSRO), $CaRuO_3$ (CRO), (La, Sr)$CoO_3$ (LSCo), or a combination thereof.

A capacitor may be formed by the lower electrode 430E, the dielectric film 440, and the upper electrode 450.

The method of forming the plurality of lower electrodes LE of the integrated circuit device 400 shown in FIG. 25 by using the integrated circuit device manufacturing method according to the exemplary embodiment is described, for example, with reference to FIGS. 26A through 26H. In an embodiment, the integrated circuit device manufacturing method according to the exemplary embodiment may be advantageously applied to a trimming process for defining the plurality of active regions ACT of the integrated circuit device 400 shown in FIG. 25, a process of forming the plurality of direct contacts DC, and a process of forming the plurality of buried contacts BC.

Figure 27:
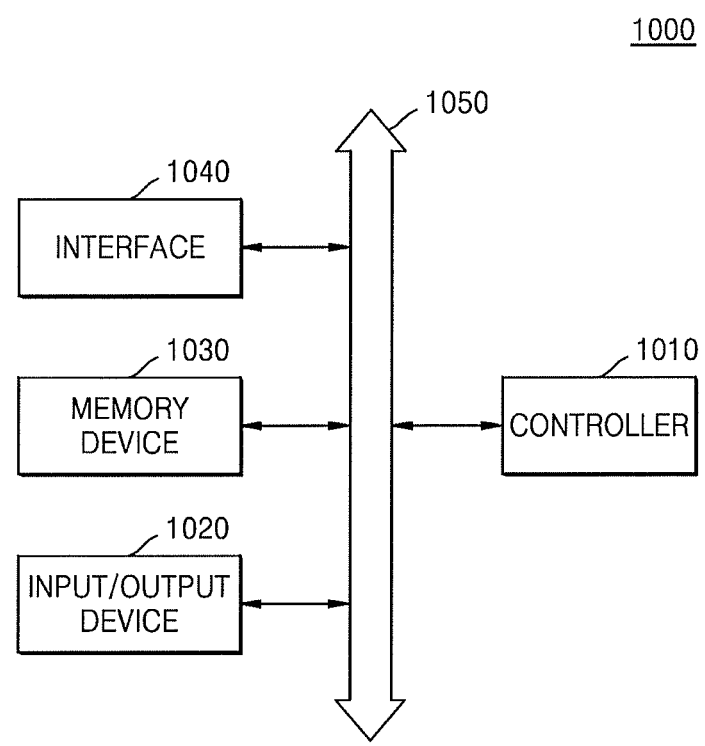
FIG. 27 illustrates a block diagram of a system including an integrated circuit device, according to an exemplary embodiment.

FIG. 27 illustrates a block diagram of a system 1000 including an integrated circuit device, according to an exemplary embodiment.

The system 1000 may include a controller 1010, an input/output device 1020, a memory device 1030, and an interface 1040. The system 1000 may be a mobile system or a system that transmits or receives information. In some exemplary embodiments, the mobile system may be a personal digital assistant (PDA), a portable computer, a web tablet, a wireless phone, a mobile phone, a digital music player, or a memory card. The controller 1010 for controlling a program executed in the system 1000 may include, for example, a microprocessor, a digital signal processor, or a microcontroller. The input/output device 1020 may be used to input or output data of the system 1000. The system 1000 may be connected to an external device such as a personal computer or a network by using the input/output device 1020, and may exchange data with the external device. The input/output device 1020 may be, for example, a keypad, a keyboard, or a display device.

The memory device 1030 may store code and/or data for operating the controller 1010, or may store data processed by the controller 1010. The memory device 1030 may include at least one integrated circuit obtained by using a method of forming a pattern or a method of manufacturing an integrated circuit device, according to the previous exemplary embodiments. For example, the memory device 1030 may include at least one integrated circuit device obtained by using one of the pattern formation methods described with reference to FIGS. 1A through 15B, the integrated circuit device manufacturing methods described with reference to FIGS. 17A through 24B, and methods modified or changed therefrom.

The interface 1040 may be a transmission path through which data is transmitted between the system 1000 and the external device. The controller 1010, the input/output device 1020, the memory device 1030, and the interface 1040 may communicate with one another via a bus 1050. The system 1000 may be used in a mobile phone, an MP3 player, a navigation system, a portable multimedia player (PMP), a solid-state disc (SSD), or a household appliance.

Figure 28:
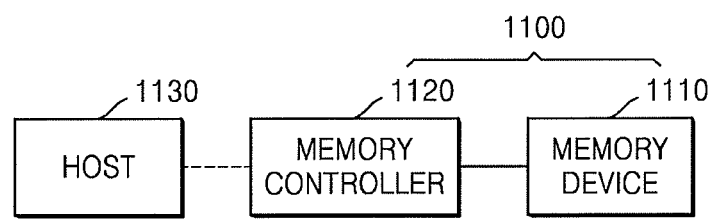
FIG. 28 illustrates a block diagram of a memory card including an integrated circuit device, according to an exemplary embodiment.

FIG. 28 illustrates a block diagram of a memory card 1100 including an integrated circuit device, according to an exemplary embodiment.

The memory card 1100 may include a memory device 1110 and a memory controller 1120.

The memory device 1110 may store data. In some exemplary embodiments, the storage unit 11110 may be nonvolatile, and it may retain stored data even when powered off. The memory device 1110 may include at least one integrated circuit device obtained by using a method of forming a pattern or a method of manufacturing an integrated circuit device, according to the previous exemplary embodiments. For example, the memory device 1110 may include at least one integrated circuit device obtained by using one of the pattern formation methods described with reference to FIGS. 1A through 15B, the integrated circuit device manufacturing methods described with reference to FIGS. 17A through 24B, and methods modified or changed therefrom.

The memory controller 1120 may read data stored in the memory device 1110 or may store data in the memory device 1110 in response to a read/write request of a host 1130. The memory controller 1120 may include at least one integrated circuit device obtained by using any method according to the previous exemplary embodiments. For example, the memory controller 1120 may include at least one integrated circuit device obtained by using one of the pattern formation methods described with reference to FIGS. 1A through 15B, the integrated circuit device manufacturing methods described with reference to FIGS. 17A through 24B, and methods modified or changed therefrom.

By way of summation and review, when a pillar guide is formed only in a cell region having a relatively high pattern density and is not formed in a peripheral circuit region, an incline plane may be formed in a top surface of a block copolymer layer due to, for example, a pattern step at an edge portion of the cell region when coating the block copolymer layer, and vertical orientation characteristics of a self-assembled pattern may degrade. Accordingly, an undesired pattern may be formed around the cell region, and a chip area may not be efficiently used.

By using a characteristic in which a directed self-assembly (DSA) vertical self-assembly is not formed when there is no guiding pattern during a DSA graphoepitaxy pillar process, a contact may be removed by not forming a pillar in some regions, and a cell boundary trim margin may be secured. A dummy pillar may be formed outside a cell boundary based on a trim line to help improve coating uniformity when coating a block copolymer layer. A trim margin for trimming patterns that may be formed by a dummy pillar in a cell boundary that may be secured by appropriately controlling the width of a trimming region between a region, in which a pillar that may be necessary for forming a pattern may be formed, and a region in which a dummy pillar may be formed.

Embodiments relate to a method of forming a pattern using a block copolymer and a method of manufacturing an integrated circuit device by using the method. The method may form a pattern, which may have a nanoscale critical dimension (CD) that ranges from several to tens of nanometers (nm).

Provided is a method of forming a pattern in which a plurality of patterns that may be repeatedly formed at fine pitches may be formed to have a uniform shape without deviation due to, for example, the position of the patterns, in order to form a pattern that may be necessary to manufacture a highly integrated semiconductor device exceeding a resolution limit in a photolithography process.

Also provided is a method of manufacturing an integrated circuit device, in which a plurality of patterns that may be repeatedly formed at fine pitches in a limited area may be formed to have a uniform shape without deviation due to, for example, the position of the patterns.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a pattern, the method comprising:
forming a feature layer on a substrate;
forming a mask layer on the feature layer;
forming a plurality of guides regularly arranged with a first pitch on the mask layer in a first region and a plurality of dummy guides regularly arranged with the first pitch on the mask layer in a second region spaced apart from the first region with a separation region therebetween, the separation region having a width greater than the first pitch;
forming a block copolymer layer, the block copolymer layer surrounding the plurality of guides and the plurality of dummy guides, on the mask layer;
phase-separating the block copolymer layer to form a self-assembled layer including a plurality of first domains regularly arranged along with the plurality of guides in the first region and a plurality of first dummy domains regularly arranged along with the plurality of dummy guides in the second region;
forming a mask pattern by etching the mask layer using the self-assembled layer; and
patterning the feature layer by transferring a shape of the mask pattern to the feature layer in the first region while blocking the shape of the mask pattern from being transferred to the feature layer in the second region.

2. The method as claimed in claim 1, wherein forming the plurality of guides and the plurality of dummy guides includes:
forming a plurality of first holes regularly arranged with the first pitch in the mask layer in the first region and the second region, the plurality of first holes having a first diameter; and
forming a plurality of pillar-shaped guides filling the plurality of first holes in the first region and the second region, the plurality of pillar-shaped guides protruding upward beyond the mask layer, the plurality of pillar-shaped guides having a second diameter greater than the first diameter.

3. The method as claimed in claim 2, wherein:
the plurality of first holes are arranged in a hexagonal array having a first pitch at least 1.5 times a bulk period $L_0$ of the block copolymer layer, and
patterning the feature layer includes forming a plurality of holes in the feature layer by etching the feature layer using the mask pattern as an etch mask in the second region, the plurality of holes being arranged in a hexagonal array having a second pitch smaller than the first pitch.

4. The method as claimed in claim 1, wherein the separation region has a width 2 to 6 times a bulk period $L_0$ of the block copolymer layer.

5. The method as claimed in claim 1, wherein the block copolymer layer includes:
a first polymer block including poly(methyl methacrylate), poly(ethylene oxide), poly(lactic acid), or polyisoprene; and
a second polymer block including polystyrene.

6. The method as claimed in claim 1, further comprising forming a brush liner before forming the block copolymer layer, the brush liner covering the plurality of dummy guides and the feature layer,
wherein the brush liner includes a material having a relatively higher affinity for a polymer block having the largest volume ratio from among polymer blocks included in the block copolymer layer, and the block copolymer layer is formed on the brush liner.

7. The method as claimed in claim 6, wherein:
the block copolymer layer includes a first polymer block and a second polymer block having a volume ratio of from 20:80 to 40:60, and
the plurality of first domains and the plurality of first dummy domains include the first polymer block, and the brush liner includes polymer having a same structure as polymer forming the second polymer block.

8. The method as claimed in claim 6, wherein the brush liner includes polystyrene.

9. The method as claimed in claim 1, wherein:
in phase-separating the block copolymer, the self-assembled layer further includes a second domain surrounding each of the plurality of guides, each of the plurality of dummy guides, each of the plurality of first domains, and each of the plurality of first dummy domains, and
forming the mask pattern includes etching the mask layer using the plurality of guides, the plurality of dummy guides, and the second domain as an etch mask in the first region and the second region.

10. The method as claimed in claim 9, further comprising forming a brush liner on the mask layer in the first region and the second region before forming the block copolymer layer, the brush liner including a same material as a material forming the second domain,
wherein forming the mask pattern includes:
removing the plurality of first domains and the plurality of first dummy domains from the self-assembled layer; and
sequentially etching the brush liner and the mask layer using the plurality of guides, the plurality of dummy guides, and the second domain as an etch mask in the first region and the second region.

11. The method as claimed in claim 1, wherein patterning the feature layer includes:

forming a trimming pattern having an edge portion, the edge portion being in the separation region, the trimming pattern covering the mask pattern in the second region; and forming a plurality of holes in the first region by etching the feature layer in the first region using the trimming mask pattern and the mask pattern as an etch mask.

12. A method of manufacturing an integrated circuit device, the method comprising:

forming a feature layer on a substrate having a cell array region and a peripheral circuit region;

forming a mask layer, in which a plurality of first holes regularly arranged with a first pitch less than a first width are formed, in a first region of the cell array region and a second region of the peripheral circuit region, the second region being spaced apart from the first region with a separation region therebetween and having the first width;

forming a plurality of guides, the plurality of guides filling the plurality of first holes in the first region, the plurality of guides protruding upward beyond the mask layer, and a plurality of dummy guides filling the plurality of first holes in the second region, the plurality of dummy guides protruding upward beyond the mask layer;

forming a brush liner covering the mask layer in the first region, the second region, and the separation region;

forming a block copolymer layer on the brush liner, the block copolymer layer surrounding the plurality of guides and the plurality of dummy guides in the first region and the second region and filling the separation region;

phase-separating the block copolymer to form a self-assembled layer;

forming a mask pattern, in which a plurality of second holes are formed in the first region and the second region, the mask pattern being formed by etching the mask layer in the first region and the second region using a portion of the self-assembled layer as an etch mask;

forming a trimming mask pattern, the trimming mask pattern covering the mask pattern in the second region, in the peripheral circuit region; and forming a feature pattern by etching the feature layer in the cell array region using the trimming mask pattern and the mask pattern as an etch mask.

13. The method as claimed in claim 12, wherein:

the self-assembled layer includes a plurality of first domains arranged in the first region, a plurality of first dummy domains arranged in the second region, and a second domain surrounding the plurality of first domains and the plurality of first dummy domains, and the brush liner includes polymer having a same structure as polymer forming the second polymer block.

14. The method as claimed in claim 12, wherein a width of the separation region is greater than a distance between two guides adjacent to each other from among the plurality of guides.

15. The method as claimed in claim 12, further comprising:

forming a mold layer on the substrate before forming the feature layer, and after forming the feature layer, forming a plurality of holes by etching the mold layer using the feature pattern as an etch mask, the plurality of holes passing through the mold layer; and forming a plurality of electrodes in the plurality of holes.

16. A method of forming a pattern, the method comprising:

providing a substrate including a high-density region and a low-density region spaced apart from the high-density region with a separation region therebetween;

forming guides on a substrate in the high-density region and dummy guides on the substrate in the low-density region; and forming a block copolymer layer surrounding the guides and the dummy guides on the substrate, a width of the separation region extending from the high-density region to the low-density region providing the block copolymer layer with a top surface extending parallel to the substrate.

17. The method as claimed in claim 16, wherein the dummy guides have a same shape as the guides.

18. The method as claimed in claim 17, wherein the dummy guides and the guides are pillar-shaped.

19. The method as claimed in claim 16, wherein:

the block copolymer layer includes a first polymer block and a second polymer block having a volume ratio of from 20:80 to 40:60;

the first polymer block includes poly(methyl methacrylate), poly(ethylene oxide), poly(lactic acid), or polyisoprene; and the second polymer block includes polystyrene.

20. The method as claimed in claim 16, wherein the width of the separation region has a width 2 to 6 times a bulk period $L_0$ of the block copolymer layer.

* * * * *